(12) United States Patent
van de Ven et al.

(10) Patent No.: US 9,215,761 B2
(45) Date of Patent: Dec. 15, 2015

(54) SOLID STATE LIGHTING DEVICES WITH COLOR POINT NON-COINCIDENT WITH BLACKBODY LOCUS

(71) Applicant: Cree, Inc., Durham, NC (US)

(72) Inventors: Antony Paul van de Ven, Hong Kong (CN); Nicholas W. Medendorp, Jr., Raleigh, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 14/278,464

(22) Filed: May 15, 2014

(65) Prior Publication Data

US 2015/0334789 A1    Nov. 19, 2015

(51) Int. Cl.
  H01J 1/62    (2006.01)
  H01J 63/04   (2006.01)
  H05B 33/02   (2006.01)
  H05B 33/12   (2006.01)

(52) U.S. Cl.
  CPC ............... *H05B 33/02* (2013.01); *H05B 33/12* (2013.01)

(58) Field of Classification Search
  CPC ..... H01L 25/0753; H01L 33/504; H01J 1/63; F21K 9/56; H05B 33/0803
  USPC ............ 313/498–512; 362/231, 612, 800, 84, 362/230, 249.02
  See application file for complete search history.

(56) References Cited

U.S. PATENT DOCUMENTS

| | | | |
|---|---|---|---|
| 6,234,648 B1 | 5/2001 | Börner et al. | |
| 6,357,889 B1 | 3/2002 | Duggal et al. | |
| 6,441,558 B1 | 8/2002 | Muthu et al. | |
| 6,498,440 B2 | 12/2002 | Stam et al. | |
| 6,577,073 B2 | 6/2003 | Shimizu et al. | |
| 6,600,175 B1 | 7/2003 | Baretz et al. | |
| 7,005,679 B2 | 2/2006 | Tarsa et al. | |
| 7,026,756 B2 | 4/2006 | Shimizu et al. | |
| 7,095,056 B2 | 8/2006 | Vitta et al. | |
| 7,213,940 B1 | 5/2007 | Van De Ven et al. | |
| 7,233,831 B2 | 6/2007 | Blackwell | |
| 7,255,457 B2 | 8/2007 | Ducharme et al. | |
| 7,352,138 B2 | 4/2008 | Lys et al. | |

(Continued)

FOREIGN PATENT DOCUMENTS

DE    10233050 A1    2/2004
JP    2003316714 A   11/2003

(Continued)

OTHER PUBLICATIONS

U.S. Appl. No. 14/259,993, filed Apr. 23, 2014.

(Continued)

*Primary Examiner* — Nimeshkumar Patel
*Assistant Examiner* — Kevin Quarterman
(74) *Attorney, Agent, or Firm* — Withrow & Terranova, P.L.L.C.; Vincent K. Gustafson

(57) ABSTRACT

Solid state lighting devices include at least one electrically activated solid state light emitter and at least one lumiphor (or multiple electrically activated emitters optionally devoid of a lumiphor), with resulting emissions arranged to attain a color point in a desired CCT range (e.g., from 2,500K to 10,000K) that is non-coincident with a blackbody or Planckian locus, preferably with a negative Planckian offset Delta u'v' value (below the Planckian locus) according to a CIE 1976 chromaticity diagram, such as a value in a range of no greater than negative 0.01.

30 Claims, 28 Drawing Sheets

(56) References Cited

U.S. PATENT DOCUMENTS

| | | | |
|---|---|---|---|
| 7,354,172 | B2 | 4/2008 | Chemel et al. |
| 7,358,679 | B2 | 4/2008 | Lys et al. |
| 7,520,634 | B2 | 4/2009 | Ducharme et al. |
| 7,564,180 | B2 | 7/2009 | Brandes |
| 7,665,865 | B1 | 2/2010 | Hulse et al. |
| 7,687,753 | B2 | 3/2010 | Ashdown |
| 7,744,242 | B2 | 6/2010 | Krämer |
| 7,768,192 | B2 | 8/2010 | Van De Ven et al. |
| 7,781,953 | B2 | 8/2010 | Su |
| 7,791,061 | B2 | 9/2010 | Edmond et al. |
| 7,828,460 | B2 | 11/2010 | Van De Ven et al. |
| 7,845,823 | B2 | 12/2010 | Mueller et al. |
| 7,918,581 | B2 | 4/2011 | Van De Ven et al. |
| 8,038,317 | B2 | 10/2011 | Van De Ven et al. |
| 8,201,966 | B2 | 6/2012 | Hall et al. |
| 8,258,722 | B2 | 9/2012 | Swoboda et al. |
| 8,436,556 | B2 | 5/2013 | Eisele et al. |
| 8,508,127 | B2 | 8/2013 | Negley et al. |
| 8,593,074 | B2 | 11/2013 | Hatley et al. |
| 8,698,388 | B2 | 4/2014 | Cash |
| 2004/0218387 | A1 | 11/2004 | Gerlach |
| 2005/0275937 | A1 | 12/2005 | Wu et al. |
| 2006/0071589 | A1 | 4/2006 | Radkov |
| 2006/0237636 | A1 | 10/2006 | Lyons et al. |
| 2007/0139920 | A1 | 6/2007 | Van De Ven et al. |
| 2007/0152797 | A1 | 7/2007 | Chemel et al. |
| 2007/0223219 | A1 | 9/2007 | Medendorp, Jr. et al. |
| 2007/0241657 | A1 | 10/2007 | Radkov et al. |
| 2008/0130285 | A1 | 6/2008 | Negley et al. |
| 2008/0173884 | A1 | 7/2008 | Chitnis et al. |
| 2008/0179611 | A1 | 7/2008 | Chitnis et al. |
| 2008/0258130 | A1 | 10/2008 | Bergmann et al. |
| 2009/0080185 | A1 | 3/2009 | McMillan |
| 2009/0184616 | A1 | 7/2009 | Van De Ven et al. |
| 2009/0207583 | A1 | 8/2009 | Takano |
| 2009/0227847 | A1 | 9/2009 | Tepper et al. |
| 2009/0296384 | A1* | 12/2009 | Van De Ven et al. ......... 362/231 |
| 2010/0110659 | A1 | 5/2010 | Nakajima |
| 2010/0127283 | A1 | 5/2010 | van de Ven et al. |
| 2010/0254129 | A1 | 10/2010 | Le Toquin et al. |
| 2010/0277907 | A1 | 11/2010 | Phipps et al. |
| 2011/0037388 | A1 | 2/2011 | Lou et al. |
| 2011/0222277 | A1* | 9/2011 | Negley et al. ................. 362/235 |
| 2011/0273079 | A1* | 11/2011 | Pickard et al. ................. 313/483 |
| 2011/0299284 | A1 | 12/2011 | Van De Ven et al. |
| 2012/0112661 | A1* | 5/2012 | van de Ven et al. ........... 315/294 |
| 2012/0306355 | A1 | 12/2012 | Seibel, II |
| 2012/0306375 | A1 | 12/2012 | van de Ven |
| 2013/0020929 | A1* | 1/2013 | van de Ven et al. ........... 313/498 |
| 2013/0114241 | A1 | 5/2013 | van de Ven et al. |
| 2013/0114242 | A1 | 5/2013 | Pickard et al. |
| 2013/0170199 | A1* | 7/2013 | Athalye et al. ................ 362/230 |
| 2014/0228914 | A1* | 8/2014 | van de Ven et al. ............ 607/88 |

FOREIGN PATENT DOCUMENTS

| | | |
|---|---|---|
| JP | 2004071726 A | 3/2004 |
| JP | 2009152213 A | 7/2009 |
| WO | 0034709 A1 | 6/2000 |
| WO | 2009041171 A1 | 4/2009 |
| WO | 2011002686 A1 | 1/2011 |
| WO | 2013070860 A1 | 5/2013 |

OTHER PUBLICATIONS

U.S. Appl. No. 14/260,048, filed Apr. 23, 2014.

Author Unknown, "CALiPER Retail Lamps Study 3," Solid-State Lighting Program, Feb. 2014, Pacific Northwest National Laboratory, U.S. Department of Energy, 48 pages.

Narendran, N. et al., "Color Rendering Properties of LED Light Sources," Solid State Lighting II: Proceedings of SPIE, vol. 4776, Nov. 26, 2002, SPIE, 8 pages.

Negley, G. et al., "Essentials of designing efficient luminaires with LEDs," LEDs Magazine, Issue 18, Jan./Feb. 2008, Pennwell Corporation, pp. 17-22.

Van De Ven, A. et al., "Warm White illumination with high CRI and high efficacy by combining 455nm excited yellowish phosphor LEDs and red AlInGaP LEDs," First International Conference on White LEDs and Solid State Lighting, Nov. 28, 2007, LED Lighting Fixtures, Inc., 8 pages.

Author Unknown, "Application Brief AB08: Optical Testing for SuperFlux, SnapLED and LUXEON® Emitters," 2006, Philips Lumileds Company, 15 pages.

Author Unknown, "What is correlated color temperature?" Lighting Answers, vol. 8, Issue 1, Oct. 2004, National Lighting Product Information Program (NLPIP), Lighting Research Center, Rensselaer Polytechnic Institute, 2 pages.

Miller, N.J. et al., "Color Spaces and Planckian Loci: Understanding all those Crazy Color Metrics," retrieved Apr. 29, 2014 from http://apps1.eere.energy.gov/buildings/publications/pdfs/ssl/miller-royer_color_portland2013.pdf, 49 pages.

Ohno, Y., "Calculation of CCT and Duv and Practical Conversion Formulae," CORM Conference, May 3-5, 2011, Gaithersburg, MD, National Institute of Standards and Technology, 28 pages.

Ohno, Y., "Optical Metrology—Photometry," SIM Metrology School, Oct. 28-Nov. 1, 2013, National Institute of Standards & Technology, 50 pages.

Ohno, Y., "Practical Problems of CRI for White LED Light Sources," Color Rendering Workshop, CIE Beijing, Jul. 6, 2007, National Institute of Standards and Technology (NIST), 14 pages.

Rea, Mark S., "Value Metrics for Better Lighting," vol. PM228, 2013, SPIE Press, pp. 36-43, 52-63.

International Search Report and Written Opinion for International Patent Application No. PCT/US2015/030558, mailed Aug. 19, 2015, 9 pages.

* cited by examiner

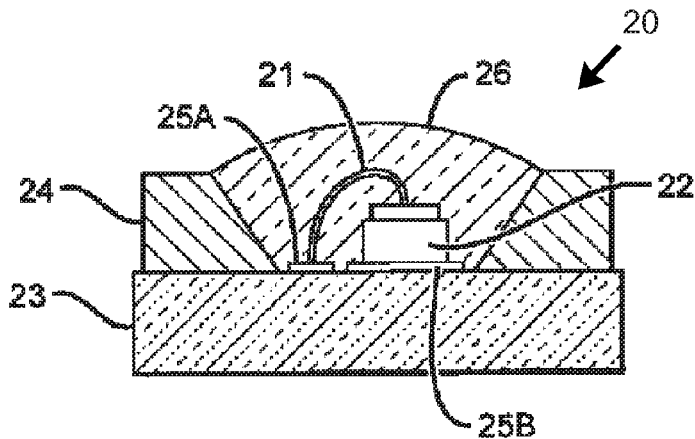
FIG._1 (RELATED ART)
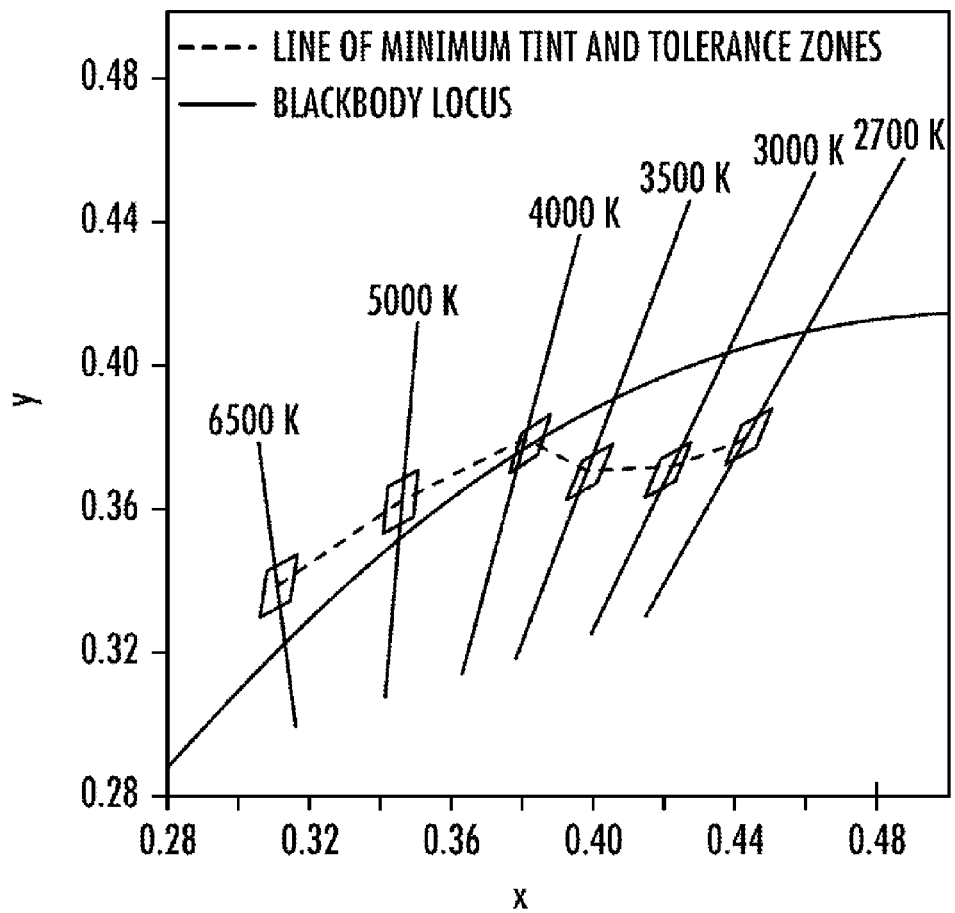
FIG._2 (RELATED ART)

| # | Light source | CCT | CRI | GAI | x | y | System lm/W | S/P |
|---|---|---|---|---|---|---|---|---|
| 1.1 | HPS, 400 W | 2050 | 15 | 14 | 0.5208 | 0.4134 | 96 | 0.66 |
| 1.2 | Pulse-start MH, 320 W | 4159 | 58 | 51 | 0.3799 | 0.3984 | 72 | 1.61 |
| 1.3 | Mercury vapor, 400 W clear | 5891 | 15 | 25 | 0.3191 | 0.4317 | 42 | 1.33 |
| 1.4 | LPS, 180 W | 1785 | –42 | 0 | 0.5681 | 0.4285 | 144 | 0.25 |
| 1.5 | Xenon, 1000 W | 5853 | 97 | 91 | 0.3245 | 0.3439 | 26 | 2.37 |
| 1.6 | White LED, 6500 K | 6528 | 72 | 84 | 0.3116 | 0.3340 | 80 | 2.06 |
| 2.1 | A lamp, 60 W (frosted) | 2764 | 100 | 49 | 0.4555 | 0.4109 | 14 | 1.36 |
| 2.2 | A lamp, 60 W (neodymium doped) | 2789 | 78 | 65 | 0.4460 | 0.3962 | 11 | 1.52 |
| 2.3 | Halogen, 3277 K | 3279 | 100 | 65 | 0.4184 | 0.3969 | 20 | 1.60 |
| 2.4 | CFL, 15 W | 2653 | 83 | 48 | 0.4652 | 0.4141 | 61 | 1.11 |
| 2.5 | Fluorescent, F34T12 cool white | 4022 | 62 | 58 | 0.3833 | 0.3905 | 63 | 1.48 |
| 2.6 | Fluorescent, FO32T8RE835 | 3308 | 86 | 69 | 0.4157 | 0.3939 | 86 | 1.44 |
| 2.7 | Fluorescent, F40T12 daylight | 4861 | 90 | 84 | 0.3502 | 0.3645 | 50 | 1.97 |
| 2.8 | Ceramic MH, 100 W | 4075 | 93 | 80 | 0.3773 | 0.3749 | 66 | 1.79 |
| 2.9 | White LED, 2700 K | 2706 | 84 | 49 | 0.4575 | 0.4072 | 65 | 1.21 |
| 2.10 | White LED, 6500 K | 6528 | 72 | 84 | 0.3116 | 0.3340 | 80 | 2.06 |
| 3.1 | Blue LED, 470-nm peak | N/A | N/A | 4 | 0.1247 | 0.0929 | 10 | 12.79 |
| 3.2 | Fluorescent, F20T12 aquarium lamp | 13408 | 83 | 103 | 0.2676 | 0.2719 | 51 | 2.76 |
| 3.3 | Fluorescent food-display lamp | 3195 | 61 | 128 | 0.3869 | 0.3153 | 36 | 1.97 |

FIG._3A (RELATED ART)

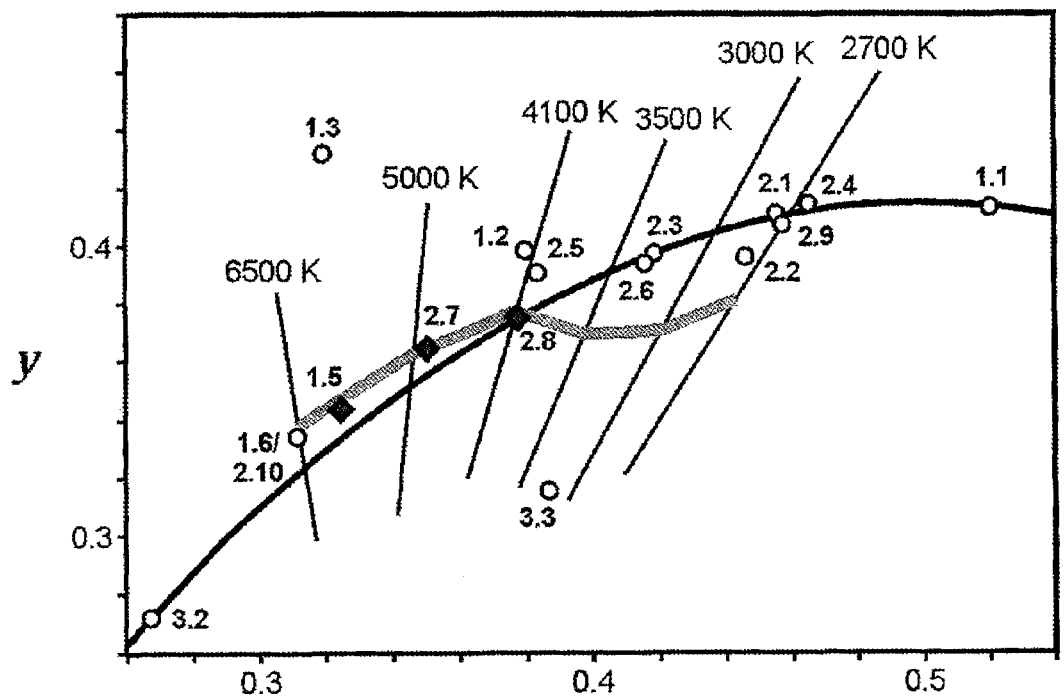

FIG._3B (RELATED ART)

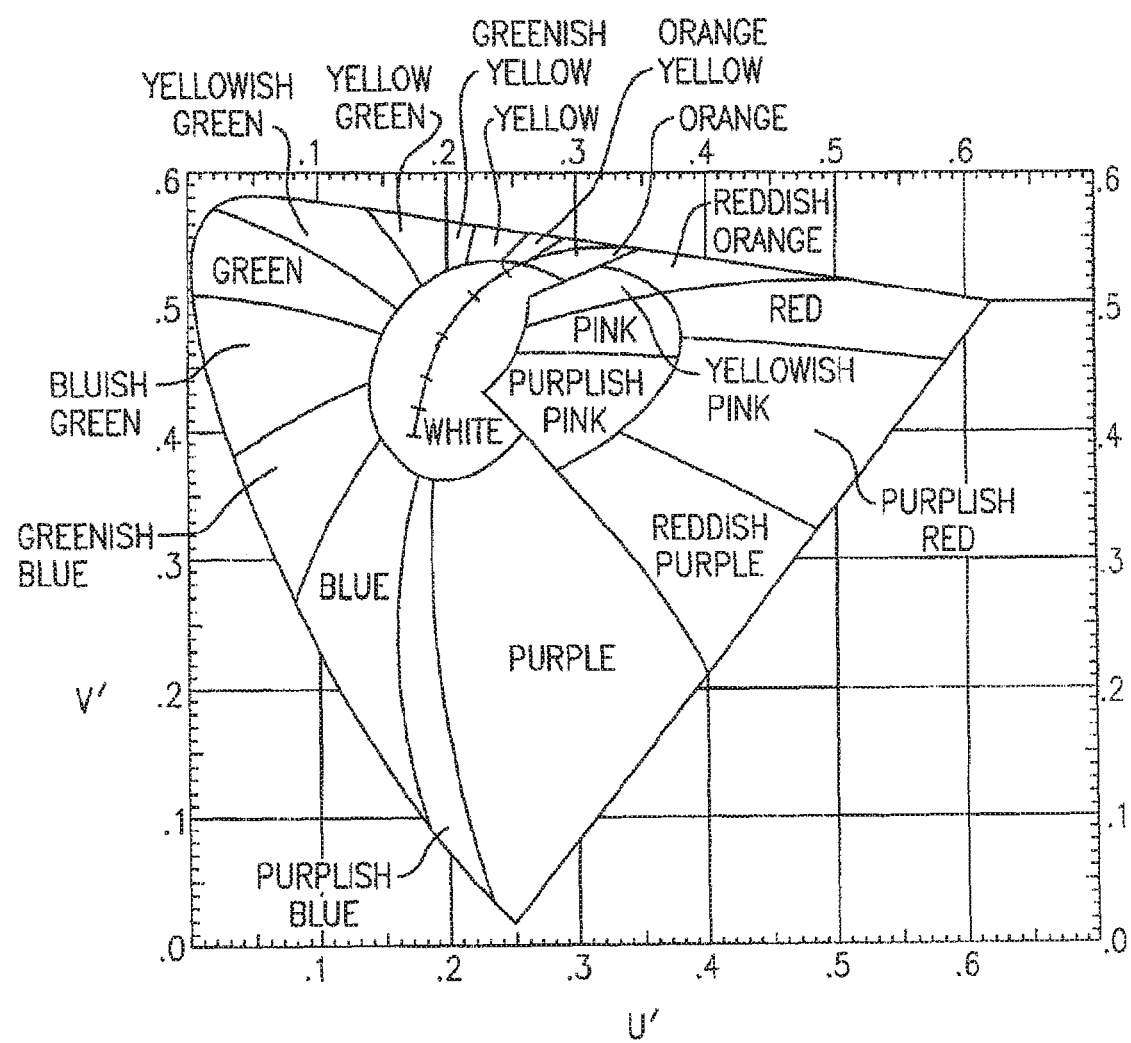
FIG._4 (RELATED ART)

FIG._7

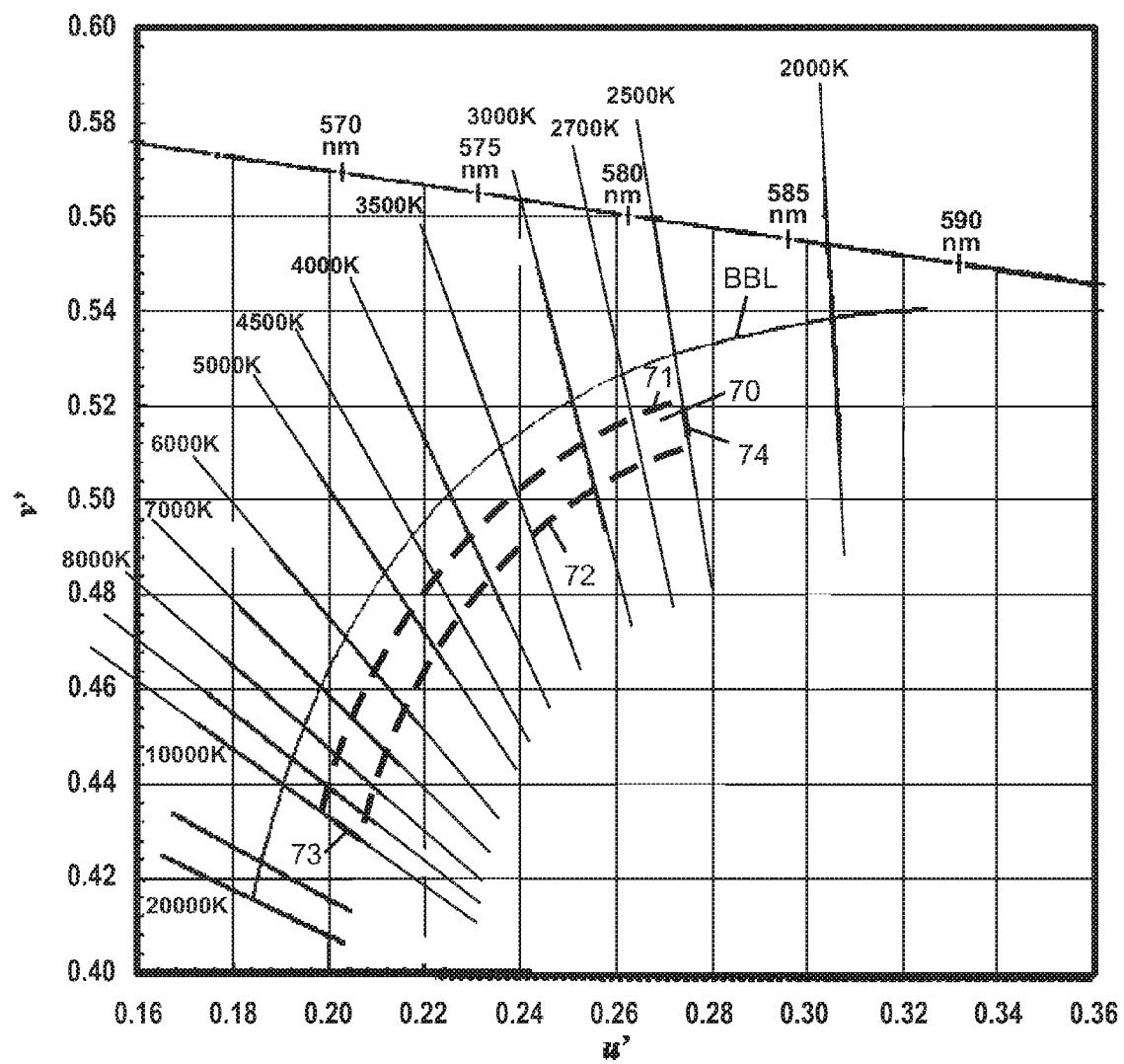
FIG._9

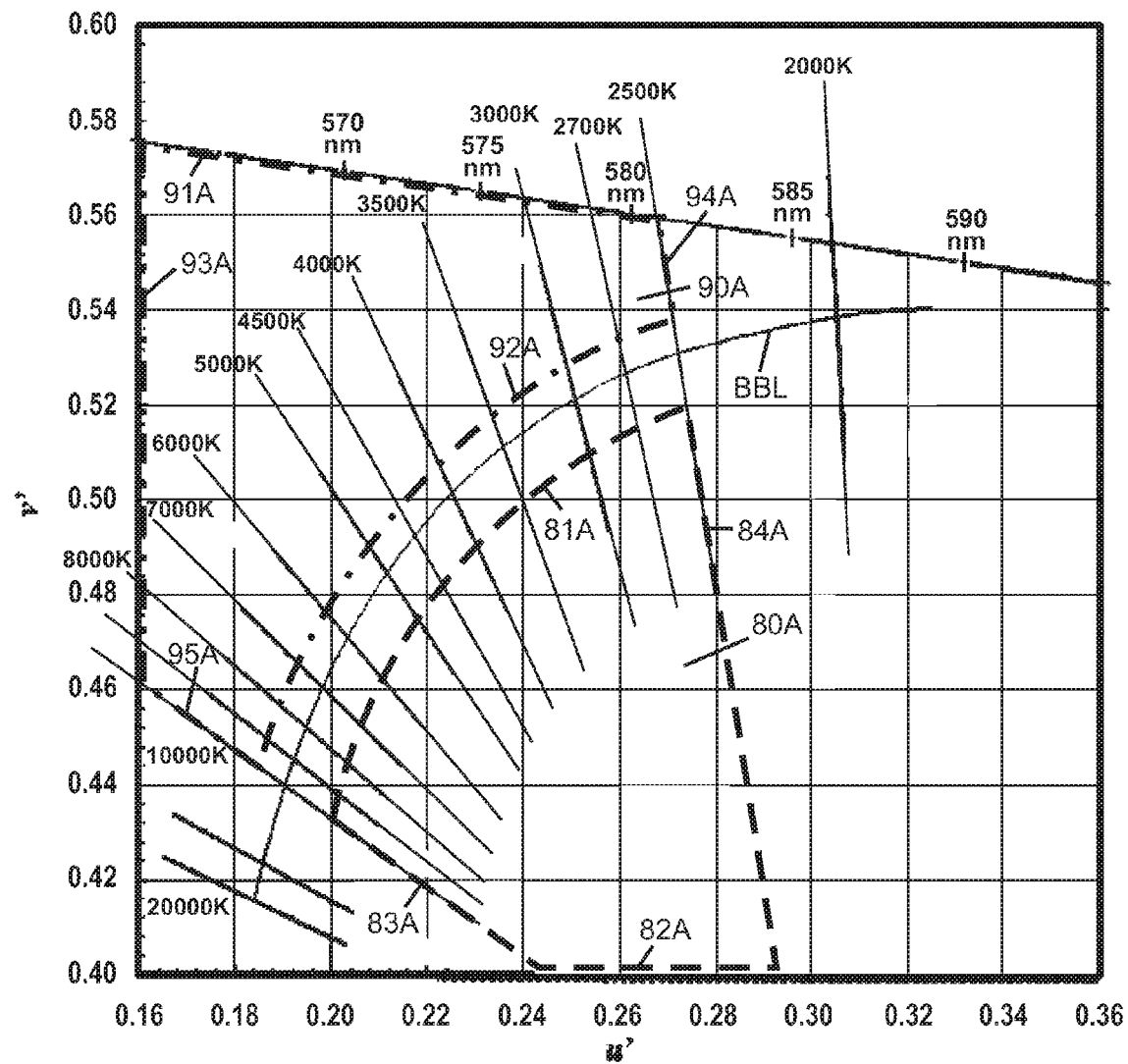
FIG._10

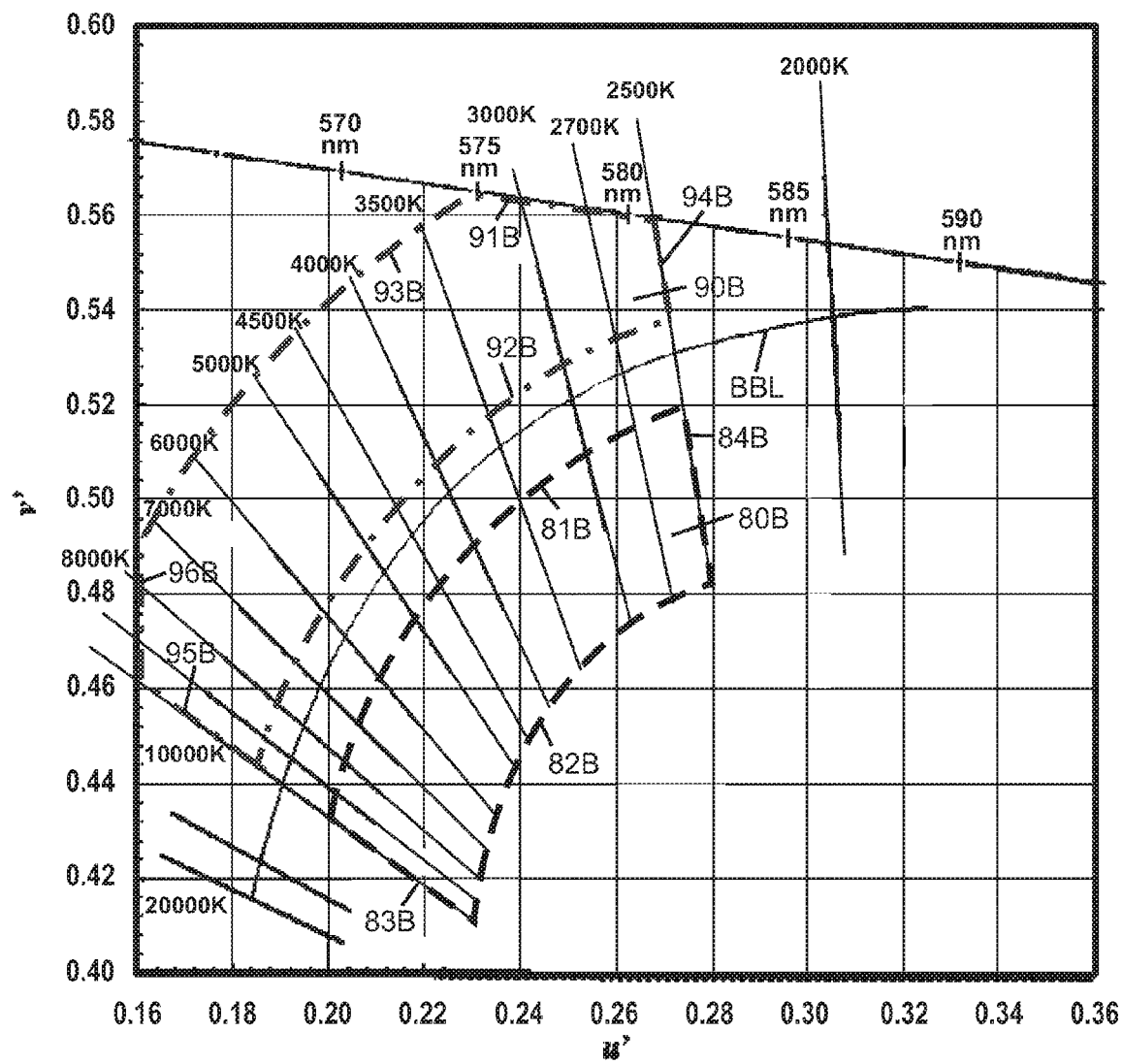
FIG._11

| # | x | y | dm | cct | S/P | CRI | R9 | CQS | GAI | Source 1a | Source 2a | Source 3a | 1a L% | 2a L% | 3a L% | 1a x | 1a y | 2a x | 2a y | 3a x | 3a y | 1a dm | 2a dm | 3a dm | 1a pk | 2a pk | 3a pk |
|---|---|---|---|---|---|---|---|---|---|---|---|---|---|---|---|---|---|---|---|---|---|---|---|---|---|---|---|
| 1 | 0.38 | 0.36 | 585 | 3879 | 1.86 | 90.5 | 82 | 89.2 | 85.5 | ORed 619 | P1 NYAG7 | XTE 470 | 0.14 | 0.80 | 0.06 | 0.69 | 0.31 | 0.43 | 0.55 | 0.13 | 0.07 | 619 | 569 | 470 | 627 | 541 | 465 |
| 2 | 0.40 | 0.36 | 589 | 3347 | 1.55 | 92.5 | 94 | 86.2 | 90.6 | ORed 619 | P1 NYAG7 | XTE 459 | 0.16 | 0.81 | 0.03 | 0.69 | 0.31 | 0.43 | 0.55 | 0.15 | 0.03 | 619 | 569 | 459 | 627 | 541 | 454 |
| 3 | 0.40 | 0.36 | 589 | 3347 | 1.64 | 92.0 | 85 | 90.2 | 88.9 | ORed 619 | P1 NYAG7 | XTE 465 | 0.17 | 0.79 | 0.04 | 0.69 | 0.31 | 0.43 | 0.55 | 0.14 | 0.05 | 619 | 569 | 465 | 627 | 541 | 459 |
| 4 | 0.40 | 0.36 | 589 | 3347 | 1.52 | 91.5 | 95 | 84.6 | 91.2 | ORed 619 | P1 NYAG7 | XTE 465 | 0.16 | 0.82 | 0.02 | 0.69 | 0.31 | 0.43 | 0.55 | 0.15 | 0.03 | 619 | 569 | 457 | 627 | 541 | 452 |
| 5 | 0.38 | 0.34 | 589 | 3691 | 1.80 | 89.1 | 71 | 89.0 | 99.8 | ORed 619 | P1 NYAG7 | XTE 465 | 0.19 | 0.77 | 0.05 | 0.69 | 0.31 | 0.43 | 0.55 | 0.14 | 0.03 | 619 | 569 | 465 | 627 | 541 | 459 |
| 6 | 0.40 | 0.36 | 589 | 3347 | 1.62 | 91.3 | 54 | 87.9 | 84.6 | ORed 619 | P1 NYAG7 | XTE 459 | 0.17 | 0.80 | 0.04 | 0.67 | 0.33 | 0.43 | 0.55 | 0.14 | 0.03 | 613 | 569 | 459 | 620 | 541 | 454 |
| 7 | 0.38 | 0.34 | 589 | 3691 | 1.67 | 91.1 | 56 | 82.6 | 97.2 | Strd SPD1 | P1 NYAG7 | XTE 459 | 0.17 | 0.80 | 0.03 | 0.67 | 0.33 | 0.43 | 0.55 | 0.15 | 0.03 | 613 | 569 | 459 | 620 | 541 | 454 |
| 8 | 0.40 | 0.36 | 589 | 3347 | 1.53 | 90.9 | 45 | 84.0 | 86.5 | Strd SPD1 | P1 NYAG7 | XTE 459 | 0.18 | 0.79 | 0.03 | 0.67 | 0.33 | 0.43 | 0.55 | 0.15 | 0.02 | 613 | 569 | 454 | 620 | 541 | 449 |
| 9 | 0.40 | 0.34 | 599 | 3691 | 1.48 | 90.1 | 94 | 82.9 | 91.9 | Strd SPD1 | P1 NYAG7 | XPH 455 | 0.16 | 0.82 | 0.03 | 0.69 | 0.31 | 0.43 | 0.55 | 0.15 | 0.02 | 619 | 569 | 454 | 627 | 541 | 449 |
| 10 | 0.38 | 0.34 | 589 | 3691 | 1.63 | 90.1 | 52 | 80.8 | 97.8 | Strd SPD1 | P1 NYAG7 | XPH 455 | 0.17 | 0.80 | 0.03 | 0.67 | 0.33 | 0.43 | 0.55 | 0.15 | 0.02 | 613 | 569 | 454 | 620 | 541 | 449 |
| 11 | 0.38 | 0.34 | 599 | 3691 | 1.78 | 90.0 | 67 | 87.0 | 95.2 | Strd SPD1 | P1 NYAG7 | XP 457 | 0.18 | 0.77 | 0.05 | 0.67 | 0.33 | 0.43 | 0.55 | 0.14 | 0.03 | 613 | 569 | 457 | 620 | 541 | 454 |
| 12 | 0.40 | 0.36 | 589 | 3347 | 1.50 | 90.0 | 42 | 82.4 | 87.1 | Strd SPD1 | P1 NYAG7 | XP 457 | 0.18 | 0.80 | 0.02 | 0.67 | 0.33 | 0.43 | 0.55 | 0.15 | 0.02 | 613 | 569 | 457 | 620 | 541 | 452 |
| 13 | 0.40 | 0.34 | 592 | 3347 | 1.40 | 89.9 | 43 | 83.3 | 85.8 | Strd SPD1 | P1 NYAG7 | XP 457 | 0.23 | 0.75 | 0.02 | 0.67 | 0.33 | 0.43 | 0.55 | 0.15 | 0.03 | 613 | 569 | 457 | 620 | 541 | 452 |
| 14 | 0.42 | 0.34 | 592 | 2912 | 1.43 | 89.4 | 45 | 84.9 | 85.1 | Strd SPD1 | P1 NYAG7 | XP 457 | 0.23 | 0.74 | 0.03 | 0.69 | 0.31 | 0.43 | 0.55 | 0.15 | 0.03 | 619 | 569 | 459 | 627 | 541 | 454 |
| 15 | 0.42 | 0.34 | 592 | 2912 | 1.43 | 89.6 | 68 | 85.6 | 90.7 | ORed 619 | P1 NYAG7 | XP 457 | 0.21 | 0.77 | 0.02 | 0.69 | 0.31 | 0.43 | 0.55 | 0.15 | 0.02 | 619 | 569 | 454 | 627 | 541 | 449 |
| 16 | 0.42 | 0.36 | 589 | 3347 | 1.37 | 89.6 | 41 | 81.6 | 86.6 | Strd SPD1 | P1 NYAG7 | XPH 455 | 0.23 | 0.76 | 0.02 | 0.67 | 0.33 | 0.43 | 0.55 | 0.15 | 0.02 | 613 | 569 | 454 | 620 | 541 | 449 |
| 17 | 0.40 | 0.34 | 592 | 3347 | 1.40 | 89.4 | 91 | 83.9 | 91.4 | ORed 619 | P1 NYAG7 | XPH 455 | 0.20 | 0.78 | 0.02 | 0.69 | 0.31 | 0.43 | 0.55 | 0.14 | 0.03 | 619 | 569 | 454 | 627 | 541 | 449 |
| 18 | 0.40 | 0.36 | 589 | 3347 | 1.56 | 89.3 | 64 | 86.9 | 92.8 | Red 623 | P1 NYAG7 | XP 457 | 0.15 | 0.82 | 0.03 | 0.70 | 0.30 | 0.43 | 0.55 | 0.15 | 0.03 | 623 | 569 | 459 | 632 | 541 | 454 |
| 19 | 0.40 | 0.34 | 602 | 3138 | 1.49 | 89.3 | 51 | 80.4 | 77.7 | Strd SPD1 | P1 NYAG7 | XP 457 | 0.21 | 0.76 | 0.03 | 0.69 | 0.31 | 0.43 | 0.55 | 0.14 | 0.02 | 619 | 569 | 454 | 627 | 541 | 449 |
| 20 | 0.42 | 0.34 | 592 | 2912 | 1.45 | 89.1 | 65 | 87.2 | 90.0 | ORed 619 | P1 NYAG7 | XPH 455 | 0.22 | 0.75 | 0.03 | 0.69 | 0.31 | 0.43 | 0.55 | 0.15 | 0.02 | 619 | 569 | 454 | 627 | 541 | 449 |
| 21 | 0.40 | 0.34 | 602 | 3138 | 1.53 | 89.0 | 54 | 82.2 | 98.3 | Strd SPD1 | P1 NYAG7 | XPH 455 | 0.22 | 0.76 | 0.02 | 0.69 | 0.31 | 0.43 | 0.55 | 0.15 | 0.02 | 619 | 569 | 459 | 627 | 541 | 454 |
| 22 | 0.40 | 0.34 | 592 | 3347 | 1.53 | 88.6 | 68 | 85.1 | 93.3 | Strd SPD1 | P1 NYAG7 | XP 457 | 0.15 | 0.83 | 0.02 | 0.70 | 0.30 | 0.43 | 0.55 | 0.15 | 0.02 | 623 | 569 | 457 | 632 | 541 | 452 |
| 23 | 0.40 | 0.36 | 589 | 3347 | 1.56 | 88.6 | 57 | 84.0 | 97.6 | Strd SPD1 | P1 NYAG7 | XTE 459 | 0.22 | 0.76 | 0.02 | 0.67 | 0.33 | 0.43 | 0.55 | 0.15 | 0.02 | 613 | 569 | 459 | 620 | 541 | 454 |
| 24 | 0.40 | 0.34 | 602 | 3138 | 1.65 | 88.5 | 30 | 90.7 | 91.1 | Red 623 | P1 NYAG7 | XTE 465 | 0.16 | 0.80 | 0.04 | 0.70 | 0.30 | 0.43 | 0.55 | 0.14 | 0.05 | 623 | 569 | 465 | 632 | 541 | 459 |
| 25 | 0.40 | 0.36 | 589 | 3347 | 1.59 | 88.5 | 48 | 79.1 | 98.5 | Strd SPD1 | P1 NYAG7 | XPH 455 | 0.22 | 0.81 | 0.01 | 0.67 | 0.33 | 0.43 | 0.55 | 0.15 | 0.02 | 613 | 569 | 454 | 620 | 541 | 449 |
| 26 | 0.42 | 0.34 | 592 | 2912 | 1.32 | 88.4 | 37 | 78.9 | 87.7 | Strd SPD1 | P1 NYAG7 | XPH 455 | 0.18 | 0.80 | 0.03 | 0.67 | 0.33 | 0.43 | 0.55 | 0.16 | 0.02 | 613 | 569 | 450 | 620 | 541 | 444 |
| 27 | 0.40 | 0.34 | 602 | 3138 | 1.47 | 88.3 | 39 | 80.8 | 87.3 | Strd SPD1 | P1 NYAG7 | XPH 450 | 0.22 | 0.77 | 0.01 | 0.67 | 0.33 | 0.43 | 0.55 | 0.16 | 0.01 | 613 | 569 | 450 | 620 | 541 | 444 |
| 28 | 0.42 | 0.34 | 592 | 2912 | 1.35 | 88.1 | 94 | 80.8 | 92.4 | ORed 619 | P1 NYAG7 | XPH 450 | 0.20 | 0.79 | 0.01 | 0.67 | 0.33 | 0.43 | 0.55 | 0.16 | 0.02 | 613 | 569 | 450 | 620 | 541 | 444 |
| 29 | 0.44 | 0.36 | 594 | 2565 | 1.23 | 87.9 | 54 | 78.2 | 84.9 | Strd SPD1 | P1 NYAG7 | XPH 450 | 0.27 | 0.72 | 0.02 | 0.67 | 0.33 | 0.43 | 0.55 | 0.16 | 0.02 | 613 | 569 | 450 | 620 | 541 | 444 |
| 30 | 0.42 | 0.36 | 592 | 2912 | 1.52 | 87.9 | 53 | 82.7 | 83.1 | Strd SPD1 | P1 NYAG7 | XTE 465 | 0.24 | 0.72 | 0.05 | 0.67 | 0.32 | 0.43 | 0.55 | 0.14 | 0.05 | 613 | 569 | 465 | 620 | 541 | 459 |
| 31 | 0.44 | 0.36 | 594 | 2565 | 1.22 | 87.8 | 32 | 77.1 | 84.9 | Strd SPD1 | P1 NYAG7 | XR 447 | 0.27 | 0.72 | 0.01 | 0.67 | 0.33 | 0.43 | 0.55 | 0.16 | 0.02 | 613 | 569 | 447 | 620 | 541 | 440 |

FIG. 12A

| # | x | y | dm | cct | S/P | CRI | R9 | CQS | GAI | Source 1a | Source 2a | Source 3a | 1a L% | 2a L% | 3a L% | 1a x | 1a y | 2a x | 2a y | 3a x | 3a y | 1a dm | 2a dm | 3a dm | 1a pk | 2a pk | 3a pk |
|---|---|---|---|---|---|---|---|---|---|---|---|---|---|---|---|---|---|---|---|---|---|---|---|---|---|---|---|
| 32 | 0.44 | 0.36 | 594 | 2565 | 1.28 | 87.9 | 37 | 81.0 | 83.5 | Strd SPD1 | P1 NYAG7 | XPH 455 | 0.28 | 0.71 | 0.02 | 0.67 | 0.33 | 0.43 | 0.55 | 0.15 | 0.02 | 613 | 569 | 454 | 620 | 541 | 449 |
| 33 | 0.42 | 0.36 | 592 | 2912 | 1.33 | 87.6 | 34 | 79.6 | 92.7 | ORed 619 | P1 NYAG7 | XR 447 | 0.20 | 0.79 | 0.01 | 0.69 | 0.31 | 0.43 | 0.55 | 0.16 | 0.02 | 619 | 569 | 447 | 627 | 541 | 440 |
| 34 | 0.40 | 0.36 | 589 | 3347 | 1.49 | 87.5 | 72 | 83.3 | 94.0 | ORed 619 | P1 NYAG7 | XPH 455 | 0.15 | 0.83 | 0.02 | 0.70 | 0.30 | 0.43 | 0.55 | 0.15 | 0.02 | 623 | 569 | 454 | 632 | 541 | 449 |
| 35 | 0.40 | 0.36 | 589 | 3347 | 1.43 | 87.3 | 88 | 80.0 | 92.8 | ORed 619 | P1 NYAG7 | XPH 450 | 0.15 | 0.83 | 0.01 | 0.69 | 0.31 | 0.43 | 0.55 | 0.16 | 0.02 | 619 | 569 | 450 | 627 | 541 | 444 |
| 36 | 0.42 | 0.34 | 604 | 2710 | 1.33 | 87.3 | 42 | 77.1 | 99.0 | Strd SPD1 | P1 NYAG7 | XPH 450 | 0.26 | 0.72 | 0.01 | 0.67 | 0.33 | 0.43 | 0.55 | 0.16 | 0.02 | 613 | 569 | 450 | 620 | 541 | 444 |
| 37 | 0.42 | 0.34 | 604 | 2710 | 1.31 | 87.3 | 41 | 76.1 | 99.4 | Strd SPD1 | P1 NYAG7 | XR 447 | 0.26 | 0.73 | 0.01 | 0.67 | 0.33 | 0.43 | 0.55 | 0.16 | 0.02 | 613 | 569 | 447 | 620 | 541 | 440 |
| 38 | 0.42 | 0.36 | 592 | 2912 | 1.31 | 87.3 | 35 | 77.8 | 83.0 | Strd SPD1 | P1 NYAG7 | XPH 450 | 0.22 | 0.77 | 0.01 | 0.67 | 0.33 | 0.43 | 0.55 | 0.16 | 0.02 | 619 | 569 | 450 | 627 | 541 | 444 |
| 39 | 0.42 | 0.36 | 592 | 2912 | 1.54 | 87.1 | 76 | 91.3 | 88.0 | ORed 619 | P1 NYAG7 | XTE 465 | 0.22 | 0.75 | 0.03 | 0.69 | 0.31 | 0.43 | 0.55 | 0.14 | 0.05 | 619 | 569 | 465 | 627 | 541 | 459 |
| 40 | 0.44 | 0.36 | 594 | 2565 | 1.31 | 87.1 | 39 | 82.7 | 82.7 | Strd SPD1 | P1 NYAG7 | XP 457 | 0.28 | 0.70 | 0.02 | 0.67 | 0.33 | 0.43 | 0.55 | 0.15 | 0.03 | 613 | 569 | 457 | 620 | 541 | 452 |
| 41 | 0.40 | 0.36 | 589 | 3347 | 1.26 | 86.9 | 90 | 80.2 | 90.0 | ORed 619 | P1 NYAG7 | XPH 450 | 0.24 | 0.74 | 0.01 | 0.69 | 0.31 | 0.43 | 0.55 | 0.16 | 0.02 | 619 | 569 | 450 | 627 | 541 | 444 |
| 42 | 0.36 | 0.36 | 594 | 2565 | 1.77 | 86.8 | 68 | 91.4 | 85.2 | ORed 619 | P1 NYAG7 | XTE 470 | 0.19 | 0.76 | 0.05 | 0.69 | 0.31 | 0.43 | 0.55 | 0.13 | 0.07 | 619 | 569 | 470 | 627 | 541 | 465 |
| 43 | 0.36 | 0.36 | 589 | 3347 | 2.24 | 86.6 | 91 | 79.1 | 90.3 | ORed 619 | P1 NYAG7 | XR 447 | 0.24 | 0.75 | 0.01 | 0.69 | 0.31 | 0.43 | 0.55 | 0.16 | 0.02 | 619 | 569 | 447 | 627 | 541 | 440 |
| 44 | 0.44 | 0.36 | 594 | 2565 | 1.31 | 85.6 | 87 | 83.3 | 88.9 | Strd SPD1 | P1 NYAG7 | XPH 455 | 0.25 | 0.74 | 0.01 | 0.67 | 0.33 | 0.43 | 0.55 | 0.15 | 0.02 | 613 | 569 | 454 | 620 | 541 | 449 |
| 45 | 0.42 | 0.34 | 604 | 2710 | 1.39 | 85.6 | 46 | 80.2 | 97.7 | Strd SPD1 | P1 NYAG7 | XPH 455 | 0.27 | 0.71 | 0.02 | 0.67 | 0.33 | 0.43 | 0.55 | 0.15 | 0.02 | 613 | 569 | 454 | 620 | 541 | 449 |
| 46 | 0.44 | 0.36 | 594 | 2565 | 1.33 | 86.5 | 41 | 84.2 | 82.0 | Strd SPD1 | P1 NYAG7 | XTE 459 | 0.28 | 0.70 | 0.03 | 0.67 | 0.33 | 0.43 | 0.55 | 0.15 | 0.03 | 613 | 569 | 459 | 620 | 541 | 454 |
| 47 | 0.40 | 0.36 | 589 | 3347 | 1.33 | 86.3 | 85 | 85.0 | 88.2 | ORed 619 | P1 NYAG7 | XR 447 | 0.25 | 0.74 | 0.01 | 0.69 | 0.31 | 0.43 | 0.55 | 0.16 | 0.02 | 619 | 569 | 447 | 627 | 541 | 440 |
| 48 | 0.40 | 0.34 | 602 | 3138 | 1.75 | 85.1 | 65 | 89.4 | 91.3 | ORed 619 | P1 NYAG7 | XP 457 | 0.21 | 0.74 | 0.05 | 0.67 | 0.33 | 0.43 | 0.55 | 0.15 | 0.03 | 623 | 569 | 457 | 632 | 541 | 452 |
| 49 | 0.42 | 0.36 | 592 | 2912 | 1.13 | 85.9 | 26 | 75.2 | 80.2 | Strd SPD1 | P1 NYAG7 | XTE 470 | 0.19 | 0.76 | 0.05 | 0.67 | 0.33 | 0.43 | 0.55 | 0.13 | 0.07 | 619 | 569 | 470 | 627 | 541 | 465 |
| 50 | 0.44 | 0.36 | 594 | 2565 | 1.42 | 85.9 | 49 | 82.0 | 82.9 | Strd SPD1 | P1 NYAG7 | XR 447 | 0.32 | 0.67 | 0.01 | 0.67 | 0.33 | 0.43 | 0.55 | 0.16 | 0.02 | 613 | 569 | 447 | 620 | 541 | 440 |
| 51 | 0.42 | 0.36 | 592 | 2912 | 1.36 | 85.8 | 82 | 86.5 | 87.5 | ORed 619 | P1 NYAG7 | XPH 455 | 0.27 | 0.71 | 0.02 | 0.69 | 0.31 | 0.43 | 0.55 | 0.15 | 0.02 | 619 | 569 | 454 | 627 | 541 | 449 |
| 52 | 0.44 | 0.34 | 602 | 2565 | 1.41 | 85.8 | 86 | 79.3 | 93.0 | ORed 619 | P1 NYAG7 | XR 447 | 0.25 | 0.73 | 0.02 | 0.69 | 0.31 | 0.43 | 0.55 | 0.16 | 0.02 | 619 | 569 | 447 | 627 | 541 | 440 |
| 53 | 0.42 | 0.34 | 589 | 3138 | 1.67 | 85.6 | 66 | 89.3 | 95.3 | Strd SPD1 | P1 NYAG7 | XTE 465 | 0.15 | 0.84 | 0.02 | 0.69 | 0.31 | 0.43 | 0.55 | 0.14 | 0.05 | 619 | 569 | 465 | 627 | 541 | 459 |
| 54 | 0.40 | 0.34 | 592 | 2912 | 1.42 | 85.4 | 34 | 78.0 | 83.8 | Strd SPD1 | P1 NYAG7 | XPH 450 | 0.23 | 0.72 | 0.01 | 0.67 | 0.33 | 0.43 | 0.55 | 0.16 | 0.02 | 619 | 569 | 450 | 627 | 541 | 444 |
| 55 | 0.42 | 0.36 | 592 | 2912 | 1.44 | 85.3 | 52 | 86.0 | 93.1 | Strd SPD1 | P1 NYAG7 | XP 457 | 0.17 | 0.81 | 0.02 | 0.69 | 0.31 | 0.43 | 0.55 | 0.15 | 0.03 | 619 | 569 | 457 | 627 | 541 | 452 |
| 56 | 0.40 | 0.36 | 585 | 3879 | 1.41 | 85.3 | 56 | 84.2 | 93.9 | Red 623 | P1 NYAG7 | XPH 455 | 0.19 | 0.79 | 0.02 | 0.70 | 0.30 | 0.43 | 0.55 | 0.15 | 0.02 | 623 | 569 | 454 | 632 | 541 | 449 |
| 57 | 0.38 | 0.36 | 585 | 3879 | 1.62 | 83.8 | 95 | 82.7 | 91.3 | Red 623 | P1 NYAG7 | XP 457 | 0.11 | 0.87 | 0.02 | 0.70 | 0.30 | 0.43 | 0.55 | 0.15 | 0.03 | 623 | 569 | 457 | 632 | 541 | 452 |
| 58 | 0.38 | 0.36 | 585 | 3530 | 1.61 | 82.8 | 78 | 82.2 | 89.6 | ORed 619 | P1 NYAG7 | XPH 455 | 0.12 | 0.86 | 0.02 | 0.69 | 0.31 | 0.43 | 0.55 | 0.15 | 0.02 | 619 | 569 | 454 | 627 | 541 | 449 |
| 59 | 0.40 | 0.36 | 594 | 3101 | 1.73 | 86.6 | 74 | 90.6 | 82.1 | Strd SPD1 | P1 LuAG2 | XR 447 | 0.24 | 0.75 | 0.02 | 0.67 | 0.33 | 0.35 | 0.57 | 0.16 | 0.02 | 613 | 558 | 447 | 620 | 532 | 440 |
| 60 | 0.42 | 0.38 | 586 | 3347 | 1.41 | 88.8 | 73 | 86.6 | 80.5 | Red 623 | P1 NYAG7 | XR 447 | 0.16 | 0.82 | 0.02 | 0.70 | 0.30 | 0.43 | 0.55 | 0.16 | 0.02 | 623 | 569 | 447 | 632 | 541 | 440 |
| 61 | 0.40 | 0.36 | 589 | 3347 | 1.73 | 84.6 | 82 | 89.2 | 93.9 | ORed 619 | P1 LuAG2 | XPH 450 | 0.27 | 0.72 | 0.01 | 0.67 | 0.33 | 0.35 | 0.57 | 0.16 | 0.02 | 619 | 558 | 450 | 627 | 532 | 444 |
| 62 | 0.40 | 0.38 | 583 | 3530 | 1.50 | 88.6 | 96 | 84.8 | 80.7 | Red 623 | P1 NYAG7 | XP 457 | 0.12 | 0.86 | 0.02 | 0.70 | 0.30 | 0.43 | 0.56 | 0.15 | 0.03 | 623 | 569 | 457 | 632 | 541 | 452 |

FIG._12B

| # | x | y | dm | cct | S/P | CRI | R9 | CQS | GAI | Source 1a | Source 2a | Source 3a | 1a L% | 2a L% | 3a L% | 1a x | 1a y | 2a x | 2a y | 3a x | 3a y | 1a dm | 2a dm | 3a dm | 1a pk | 2a pk | 3a pk |
|---|---|---|---|---|---|---|---|---|---|---|---|---|---|---|---|---|---|---|---|---|---|---|---|---|---|---|---|
| 63 | 0.40 | 0.38 | 583 | 3530 | 1.76 | 88.6 | 77 | 92.1 | 80.8 | Strd SPD1 | P1 LUAG2 | XPH 455 | 0.24 | 0.74 | 0.01 | 0.67 | 0.33 | 0.35 | 0.57 | 0.15 | 0.02 | 613 | 558 | 454 | 620 | 532 | 449 |
| 64 | 0.38 | 0.38 | 583 | 3530 | 1.71 | 86.4 | 73 | 89.6 | 82.5 | Strd SPD1 | P1 LUAG2 | XR 447 | 0.24 | 0.75 | 0.01 | 0.67 | 0.33 | 0.35 | 0.57 | 0.16 | 0.02 | 613 | 558 | 447 | 620 | 532 | 440 |
| 65 | 0.41 | 0.38 | 586 | 3101 | 1.39 | 87.8 | 77 | 85.0 | 81.1 | Red 623 | P1 NYAG7 | XPH 455 | 0.16 | 0.82 | 0.01 | 0.70 | 0.30 | 0.43 | 0.55 | 0.16 | 0.02 | 623 | 569 | 454 | 632 | 541 | 449 |
| 66 | 0.42 | 0.38 | 586 | 3101 | 1.34 | 87.6 | 85 | 81.8 | 80.1 | Strd SPD1 | P1 NYAG7 | XPH 455 | 0.17 | 0.82 | 0.01 | 0.69 | 0.31 | 0.43 | 0.55 | 0.16 | 0.02 | 619 | 569 | 450 | 627 | 541 | 444 |
| 67 | 0.39 | 0.36 | 585 | 3879 | 1.63 | 87.8 | 36 | 81.7 | 85.9 | ORed 619 | P1 NYAG7 | XTE 459 | 0.13 | 0.84 | 0.03 | 0.67 | 0.33 | 0.43 | 0.55 | 0.15 | 0.03 | 613 | 569 | 459 | 620 | 541 | 454 |
| 68 | 0.40 | 0.36 | 583 | 3530 | 1.47 | 87.6 | 98 | 83.3 | 81.3 | Red 623 | P1 NYAG7 | XPH 455 | 0.12 | 0.86 | 0.02 | 0.70 | 0.30 | 0.43 | 0.55 | 0.16 | 0.02 | 623 | 569 | 454 | 632 | 541 | 449 |
| 69 | 0.38 | 0.34 | 599 | 3691 | 1.52 | 85.3 | 42 | 76.2 | 99.5 | Strd SPD1 | P1 NYAG7 | XPH 450 | 0.15 | 0.83 | 0.02 | 0.67 | 0.33 | 0.43 | 0.55 | 0.16 | 0.02 | 613 | 569 | 450 | 620 | 541 | 444 |
| 70 | 0.42 | 0.38 | 586 | 3101 | 1.32 | 85.5 | 83 | 80.3 | 80.3 | ORed 619 | P1 NYAG7 | XPH 450 | 0.16 | 0.83 | 0.01 | 0.69 | 0.31 | 0.43 | 0.55 | 0.16 | 0.02 | 619 | 569 | 450 | 627 | 541 | 444 |
| 71 | 0.36 | 0.36 | 586 | 3879 | 1.58 | 86.6 | 98 | 81.6 | 91.8 | Red 623 | P1 NYAG7 | XPH 455 | 0.11 | 0.87 | 0.02 | 0.70 | 0.30 | 0.43 | 0.55 | 0.16 | 0.02 | 623 | 569 | 454 | 632 | 541 | 449 |
| 72 | 0.33 | 0.36 | 585 | 3879 | 1.57 | 86.4 | 73 | 80.6 | 90.2 | ORed 619 | P1 NYAG7 | XPH 455 | 0.11 | 0.87 | 0.02 | 0.67 | 0.33 | 0.35 | 0.57 | 0.16 | 0.02 | 613 | 569 | 454 | 620 | 532 | 449 |
| 73 | 0.39 | 0.36 | 585 | 3879 | 1.60 | 85.9 | 32 | 80.1 | 86.4 | Strd SPD1 | P1 NYAG7 | XP 457 | 0.13 | 0.85 | 0.02 | 0.67 | 0.33 | 0.43 | 0.55 | 0.16 | 0.03 | 613 | 569 | 457 | 620 | 541 | 452 |
| 74 | 0.42 | 0.36 | 586 | 3879 | 1.34 | 85.5 | 82 | 82.2 | 81.9 | ORed 619 | P1 NYAG7 | XPH 450 | 0.16 | 0.83 | 0.01 | 0.69 | 0.31 | 0.43 | 0.55 | 0.16 | 0.02 | 619 | 569 | 450 | 627 | 541 | 444 |
| 75 | 0.42 | 0.36 | 592 | 2912 | 1.46 | 85.0 | 49 | 87.7 | 92.5 | Red 623 | P1 NYAG7 | XTE 459 | 0.20 | 0.76 | 0.03 | 0.70 | 0.30 | 0.43 | 0.55 | 0.15 | 0.03 | 623 | 569 | 459 | 632 | 541 | 454 |
| 76 | 0.40 | 0.36 | 592 | 2912 | 1.44 | 85.0 | 79 | 80.5 | 94.8 | Red 623 | P1 NYAG7 | XPH 450 | 0.15 | 0.84 | 0.01 | 0.70 | 0.30 | 0.43 | 0.55 | 0.16 | 0.02 | 623 | 569 | 450 | 632 | 541 | 444 |
| 77 | 0.42 | 0.36 | 604 | 2710 | 1.46 | 85.0 | 51 | 83.7 | 96.0 | Red 623 | P1 NYAG7 | XTE 459 | 0.27 | 0.70 | 0.03 | 0.70 | 0.30 | 0.43 | 0.55 | 0.16 | 0.03 | 623 | 569 | 459 | 632 | 541 | 454 |
| 78 | 0.34 | 0.36 | 605 | 2381 | 1.22 | 84.9 | 33 | 74.4 | 96.3 | Red 623 | P1 NYAG7 | XTE 459 | 0.31 | 0.67 | 0.02 | 0.70 | 0.30 | 0.43 | 0.55 | 0.16 | 0.03 | 623 | 569 | 459 | 632 | 541 | 454 |
| 79 | 0.42 | 0.36 | 592 | 2912 | 1.36 | 84.8 | 61 | 81.2 | 94.9 | Red 623 | P1 NYAG7 | XR 447 | 0.19 | 0.80 | 0.01 | 0.70 | 0.30 | 0.43 | 0.55 | 0.16 | 0.02 | 623 | 569 | 447 | 632 | 541 | 440 |
| 80 | 0.40 | 0.36 | 589 | 3347 | 1.71 | 84.4 | 80 | 88.1 | 94.4 | Strd SPD1 | P1 NYAG7 | XPH 450 | 0.27 | 0.72 | 0.01 | 0.67 | 0.33 | 0.43 | 0.55 | 0.15 | 0.02 | 613 | 569 | 450 | 620 | 541 | 444 |
| 81 | 0.40 | 0.36 | 589 | 3347 | 1.77 | 84.4 | 84 | 91.0 | 92.4 | Strd SPD1 | P1 LUAG2 | XPH 455 | 0.27 | 0.71 | 0.02 | 0.67 | 0.33 | 0.35 | 0.57 | 0.16 | 0.02 | 613 | 558 | 454 | 620 | 532 | 449 |
| 82 | 0.44 | 0.34 | 605 | 2381 | 1.24 | 84.8 | 34 | 75.4 | 95.6 | Red 623 | P1 NYAG7 | XR 447 | 0.31 | 0.67 | 0.01 | 0.70 | 0.30 | 0.43 | 0.55 | 0.16 | 0.02 | 623 | 569 | 447 | 632 | 541 | 440 |
| 83 | 0.46 | 0.36 | 596 | 2289 | 1.16 | 84.5 | 90 | 77.2 | 86.0 | ORed 619 | P1 NYAG7 | XR 447 | 0.29 | 0.70 | 0.01 | 0.69 | 0.31 | 0.43 | 0.55 | 0.16 | 0.02 | 619 | 569 | 447 | 627 | 541 | 440 |
| 84 | 0.46 | 0.36 | 596 | 2289 | 1.19 | 84.4 | 89 | 78.3 | 85.7 | ORed 619 | P1 NYAG7 | XPH 450 | 0.29 | 0.70 | 0.01 | 0.69 | 0.31 | 0.43 | 0.55 | 0.16 | 0.02 | 619 | 569 | 450 | 627 | 541 | 444 |
| 85 | 0.40 | 0.36 | 589 | 3347 | 1.60 | 83.6 | 86 | 91.6 | 91.4 | Strd SPD1 | P1 LUAG2 | XR 447 | 0.27 | 0.71 | 0.01 | 0.67 | 0.33 | 0.35 | 0.57 | 0.16 | 0.02 | 613 | 558 | 447 | 620 | 532 | 440 |
| 86 | 0.40 | 0.36 | 589 | 3347 | 1.39 | 84.0 | 32 | 77.2 | 89.1 | Strd SPD1 | P1 NYAG7 | XR 447 | 0.17 | 0.82 | 0.01 | 0.67 | 0.33 | 0.43 | 0.55 | 0.16 | 0.02 | 613 | 569 | 447 | 620 | 541 | 440 |
| 87 | 0.42 | 0.36 | 592 | 3347 | 1.42 | 83.9 | 82 | 79.6 | 95.0 | Red 623 | P1 NYAG7 | XPH 450 | 0.14 | 0.84 | 0.02 | 0.69 | 0.31 | 0.43 | 0.55 | 0.16 | 0.02 | 619 | 569 | 450 | 627 | 541 | 444 |
| 88 | 0.42 | 0.36 | 586 | 3101 | 1.75 | 93.8 | 74 | 88.3 | 89.5 | ORed 619 | P1 NYAG7 | XTE 465 | 0.12 | 0.84 | 0.04 | 0.70 | 0.30 | 0.43 | 0.55 | 0.14 | 0.05 | 619 | 569 | 465 | 627 | 541 | 459 |
| 89 | 0.42 | 0.38 | 596 | 3101 | 1.33 | 84.5 | 84 | 81.3 | 82.1 | Strd SPD1 | P1 NYAG7 | XR 447 | 0.16 | 0.83 | 0.01 | 0.69 | 0.31 | 0.43 | 0.55 | 0.16 | 0.02 | 619 | 569 | 447 | 627 | 541 | 440 |
| 90 | 0.42 | 0.36 | 592 | 3347 | 1.22 | 83.9 | 64 | 80.3 | 95.1 | Red 623 | P1 NYAG7 | XR 447 | 0.19 | 0.80 | 0.01 | 0.70 | 0.30 | 0.43 | 0.55 | 0.15 | 0.02 | 623 | 569 | 447 | 632 | 541 | 440 |
| 91 | 0.46 | 0.36 | 596 | 2289 | 1.22 | 84.0 | 87 | 81.2 | 84.6 | ORed 619 | P1 NYAG7 | XPH 450 | 0.29 | 0.69 | 0.01 | 0.67 | 0.33 | 0.43 | 0.55 | 0.15 | 0.02 | 619 | 569 | 450 | 627 | 541 | 444 |
| 92 | 0.38 | 0.36 | 585 | 3879 | 1.56 | 83.6 | 29 | 78.6 | 87.0 | Strd SPD1 | P1 NYAG7 | XPH 455 | 0.13 | 0.85 | 0.02 | 0.67 | 0.33 | 0.43 | 0.55 | 0.15 | 0.02 | 613 | 569 | 454 | 620 | 541 | 449 |
| 93 | 0.40 | 0.38 | 583 | 3530 | 1.42 | 83.5 | 66 | 80.1 | 83.0 | ORed 619 | P1 NYAG7 | XPH 450 | 0.12 | 0.86 | 0.01 | 0.69 | 0.31 | 0.43 | 0.55 | 0.16 | 0.02 | 619 | 569 | 450 | 627 | 541 | 444 |

FIG._12C

| # | x | y | dm | cct | S/P | CRI | R9 | CQS | GAI | Source 1a | Source 2a | Source 3a | 1a L% | 2a L% | 3a L% | 1a x | 1a y | 2a x | 2a y | 3a x | 3a y | 1a dm | 2a dm | 3a dm | 1a pk | 2a pk | 3a pk |
|---|---|---|---|---|---|---|---|---|---|---|---|---|---|---|---|---|---|---|---|---|---|---|---|---|---|---|---|
| 94 | 0.40 | 0.38 | 583 | 3530 | 1.42 | 83.3 | 92 | 80.7 | 82.1 | Red 623 | P1 NYAG7 | XPH 450 | 0.12 | 0.87 | 0.01 | 0.70 | 0.30 | 0.43 | 0.55 | 0.16 | 0.02 | 623 | 569 | 450 | 632 | 541 | 444 |
| 95 | 0.36 | 0.36 | 589 | 3347 | 1.76 | 83.8 | 33 | 91.8 | 88.5 | Red 623 | P1 NYAG7 | XTE 470 | 0.18 | 0.77 | 0.05 | 0.70 | 0.30 | 0.43 | 0.55 | 0.13 | 0.07 | 623 | 569 | 470 | 632 | 541 | 465 |
| 96 | 0.36 | 0.36 | 585 | 3879 | 1.75 | 94.9 | 94 | 87.7 | 87.7 | ORed 619 | P1 NYAG7 | XTE 465 | 0.13 | 0.83 | 0.04 | 0.69 | 0.31 | 0.43 | 0.55 | 0.14 | 0.05 | 619 | 569 | 465 | 627 | 541 | 459 |
| 97 | 0.36 | 0.36 | 585 | 3879 | 1.52 | 82.1 | 90 | 78.5 | 92.5 | ORed 619 | P1 NYAG7 | XPH 450 | 0.10 | 0.88 | 0.02 | 0.69 | 0.30 | 0.43 | 0.55 | 0.16 | 0.02 | 619 | 569 | 450 | 627 | 541 | 444 |
| 98 | 0.36 | 0.36 | 585 | 3879 | 1.52 | 82.1 | 65 | 77.9 | 90.9 | ORed 619 | P1 NYAG7 | XPH 450 | 0.11 | 0.87 | 0.02 | 0.69 | 0.30 | 0.43 | 0.55 | 0.16 | 0.02 | 619 | 569 | 450 | 627 | 541 | 444 |
| 99 | 0.40 | 0.38 | 583 | 3530 | 1.40 | 82.1 | 63 | 79.4 | 80.7 | ORed 619 | P1 NYAG7 | XR 447 | 0.12 | 0.88 | 0.01 | 0.70 | 0.30 | 0.43 | 0.55 | 0.16 | 0.02 | 619 | 569 | 447 | 632 | 541 | 440 |
| 100 | 0.38 | 0.38 | 583 | 3530 | 1.40 | 81.9 | 89 | 80.0 | 82.2 | Red 623 | P1 NYAG7 | XR 447 | 0.12 | 0.87 | 0.01 | 0.70 | 0.30 | 0.43 | 0.55 | 0.16 | 0.02 | 623 | 569 | 447 | 632 | 541 | 440 |
| 101 | 0.34 | 0.36 | 599 | 3691 | 1.50 | 83.6 | 39 | 75.4 | 93.8 | Strd SPD1 | P1 NYAG7 | XR 447 | 0.15 | 0.83 | 0.02 | 0.67 | 0.33 | 0.43 | 0.55 | 0.16 | 0.02 | 613 | 569 | 447 | 620 | 541 | 440 |
| 102 | 0.44 | 0.36 | 594 | 2565 | 1.44 | 93.5 | 75 | 90.4 | 85.4 | ORed 619 | P1 NYAG7 | XTE 465 | 0.26 | 0.71 | 0.03 | 0.69 | 0.31 | 0.43 | 0.55 | 0.14 | 0.05 | 619 | 569 | 465 | 627 | 541 | 459 |
| 103 | 0.46 | 0.38 | 596 | 2269 | 1.24 | 83.5 | 85 | 82.8 | 83.9 | ORed 619 | P1 NYAG7 | XP 457 | 0.30 | 0.69 | 0.02 | 0.69 | 0.31 | 0.35 | 0.57 | 0.15 | 0.03 | 619 | 558 | 457 | 627 | 532 | 452 |
| 104 | 0.38 | 0.36 | 585 | 3879 | 1.94 | 80.1 | 34 | 91.3 | 97.6 | ORed 619 | P1 LUAG2 | XP 457 | 0.21 | 0.77 | 0.02 | 0.69 | 0.31 | 0.35 | 0.57 | 0.15 | 0.03 | 619 | 558 | 457 | 627 | 532 | 452 |
| 105 | 0.38 | 0.36 | 585 | 3879 | 1.87 | 80.5 | 42 | 89.6 | 93.9 | ORed 619 | P1 LUAG2 | XPH 450 | 0.20 | 0.78 | 0.02 | 0.69 | 0.31 | 0.35 | 0.57 | 0.16 | 0.02 | 619 | 558 | 450 | 627 | 532 | 444 |
| 106 | 0.44 | 0.34 | 605 | 2381 | 1.23 | 83.3 | 38 | 78.3 | 94.3 | Strd SPD1 | P1 NYAG7 | KPH 455 | 0.32 | 0.66 | 0.02 | 0.67 | 0.33 | 0.43 | 0.55 | 0.16 | 0.02 | 613 | 569 | 455 | 620 | 541 | 449 |
| 107 | 0.36 | 0.36 | 585 | 3879 | 1.83 | 83.3 | 53 | 89.7 | 87.4 | Red 623 | P1 NYAG7 | XTE 470 | 0.14 | 0.81 | 0.06 | 0.70 | 0.30 | 0.43 | 0.55 | 0.13 | 0.07 | 623 | 569 | 470 | 632 | 541 | 465 |
| 108 | 0.36 | 0.36 | 585 | 3879 | 1.89 | 88.9 | 81 | 91.1 | 94.8 | Strd SPD1 | P1 NYAG7 | XTE 470 | 0.22 | 0.73 | 0.06 | 0.67 | 0.33 | 0.43 | 0.55 | 0.13 | 0.07 | 613 | 569 | 470 | 620 | 541 | 465 |
| 109 | 0.38 | 0.36 | 585 | 3879 | 1.83 | 88.4 | 86 | 93.5 | 92.4 | Strd SPD1 | P1 NYAG7 | XR 447 | 0.23 | 0.75 | 0.02 | 0.67 | 0.33 | 0.43 | 0.55 | 0.16 | 0.02 | 613 | 569 | 447 | 620 | 541 | 440 |
| 110 | 0.36 | 0.36 | 585 | 3879 | 1.91 | 88.3 | 37 | 90.9 | 98.5 | ORed 619 | P1 LUAG2 | KPH 450 | 0.21 | 0.77 | 0.02 | 0.69 | 0.31 | 0.35 | 0.57 | 0.16 | 0.02 | 619 | 558 | 450 | 627 | 532 | 444 |
| 111 | 0.36 | 0.36 | 585 | 3879 | 1.91 | 80.5 | 38 | 91.7 | 90.6 | ORed 619 | P1 LUAG2 | XTE 465 | 0.21 | 0.76 | 0.03 | 0.69 | 0.31 | 0.35 | 0.57 | 0.14 | 0.05 | 619 | 558 | 465 | 627 | 532 | 459 |
| 112 | 0.42 | 0.36 | 592 | 2912 | 1.55 | 83.0 | 90 | 90.2 | 89.1 | Strd SPD1 | P1 NYAG7 | XTE 465 | 0.24 | 0.72 | 0.04 | 0.67 | 0.33 | 0.43 | 0.55 | 0.14 | 0.05 | 613 | 569 | 465 | 620 | 541 | 459 |
| 113 | 0.38 | 0.36 | 585 | 3879 | 2.02 | 82.9 | 38 | 87.2 | 81.9 | Strd SPD1 | P1 LUAG2 | XTE 470 | 0.16 | 0.78 | 0.06 | 0.67 | 0.33 | 0.35 | 0.57 | 0.13 | 0.07 | 613 | 558 | 470 | 620 | 532 | 465 |
| 114 | 0.38 | 0.36 | 585 | 3879 | 1.87 | 88.6 | 62 | 88.6 | 95.3 | Strd SPD1 | P1 NYAG7 | XTE 470 | 0.22 | 0.72 | 0.06 | 0.67 | 0.33 | 0.43 | 0.55 | 0.13 | 0.07 | 613 | 569 | 470 | 620 | 541 | 465 |
| 115 | 0.38 | 0.36 | 583 | 3530 | 1.81 | 68.1 | 79 | 90.1 | 91.1 | Strd SPD1 | P1 NYAG7 | XR 447 | 0.22 | 0.77 | 0.01 | 0.67 | 0.33 | 0.43 | 0.55 | 0.16 | 0.02 | 613 | 569 | 447 | 620 | 541 | 440 |
| 116 | 0.40 | 0.38 | 583 | 3530 | 1.76 | 80.8 | 48 | 88.6 | 86.6 | ORed 619 | P1 NYAG7 | XR 447 | 0.22 | 0.77 | 0.01 | 0.69 | 0.31 | 0.43 | 0.55 | 0.16 | 0.02 | 619 | 569 | 447 | 627 | 541 | 440 |
| 117 | 0.40 | 0.38 | 583 | 3530 | 1.74 | 80.8 | 49 | 87.7 | 87.0 | ORed 619 | P1 NYAG7 | XR 447 | 0.22 | 0.77 | 0.01 | 0.69 | 0.31 | 0.43 | 0.55 | 0.16 | 0.02 | 619 | 569 | 447 | 627 | 541 | 440 |
| 118 | 0.38 | 0.36 | 585 | 3879 | 1.50 | 80.5 | 86 | 77.8 | 92.6 | Red 623 | P1 NYAG7 | XTE 459 | 0.10 | 0.89 | 0.01 | 0.70 | 0.30 | 0.43 | 0.55 | 0.15 | 0.03 | 623 | 569 | 459 | 632 | 541 | 454 |
| 119 | 0.40 | 0.38 | 585 | 3879 | 1.94 | 87.4 | 68 | 93.2 | 91.6 | ORed 619 | P1 LUAG2 | KPH 455 | 0.23 | 0.74 | 0.03 | 0.69 | 0.31 | 0.35 | 0.57 | 0.16 | 0.02 | 619 | 558 | 455 | 627 | 532 | 449 |
| 120 | 0.36 | 0.36 | 585 | 3879 | 1.80 | 80.5 | 44 | 89.7 | 85.4 | ORed 619 | P1 LUAG2 | XTE 470 | 0.22 | 0.74 | 0.04 | 0.69 | 0.31 | 0.35 | 0.57 | 0.13 | 0.07 | 619 | 558 | 470 | 627 | 532 | 465 |
| 121 | 0.38 | 0.36 | 585 | 3879 | 1.49 | 80.4 | 62 | 77.2 | 91.1 | ORed 619 | P1 NYAG7 | XR 447 | 0.11 | 0.88 | 0.01 | 0.69 | 0.31 | 0.43 | 0.55 | 0.16 | 0.02 | 619 | 569 | 447 | 627 | 541 | 440 |
| 122 | 0.40 | 0.38 | 583 | 3530 | 1.82 | 80.4 | 41 | 89.9 | 84.6 | ORed 619 | P1 NYAG7 | XR 447 | 0.22 | 0.76 | 0.02 | 0.69 | 0.31 | 0.43 | 0.55 | 0.16 | 0.02 | 619 | 569 | 447 | 627 | 541 | 440 |
| 123 | 0.38 | 0.36 | 585 | 3879 | 1.88 | 98.9 | 84 | 93.0 | 93.4 | ORed 619 | P1 NYAG7 | KPH 450 | 0.23 | 0.75 | 0.02 | 0.69 | 0.31 | 0.43 | 0.55 | 0.16 | 0.02 | 619 | 569 | 450 | 627 | 541 | 444 |
| 124 | 0.38 | 0.36 | 585 | 3879 | 1.51 | 80.0 | 23 | 76.1 | 87.9 | ORed 619 | P1 NYAG7 | XP 457 | 0.12 | 0.86 | 0.02 | 0.69 | 0.31 | 0.35 | 0.57 | 0.15 | 0.03 | 619 | 558 | 457 | 627 | 532 | 452 |
| 125 | 0.36 | 0.36 | 585 | 3879 | 1.73 | 91.4 | 47 | 85.4 | 84.3 | Strd SPD1 | P1 LUAG2 | XTE 465 | 0.14 | 0.81 | 0.04 | 0.67 | 0.33 | 0.35 | 0.57 | 0.14 | 0.05 | 613 | 558 | 465 | 620 | 532 | 459 |

FIG._12D

| # | x | y | dm | cct | S/P | CRI | R9 | CQS | GAI | Source 1a | Source 2a | Source 3a | 1a L% | 2a L% | 3a L% | 1a x | 1a y | 2a x | 2a y | 3a x | 3a y | 1a dm | 2a dm | 3a dm | 1a pk | 2a pk | 3a pk |
|---|---|---|---|---|---|---|---|---|---|---|---|---|---|---|---|---|---|---|---|---|---|---|---|---|---|---|---|
| 125 | 0.46 | 0.36 | 596 | 2289 | 1.26 | 82.8 | 83 | 84.2 | 83.2 | ORed 619 | P1 NYAG7 | XTE 459 | 0.30 | 0.68 | 0.02 | 0.69 | 0.31 | 0.43 | 0.55 | 0.15 | 0.03 | 619 | 569 | 459 | 627 | 541 | 454 |
| 126 | 0.40 | 0.36 | 589 | 3347 | 1.82 | 82.4 | 87 | 91.6 | 90.6 | Strd SPD1 | P1 LUAG2 | XTE 459 | 0.28 | 0.70 | 0.02 | 0.67 | 0.33 | 0.35 | 0.57 | 0.15 | 0.03 | 613 | 559 | 459 | 620 | 532 | 454 |
| 127 | 0.42 | 0.36 | 592 | 2912 | 1.55 | 82.6 | 64 | 92.7 | 85.2 | ORed 619 | P1 NYAG7 | XTE 470 | 0.23 | 0.72 | 0.05 | 0.69 | 0.31 | 0.43 | 0.55 | 0.13 | 0.07 | 619 | 569 | 470 | 627 | 541 | 465 |
| 128 | 0.38 | 0.34 | 599 | 3691 | 1.96 | 82.6 | 51 | 90.1 | 97.1 | ORed 619 | P1 NYAG7 | XTE 470 | 0.18 | 0.75 | 0.07 | 0.69 | 0.31 | 0.43 | 0.55 | 0.13 | 0.07 | 619 | 569 | 470 | 627 | 541 | 465 |
| 129 | 0.38 | 0.34 | 599 | 3691 | 1.94 | 82.6 | 81 | 88.5 | 92.2 | Strd SPD1 | P1 NYAG7 | XTE 470 | 0.20 | 0.73 | 0.07 | 0.67 | 0.33 | 0.43 | 0.55 | 0.13 | 0.07 | 613 | 569 | 470 | 620 | 541 | 465 |
| 130 | 0.42 | 0.36 | 592 | 2912 | 1.63 | 82.4 | 62 | 90.3 | 80.1 | Strd SPD1 | P1 NYAG7 | XTE 470 | 0.25 | 0.70 | 0.05 | 0.67 | 0.33 | 0.43 | 0.55 | 0.13 | 0.07 | 613 | 569 | 470 | 620 | 541 | 465 |
| 131 | 0.46 | 0.34 | 605 | 2125 | 1.12 | 82.3 | 29 | 70.9 | 90.8 | Strd SPD1 | P1 NYAG7 | XR 447 | 0.37 | 0.62 | 0.01 | 0.67 | 0.33 | 0.43 | 0.55 | 0.16 | 0.02 | 613 | 569 | 447 | 620 | 541 | 440 |
| 132 | 0.40 | 0.38 | 583 | 3530 | 1.52 | 90.3 | 93 | 85.2 | 80.3 | Red 623 | P1 NYAG7 | XTE 459 | 0.13 | 0.85 | 0.01 | 0.69 | 0.30 | 0.43 | 0.55 | 0.15 | 0.03 | 623 | 569 | 459 | 632 | 541 | 454 |
| 133 | 0.44 | 0.36 | 594 | 2565 | 1.27 | 82.1 | 52 | 80.7 | 92.7 | Red 623 | P1 LUAG2 | XPH 450 | 0.23 | 0.76 | 0.01 | 0.70 | 0.30 | 0.43 | 0.55 | 0.16 | 0.01 | 623 | 558 | 450 | 632 | 532 | 444 |
| 134 | 0.44 | 0.36 | 594 | 2565 | 1.26 | 82.0 | 54 | 79.5 | 93.0 | Red 623 | P1 NYAG7 | XR 447 | 0.23 | 0.76 | 0.01 | 0.70 | 0.30 | 0.43 | 0.55 | 0.16 | 0.02 | 623 | 569 | 447 | 632 | 541 | 440 |
| 135 | 0.44 | 0.36 | 594 | 2381 | 1.32 | 82.0 | 40 | 79.9 | 93.4 | Red 623 | P1 NYAG7 | XP 457 | 0.32 | 0.66 | 0.02 | 0.70 | 0.30 | 0.43 | 0.55 | 0.15 | 0.03 | 623 | 569 | 457 | 632 | 541 | 452 |
| 136 | 0.36 | 0.36 | 585 | 3879 | 1.55 | 90.9 | 90 | 84.4 | 90.9 | Strd SPD1 | P1 NYAG7 | XTE 459 | 0.11 | 0.86 | 0.03 | 0.67 | 0.33 | 0.43 | 0.55 | 0.15 | 0.03 | 613 | 569 | 459 | 620 | 541 | 454 |
| 137 | 0.38 | 0.36 | 585 | 3879 | 1.64 | 91.0 | 83 | 83.8 | 89.2 | Red 623 | P1 NYAG7 | XTE 459 | 0.12 | 0.85 | 0.03 | 0.70 | 0.30 | 0.43 | 0.55 | 0.15 | 0.03 | 623 | 569 | 459 | 632 | 541 | 454 |
| 138 | 0.44 | 0.36 | 594 | 2565 | 1.32 | 81.6 | 47 | 83.7 | 91.7 | Red 623 | P1 NYAG7 | XPH 455 | 0.23 | 0.75 | 0.02 | 0.70 | 0.30 | 0.43 | 0.55 | 0.16 | 0.02 | 623 | 569 | 455 | 632 | 541 | 449 |
| 139 | 0.44 | 0.36 | 605 | 2125 | 1.14 | 81.6 | 24 | 71.9 | 90.5 | Strd SPD1 | P1 LUAG2 | XPH 450 | 0.37 | 0.62 | 0.01 | 0.67 | 0.33 | 0.35 | 0.57 | 0.16 | 0.01 | 613 | 558 | 450 | 620 | 532 | 444 |
| 140 | 0.42 | 0.36 | 592 | 2912 | 1.52 | 81.1 | 76 | 85.8 | 91.2 | Red 623 | P1 LUAG2 | XPH 450 | 0.31 | 0.68 | 0.01 | 0.70 | 0.30 | 0.35 | 0.57 | 0.16 | 0.01 | 623 | 558 | 450 | 632 | 532 | 444 |
| 141 | 0.42 | 0.36 | 592 | 2912 | 1.60 | 81.1 | 75 | 85.7 | 91.6 | Strd SPD1 | P1 NYAG7 | XR 447 | 0.31 | 0.68 | 0.01 | 0.67 | 0.33 | 0.43 | 0.55 | 0.16 | 0.02 | 613 | 569 | 447 | 620 | 541 | 440 |
| 142 | 0.44 | 0.36 | 594 | 2565 | 1.35 | 81.3 | 45 | 85.5 | 90.9 | Red 623 | P1 NYAG7 | XP 457 | 0.24 | 0.74 | 0.02 | 0.70 | 0.30 | 0.43 | 0.55 | 0.15 | 0.03 | 623 | 569 | 457 | 632 | 541 | 452 |
| 143 | 0.46 | 0.34 | 605 | 2125 | 1.16 | 81.3 | 87 | 73.1 | 98.2 | ORed 619 | P1 NYAG7 | XR 447 | 0.33 | 0.66 | 0.01 | 0.69 | 0.31 | 0.43 | 0.55 | 0.16 | 0.02 | 619 | 569 | 447 | 627 | 541 | 440 |
| 144 | 0.46 | 0.36 | 605 | 2125 | 1.28 | 80.9 | 86 | 74.3 | 97.9 | ORed 619 | P1 NYAG7 | XPH 450 | 0.33 | 0.66 | 0.01 | 0.69 | 0.31 | 0.43 | 0.55 | 0.16 | 0.01 | 619 | 569 | 450 | 627 | 541 | 444 |
| 145 | 0.44 | 0.36 | 594 | 2565 | 1.37 | 80.6 | 42 | 87.0 | 90.3 | Red 623 | P1 NYAG7 | XTE 459 | 0.24 | 0.74 | 0.02 | 0.70 | 0.30 | 0.43 | 0.55 | 0.15 | 0.03 | 623 | 569 | 459 | 632 | 541 | 454 |
| 146 | 0.44 | 0.34 | 605 | 2381 | 1.35 | 80.6 | 74 | 83.9 | 99.5 | Red 623 | P1 NYAG7 | XTE 459 | 0.29 | 0.68 | 0.03 | 0.70 | 0.30 | 0.43 | 0.55 | 0.15 | 0.03 | 623 | 569 | 459 | 632 | 541 | 454 |
| 147 | 0.38 | 0.34 | 599 | 3691 | 1.97 | 80.3 | 16 | 90.4 | 99.6 | Red 623 | P1 NYAG7 | XTE 470 | 0.17 | 0.76 | 0.07 | 0.70 | 0.30 | 0.43 | 0.55 | 0.13 | 0.07 | 623 | 569 | 470 | 632 | 541 | 465 |
| 148 | 0.42 | 0.34 | 592 | 2912 | 1.56 | 80.6 | 58 | 87.7 | 93.5 | Red 623 | P1 NYAG7 | XTE 459 | 0.29 | 0.67 | 0.04 | 0.70 | 0.30 | 0.43 | 0.55 | 0.15 | 0.03 | 623 | 569 | 459 | 632 | 541 | 454 |
| 149 | 0.44 | 0.36 | 605 | 2381 | 1.35 | 80.6 | 42 | 81.4 | 92.6 | Strd SPD1 | P1 NYAG7 | XTE 465 | 0.33 | 0.65 | 0.03 | 0.67 | 0.33 | 0.43 | 0.55 | 0.14 | 0.05 | 613 | 569 | 465 | 620 | 541 | 459 |
| 150 | 0.46 | 0.36 | 596 | 2289 | 1.33 | 80.5 | 78 | 87.7 | 81.1 | ORed 619 | P1 NYAG7 | XTE 459 | 0.30 | 0.67 | 0.03 | 0.69 | 0.31 | 0.43 | 0.55 | 0.14 | 0.05 | 619 | 569 | 465 | 627 | 541 | 459 |
| 151 | 0.42 | 0.34 | 604 | 2710 | 1.58 | 80.4 | 62 | 90.3 | 99.9 | ORed 619 | P1 NYAG7 | XTE 465 | 0.26 | 0.70 | 0.04 | 0.69 | 0.31 | 0.43 | 0.55 | 0.14 | 0.05 | 619 | 569 | 465 | 627 | 541 | 459 |

FIG. 12E

| | x | y | u' | v' | nm (dom) | Arb. Units | CCT | CRI Ra | R9 | GAI | CQS | S/P ratio | LPW | du'v' BBL/DLL | duv |
|---|---|---|---|---|---|---|---|---|---|---|---|---|---|---|---|
| LED1 | Orange 606 dm | 0.6668 | 0.3329 | 0.4712 | 0.5292 | 610.4 | 3.48 | | | | | | | | |
| Phosphor | P1LuGaAG 4 | 0.3213 | 0.5561 | 0.1423 | 0.5544 | 551.8 | 1.54 | | | | | | | | |
| LED2 | XPH 450 dm | 0.9000 | 0.1554 | 0.0215 | 0.2109 | 452.1 | 0.9 | | | | | | | | |
| Combined | | 0.3881 | 0.3457 | | | | | 3511 | 80 | 65 | 100 | 90 | 1.88 | 97.8 | 0.024 | -0.017 |

FIG. _13A

| | x | y | u' | v' | nm (dom) | Arb. Units | CCT | CRI Ra | R9 | GAI | CQS | S/P ratio | LPW | du'v' BBL/DLL | duv |
|---|---|---|---|---|---|---|---|---|---|---|---|---|---|---|---|
| LED1 | Ored 617 dm | 0.6836 | 0.3152 | 0.5050 | 0.5238 | 616.9 | 1.2882 | | | | | | | | |
| Phosphor | NYAG7 | 0.4299 | 0.5506 | 0.1966 | 0.5865 | 568.9 | 1.0271 | | | | | | | | |
| LED2 | XPH 455 dm | 0.1531 | 0.0246 | 0.2048 | 0.0741 | 454.5 | 0.4792 | | | | | | | | |
| Combined | | 0.4211 | 0.3713 | 0.2547 | 0.5053 | 588 | | 2999 | 91 | 83 | 83 | 84 | 1.24 | 98.2 | 0.017 | -0.011 |

FIG. _14A

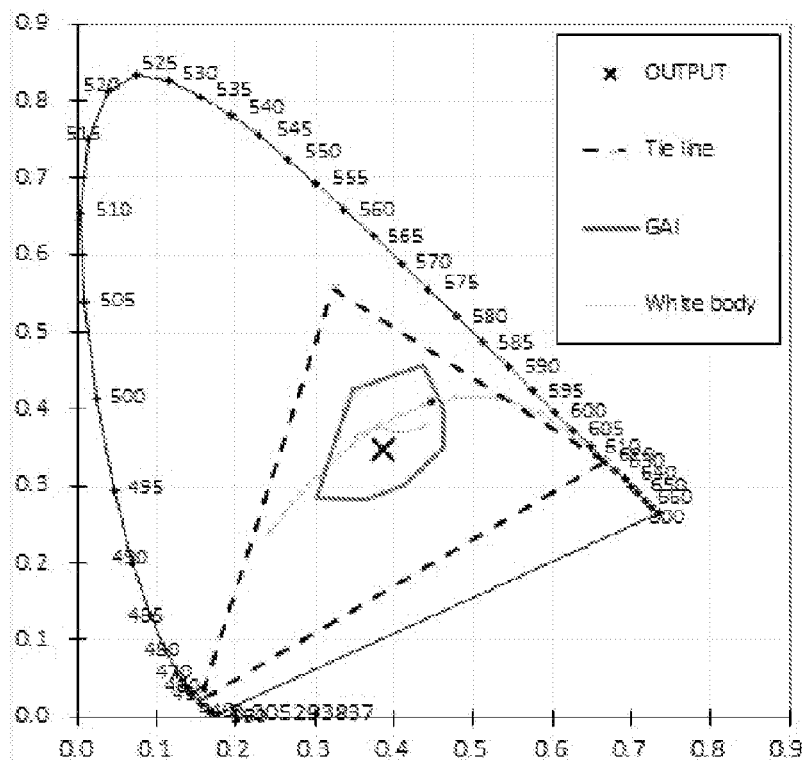
FIG._13B
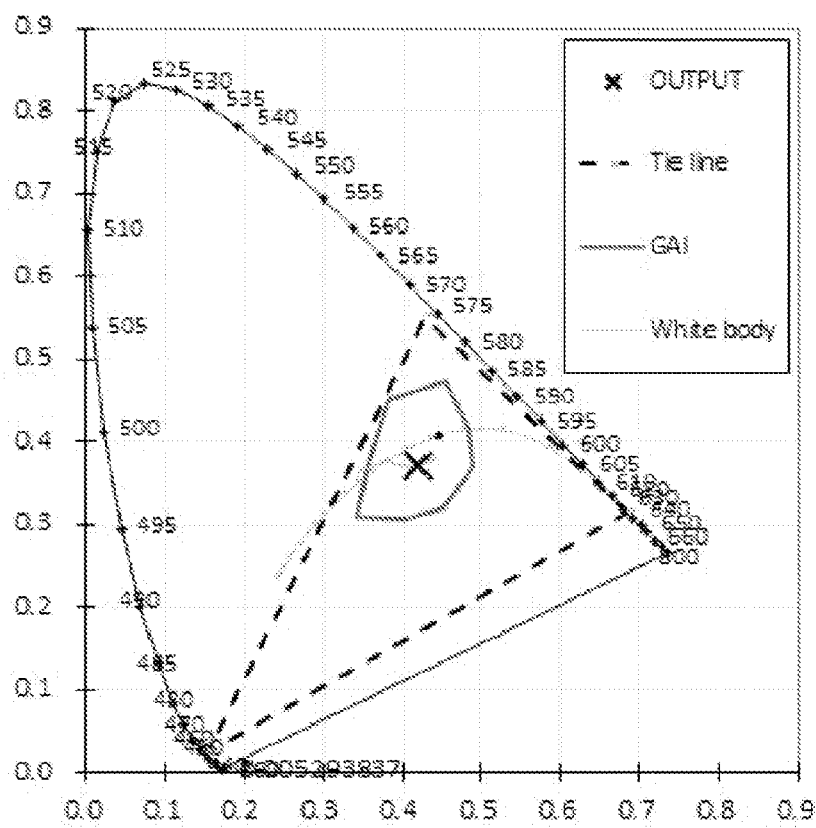
FIG._14B

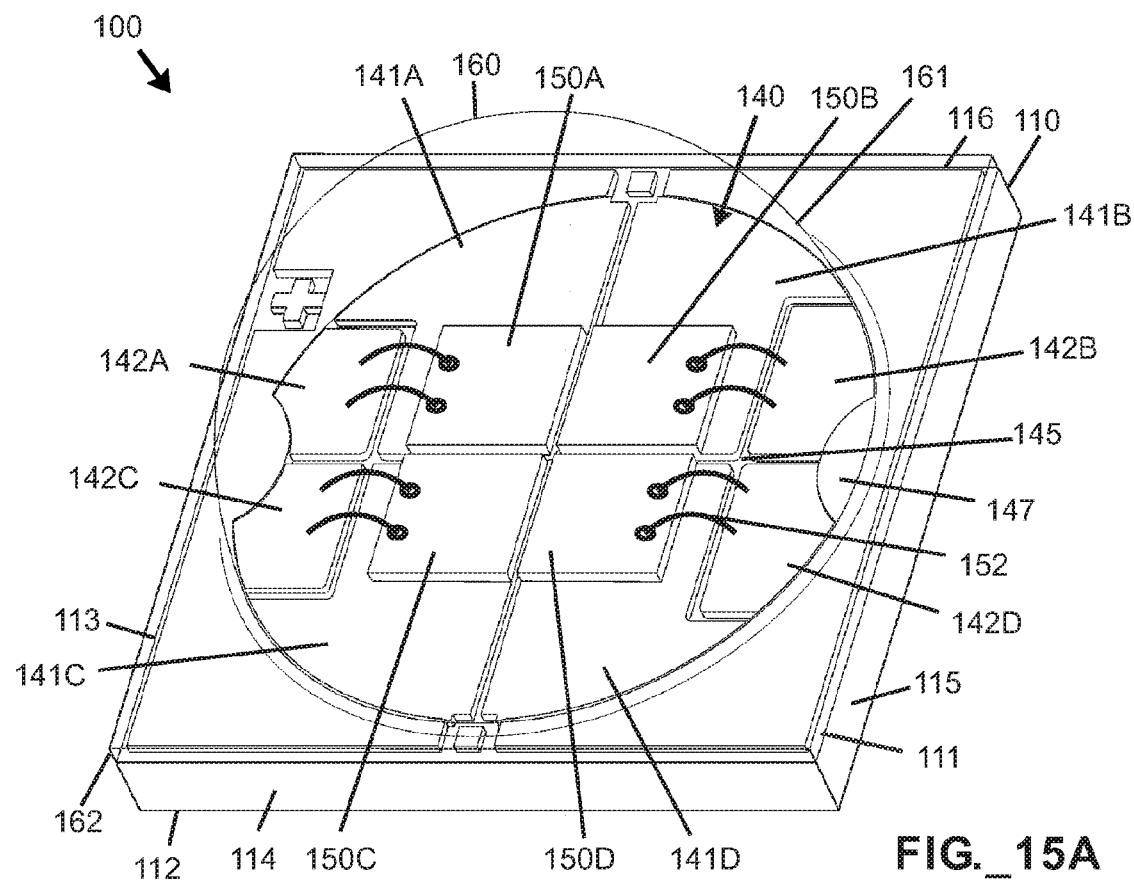
FIG._15A
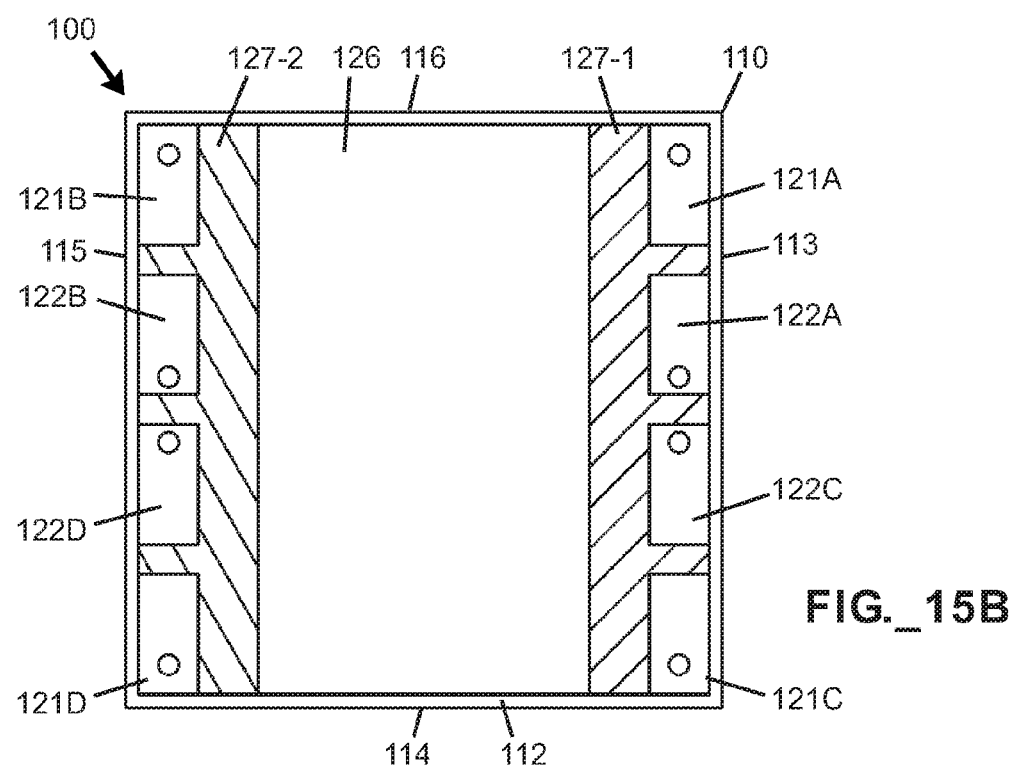
FIG._15B

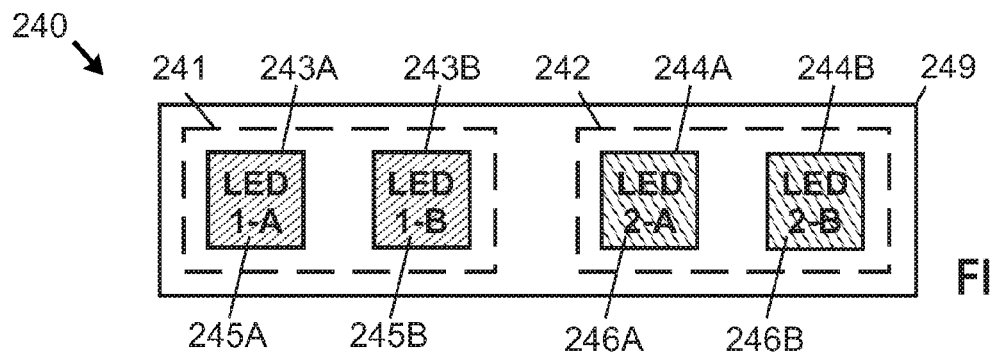
FIG._16E
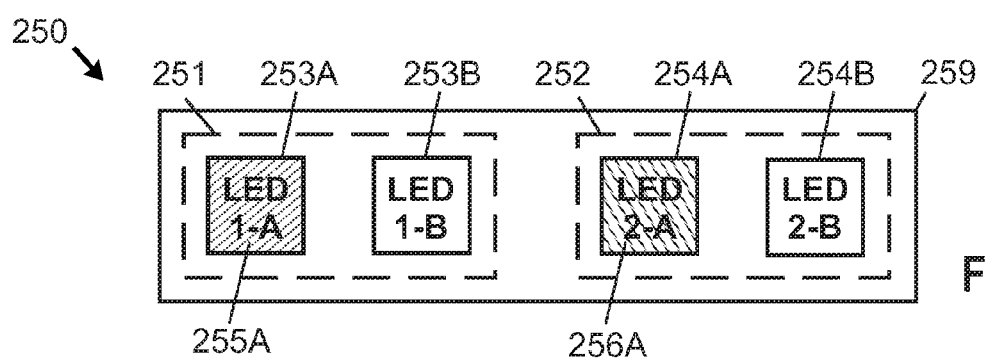
FIG._16F
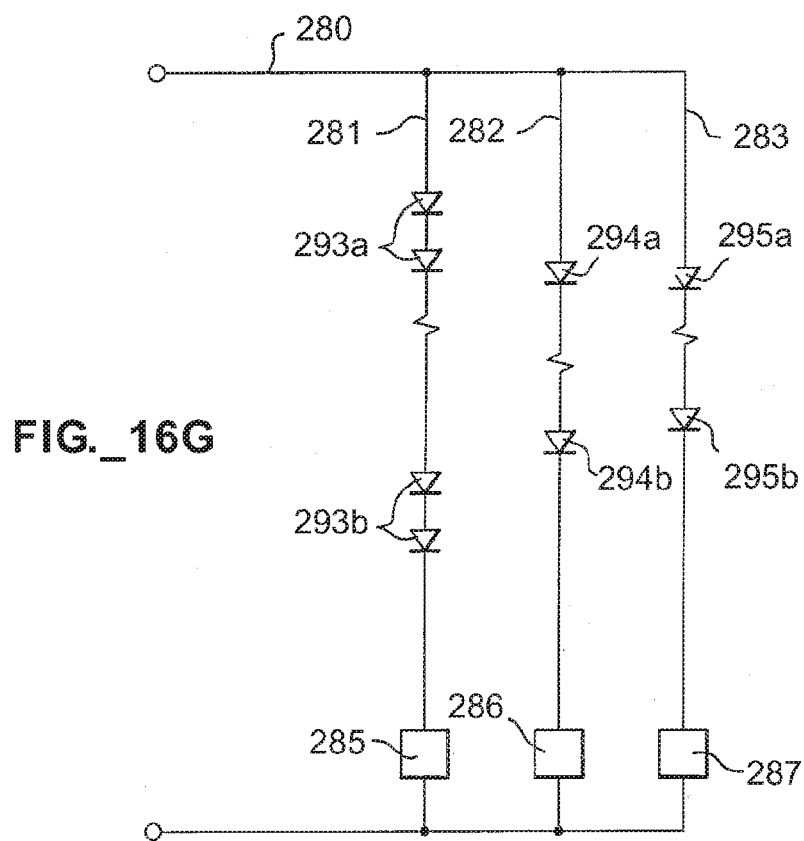
FIG._16G

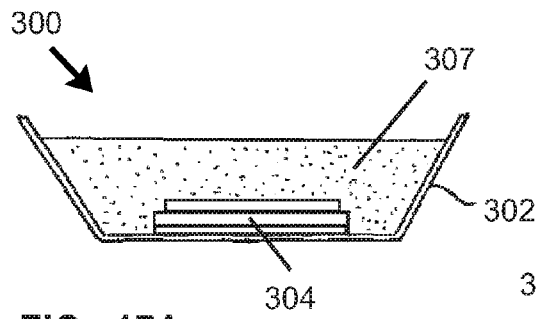
FIG._17A
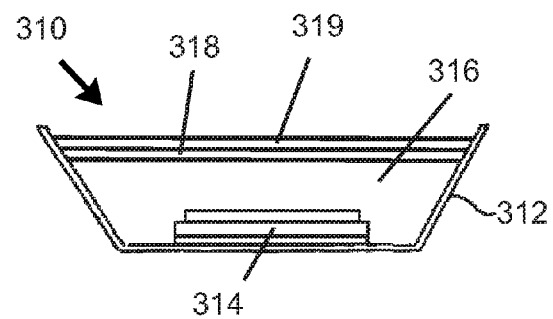
FIG._17B
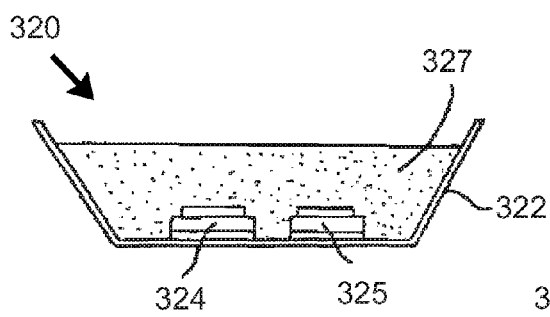
FIG._17C
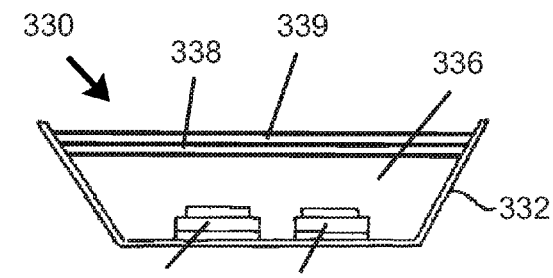
FIG._17D
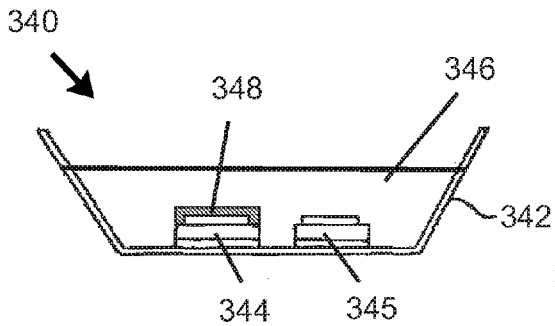
FIG._17E
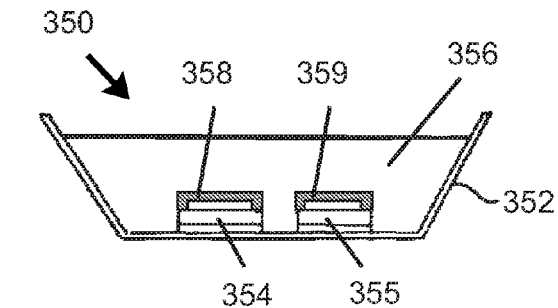
FIG._17F

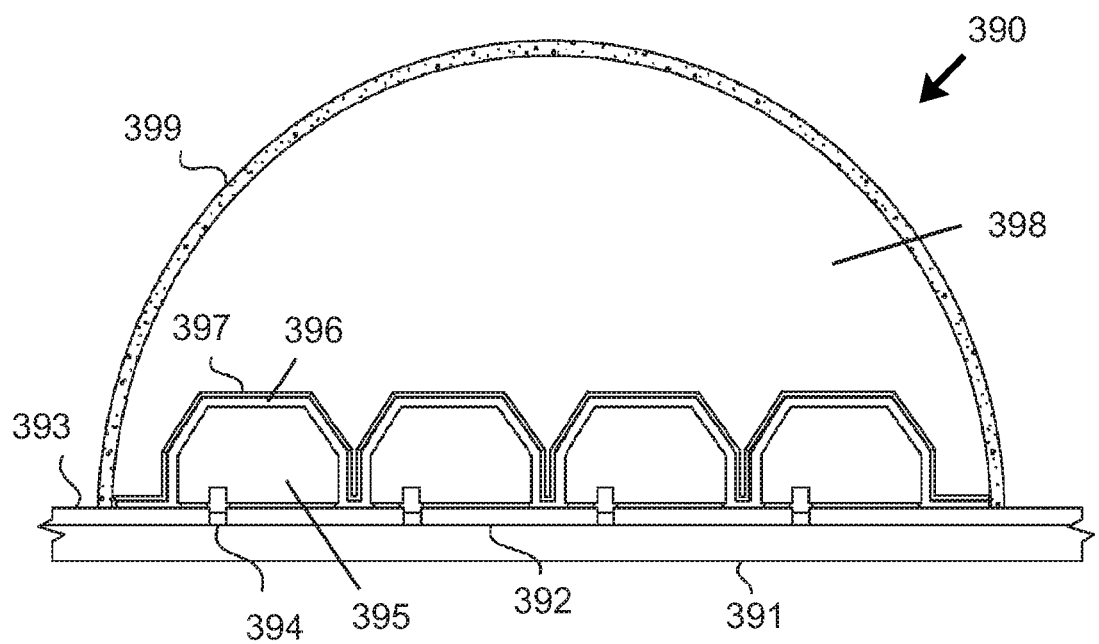
FIG._19
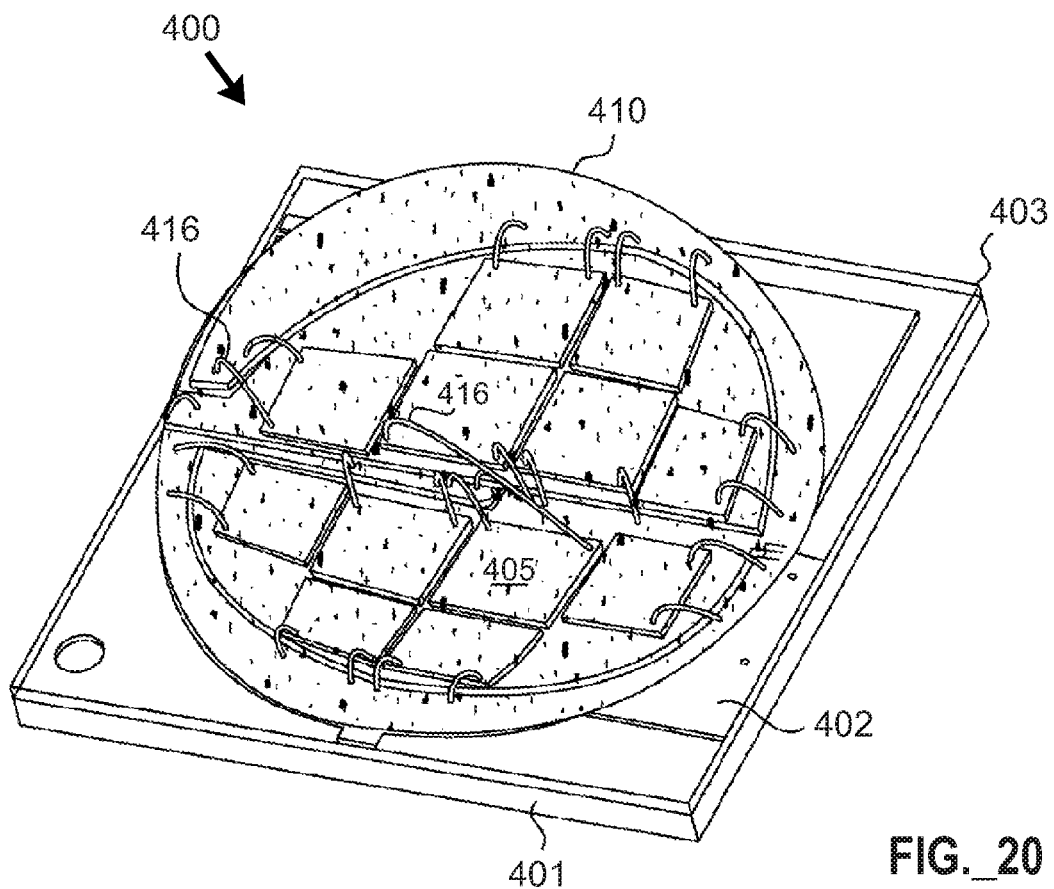
FIG._20

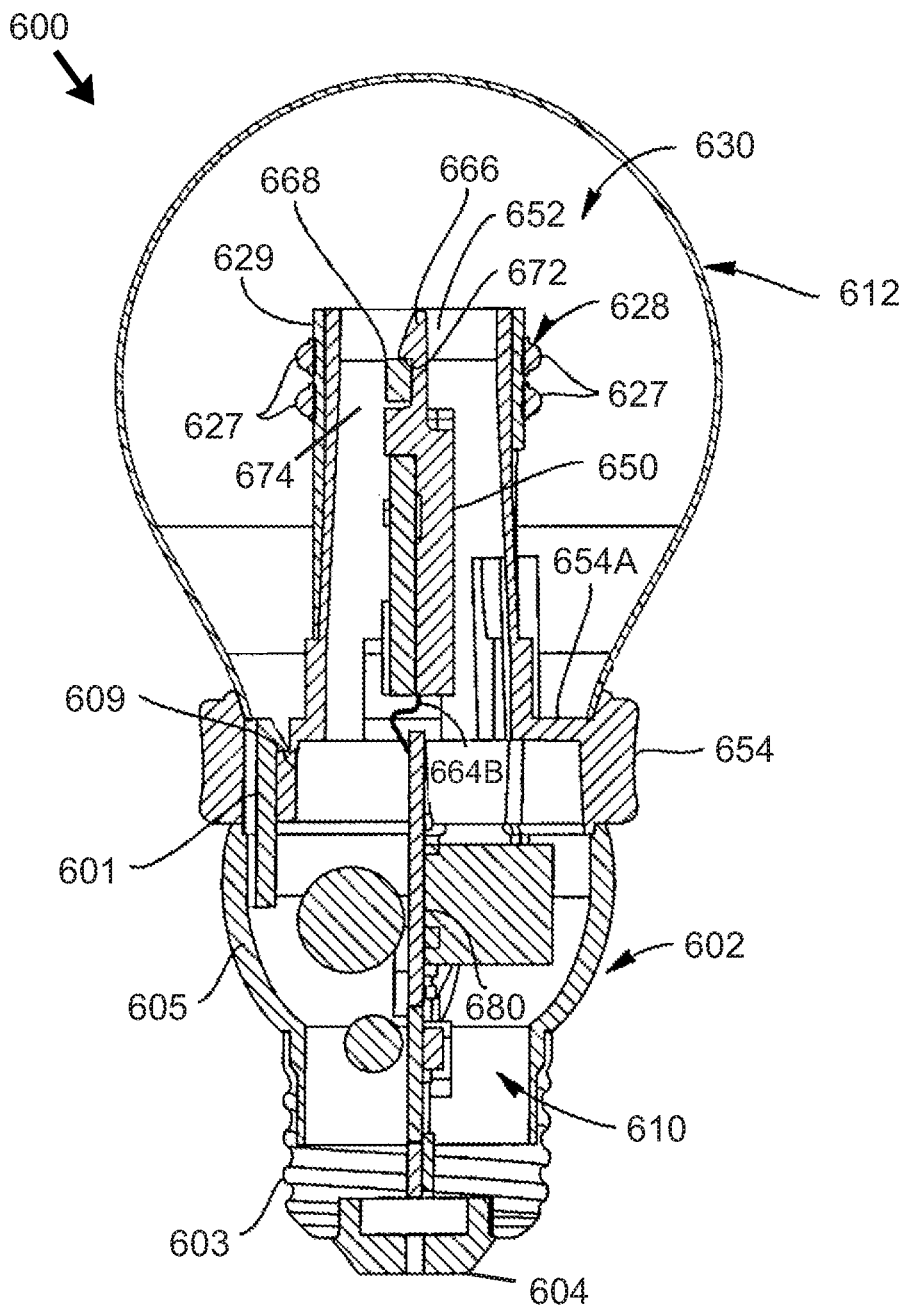
FIG._23

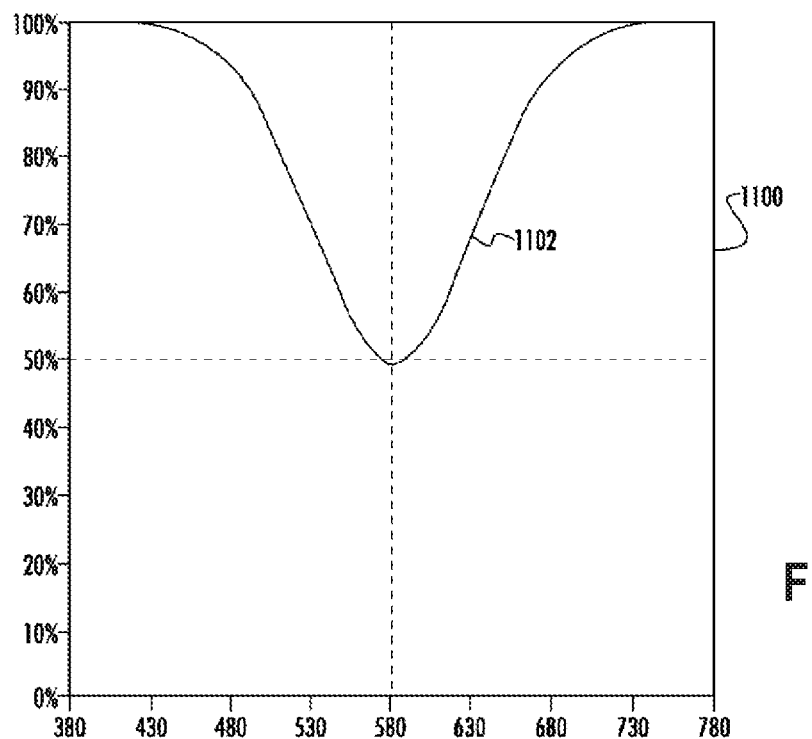
FIG._27
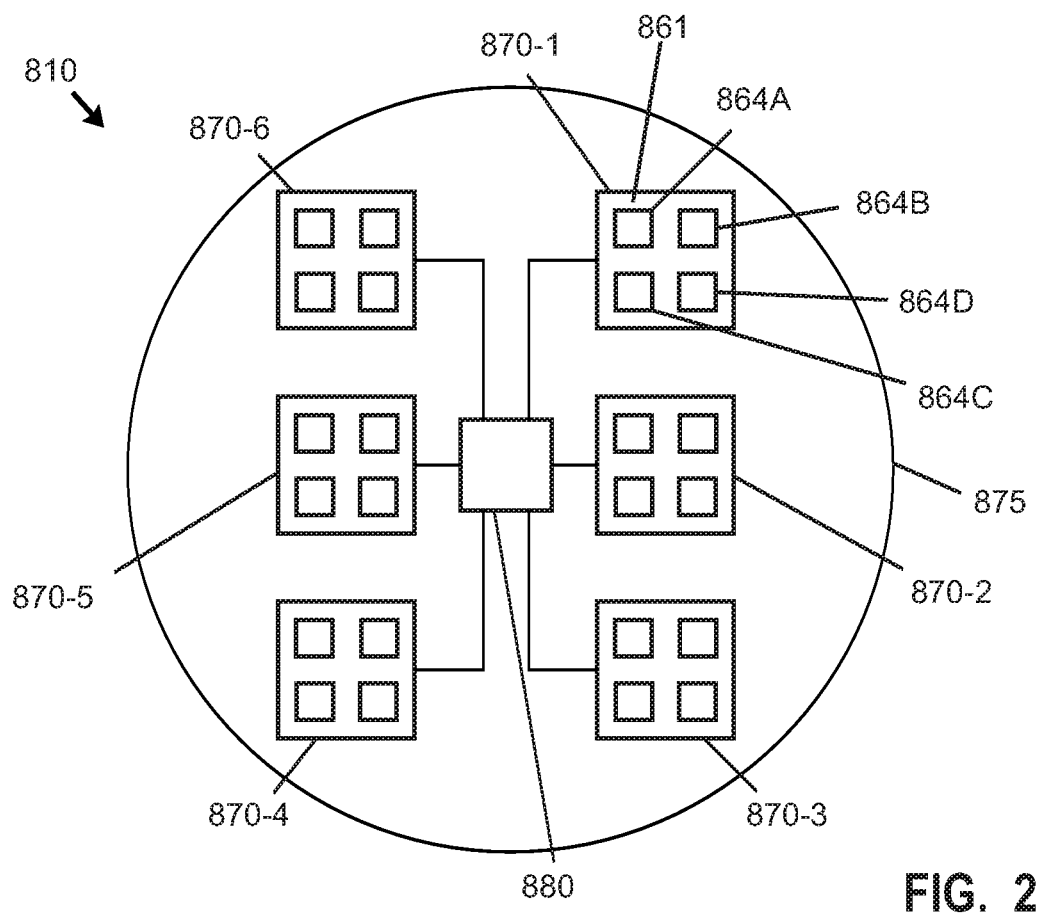
FIG._25

US 9,215,761 B2

SOLID STATE LIGHTING DEVICES WITH COLOR POINT NON-COINCIDENT WITH BLACKBODY LOCUS

TECHNICAL FIELD

Subject matter herein relates to solid state lighting devices, including (but not limited to) devices with lumiphors arranged to be stimulated by electrically activated solid light emitters, and relates to associated methods of making and using such devices.

BACKGROUND

Solid state emitters such as LEDs or lasers may be used to provide white light (e.g., perceived as being white or near-white), and have been investigated as potential replacements for white incandescent lamps. Solid state emitters may include lumiphoric materials (also known as lumiphors) that absorb a portion of emissions having a first peak wavelength emitted by the emitter and re-emit light having a second peak wavelength that differs from the first peak wavelength. Phosphors, scintillators, and lumiphoric inks are common lumiphoric materials. Light perceived as white or near-white may be generated by a combination of red, green, and blue ("RGB") emitters, or, alternatively, by combined emissions of a blue light emitting diode ("LED") and a lumiphor such as a yellow phosphor (e.g., YAG:Ce or Ce:YAG). In the latter case, a portion of the blue LED emissions pass through the phosphor, while another portion of the blue emissions is downconverted to yellow, and the blue and yellow light in combination are perceived as white. White light may also be produced by stimulating phosphors or dyes of multiple colors with a violet or UV LED source.

It is known to enclose an LED chip in a package to provide environmental and/or mechanical protection, color selection, light focusing and other functions. A LED package also includes electrical leads, contacts, and/or traces for electrically connecting the LED package to an external circuit. A conventional LED package 20 is illustrated in FIG. 1, including one or more LED chips 22 mounted over a carrier such as a printed circuit board (PCB) carrier, substrate or submount 23, which may include ceramic material. The package 20 may include one or more LED chips 22 of any suitable spectral output (e.g., ultraviolet, blue, green, red, white (e.g., blue LED chip arranged to stimulate emissions of phosphor material) and/or other colors). A reflector 24 may be mounted on the submount 23 (e.g., with solder or epoxy) to surround the LED chip(s) 22, reflect light emitted by the LED chips 22 away from the package 20, and also provide mechanical protection to the LED chips 22. One or more wirebond connections 21 may be made between ohmic contacts on the LED chips 22 and electrical traces 25A, 25B on the submount 23. The LED chips 22 are covered with a transparent encapsulant 26, which may provide environmental and mechanical protection to the chips while also acting as a lens.

Emissions of a blue LED in combination with a yellow or green lumiphoric material may be near-white in character and referred to as "blue-shifted yellow" ("BSY") light or "blue-shifted green" ("BSG") light. Addition of red spectral output from a red-emitting LED (to yield a "BSY+R" device) or from a red lumiphoric material (to yield a "BS(Y+R)" device) may be used to increase the warmth of the aggregated light output and better approximate light produced by incandescent lamps.

Quality artificial lighting generally attempts to emulate the characteristics of natural light. Natural light sources include daylight with a relatively high color temperature (e.g., ~5000K) and incandescent lamps with a lower color temperature (e.g., ~2800K).

Color reproduction is commonly measured using Color Rendering Index (CRI) or average Color Rendering Index (CRI Ra). To calculate CRI, the color appearance of 14 reflective samples is simulated when illuminated by a reference radiator (illuminant) and the test source. The general or average color rendering index CRI Ra is a modified average utilizing the first eight indices, all of which have low to moderate chromatic saturation. (R9 is one of six saturated test colors not used in calculating CRI, with R9 embodying a large red content.) CRI and CRI Ra are used to determine how closely an artificial light source matches the color rendering of a natural light source at the same correlated color temperature. Daylight has a high CRI Ra (approximately 100), with incandescent bulbs also being relatively close (CRI Ra greater than 95), and fluorescent lighting being less accurate (with typical CRI Ra values of approximately 70-80).

CRI Ra (or CRI) alone is not a satisfactory measure of the benefit of a light source, since it confers little ability to predict color discrimination (i.e., to perceive subtle difference in hue) or color preference. There appears to be a natural human attraction to brighter color. Daylight provides a spectrum of light that allows the human eye to perceive bright and vivid colors, which allows objects to be distinguished even with subtle color shade differences. Accordingly, it is generally recognized that daylight is the "best" light for emphasizing and distinguishing color. The ability of human vision to differentiate color is different under correlated color temperature conditions providing the same CRI Ra. Such differentiation is proportional to the gamut of the illuminating light.

Gamut area of a light source can be calculated as the area enclosed within a polygon defined by the chromaticities in CIE 1976 u'v' color space of the eight color chips used to calculate CRI Ra when illuminated by a test light source. Gamut area index (GAI) is a convenient way of characterizing in chromaticity space how saturated the illumination makes objects appear—with a larger GAI making object colors appear more saturated. GAI is a relative number whereby an imaginary equal-energy spectrum (wherein radiant power is equal at all wavelengths) is scored as 100. GAI for a test source is determined by comparing color space area of the light being tested to the color space area produced by the imaginary or theoretical equal-energy spectrum (EES) source. Unlike CRI Ra (or CRI), which has a maximum value of 100, GAI can exceed 100, meaning that some sources saturate colors more than an equal-energy source serves to saturate color.

It is found that typical blackbody-like light sources and typical daylight-like light sources have different gamut areas. Low correlated color temperature (CCT) sources (e.g., incandescent emitters) have a gamut area index of approximately 50% (i.e., about half the gamut area of the EES source). Sources with higher CCT values have a larger GAI. For example, a very bluish light with a CCT of 10000K may have a GAI of 140%.

The reference spectra used in color rendering index calculations were chosen as ideal illumination sources defined in terms of their color temperature. As a heated object becomes incandescent, it first glows reddish, then yellowish, then white, and finally bluish. Thus, apparent colors of incandescing materials are directly related to their actual temperature (in Kelvin (K)). Practical materials that incandesce are said to have correlated color temperature (CCT) values that are directly related to color temperatures of blackbody sources. CCT is intended to characterize the apparent "tint" of the illumination (e.g., warm or cool) produced by an electric light source. Certain implicit assumptions are embedded in this CCT designation—such as the assumption that chromaticities along the line of blackbody radiation are perceived as 'white', and that a CCT designation for a manufactured light source implies consistency in chromaticities of all sources having that designation. Recent research suggests, however, that most sources with chromaticities along the line of blackbody radiation do not appear "white"; rather, such sources provide illumination with discernible tint. An empirically established line of minimum tint in CIE 1931 (x,y) chromaticity space for CCTs between 2700K and 6500K is shown in FIG. 2 Researchers have determined that a majority of people prefer sources of illumination on this "white body line" (i.e., line of minimum tint) more than those of the same CCT line of blackbody radiation. (See, e.g., Rea, M. S. and Freyssinier, J. P.: White lighting for residential applications, Light Res. Tech., 45(3), pp. 331-344 (2013).) As shown in FIG. 2, at CCT values below about 4000K, the "white body line" (WBL) is below the blackbody curve, whereas at higher CCT values, the WBL is above the blackbody curve.

Rea and Freyssinier have proposed that lighting could be generally improved by ensuring that its CRI Ra value is at least 80 while its GAI is in a range of from 80 to 100 (i.e., from 80% to 100% of an equal energy spectrum).

Characteristics including CCT, CRI Ra, GAI, CIE 1931 (x,y) coordinates, luminous efficacy (lm/W), and scotopic/photopic (S/P) ratios for eighteen different light sources are tabulated in FIG. 3A, and chromaticities for selected sources of the foregoing eighteen light sources are plotted in FIG. 3B together with the blackbody curve and the WBL (line of minimum tint). (Source: "Value Metrics for Better Lighting," Rea, Mark S., et al., 2013, pp. 54 & 63, SPIE Press (Bellingham, Wash., US), ISBN 978-0-8194-9322-4.) As indicated in FIG. 3A, the ability of artificial lights to accurately illuminate color objects varies enormously by type. Solid state emitters such as LEDs in combination with lumiphors create white light by mixing relatively narrow wavelength bands together with spectral gaps between peaks of LEDs and/or lumiphors. The resulting light may be under-saturated with certain colors of the spectrum or oversaturated with certain colors. One way to alleviate oversaturation with respect to certain portions of the visible spectrum and thereby improve CRI includes notch filtering of LED lighting systems with an optical element (e.g., incorporating a rare earth compound such as neodymium oxide, or a color pigment) that filters light emissions so that light passing through or reflected by the optical element exhibits a spectral notch, as disclosed in U.S. Patent Application Publication No. 2013/0170199 A2 entitled "LED lighting using spectral notching" (which is hereby incorporated by reference herein). Such publication discloses that CRI and GAI values of LED light sources can be improved through use of notch filtering, such as to increase CRI from 84 to 90, and to increase GAI from 50 to 58. Alternatively, careful selection of materials used in LED lighting devices may permit attainment of CRI Ra values of 90 to 95 or more—see, e.g., U.S. Pat. No. 7,213,940, which is hereby incorporated by reference.

The art continues to seek improved solid state lighting devices providing desirable illumination characteristics, as well as improved methods for making solid state devices.

SUMMARY

The present disclosure relates in various aspects to solid state (e.g., LED) lighting devices including at least one electrically activated solid state light emitter and at least one lumiphor (or multiple electrically activated emitters optionally devoid of a lumiphor), with resulting emissions arranged to attain a color point in a desired CCT range (e.g., from 2,500K to 10,000K, from 2,500K to 4,000K, from 4,100K to 10,000K, from 2,700K to 5,000K, or other range) and that is non-coincident with a blackbody locus (also referred to as a Planckian locus). The resulting color point preferably has a negative Planckian offset Delta u'v' value according to a CIE 1976 chromaticity diagram (such as the diagram of FIG. 4), such as a value in a range of no greater than negative 0.01, in a range of no greater than negative 0.015, in a range of no greater than negative 0.02, in a range of negative 0.01 to negative 0.03, in a range of negative 0.01 to negative 0.02, or another range disclosed herein. In certain aspects, multiple different electrically activated solid state light emitters may be used, or multiple different electrically activated solid state light emitters wherein one is arranged to stimulate lumiphor emissions (but in the absence of any lumiphor-converted blue electrically activated emitter) may be used, or multiple lumiphor-converted electrically activated solid state emitters may be used, to attain a CIE 1976 color point in a desired CCT range (e.g., from 2,500K to 10,000K, or another desired range disclosed herein) and having a Planckian offset Delta u'v' value in a range of no greater than negative 0.01 (or in another desired range disclosed herein). In certain aspects, multiple different electrically activated solid state light emitters, wherein one is arranged to stimulate lumiphor emissions, may be used to attain a CIE 1976 color point in a desired CCT range (e.g., from 2,500K to 10,000K, or another range disclosed herein) and having a Planckian offset Delta u'v' value in a range of no greater than negative 0.01 (or in another desired range disclosed herein), wherein the mixture of light has a GAI value of at least 50 and a CRI Ra value of at least 50. In certain aspects, a lumiphor converted electrically activated solid state light emitter may be used in conjunction with a notch filtering material to attain a CIE 1976 color point in a desired CCT range (e.g., from 2,500K to 10,000K, or another range disclosed herein) and having a Planckian offset Delta u'v' value in a range of no greater than negative 0.01 (or in another desired range disclosed herein). In certain aspects, at least one lumiphor-converted solid state light emitter may be used to attain a CIE 1976 color point in a desired CCT range (e.g., from 2,500K to 10,000K, or another desired range disclosed herein) and having a Planckian offset Delta u'v' value in a range of no greater than negative 0.01 (or in another range disclosed herein) with the mixture of light having a luminous efficacy of at least 60 lumens per watt.

In one aspect, a lighting device comprises at least one primary solid state light emitter arranged to emit primary solid state light emitter emissions comprising a dominant wavelength in a range of from 430 nm to 480 nm; a lumiphor arranged to receive and be excited by at least a portion of emissions of the at least one primary solid state light emitter, and emit lumiphor emissions comprising a dominant wavelength in a range of from about 535 nm to about 585 nm; at least one supplemental solid state light emitter arranged to generate supplemental solid state light emitter emissions comprising a dominant wavelength in a range of from 590 nm to 630 nm; and wherein a combination of (A) light exiting the lighting device that was emitted by the at least one primary solid state light emitter, (B) light exiting the lighting device that was emitted by the lumiphor, and (C) light exiting the lighting device that was emitted by the at least one supplemental solid state light emitter would, in the absence of any additional light, produce a mixture of light having a color point defined on a CIE 1976 u'-v' chromaticity diagram by a correlated color temperature value in a range of from 2,500K to 10,000K (or another desired range disclosed herein) and by a Planckian offset Delta u'v' value in a range of no greater than negative 0.01 (or another desired range disclosed herein); and wherein the lighting device is devoid of any electrically activated solid state light emitter arranged to generate emissions (i) having dominant wavelength in a range of from 430 nm to 480 nm and (ii) exiting the lighting device without passage through a layer or region comprising a lumiphoric material.

In another aspect, a lighting device comprises at least one first electrically activated solid state light emitter having a first dominant wavelength, wherein the at least one first electrically activated solid state light emitter is arranged to produce light having a color point defined on a CIE 1976 u'-v' chromaticity diagram by a correlated color temperature value in a range of from 2,500K to 10,000K (or another desired range disclosed herein) and by a Planckian offset Delta u'v' value in a range of at least 0.007; at least one second electrically activated solid state light emitter having a second dominant wavelength, wherein the at least one second electrically activated solid state light emitter is arranged to produce light having a color point defined on a CIE 1976 u'-v' chromaticity diagram by a correlated color temperature value in a range of from 2,500K to 10,000K (or another desired range disclosed herein) and by a Planckian offset Delta u'v' value in a range of no greater than negative 0.012; and wherein a combination of (A) light exiting the lighting device that was emitted by the at least one first electrically activated solid state light emitter and (B) light exiting the lighting device that was emitted by the at least one second electrically activated solid state light emitter would, in the absence of any additional light, produce a mixture of light having a color point defined on a CIE 1976 u'-v' chromaticity diagram by a correlated color temperature in a range of from 2,500K to 10,000K (or another desired range disclosed herein) and a Planckian offset Delta u'v' value of no greater than negative 0.01 (or another desired range disclosed herein).

In another aspect, a lighting device comprises at least one electrically activated solid state light emitter; a first lumiphor arranged to receive and be excited by at least a portion of emissions of the at least one electrically activated solid state light emitter, and responsively emit first lumiphor emissions; a second lumiphor arranged to receive and be excited by at least a portion of emissions of the at least one electrically activated solid state light emitter, and responsively emit second lumiphor emissions; wherein a combination of (A) light exiting the lighting device that was emitted by the at least one electrically activated solid state light emitter, (B) light exiting the lighting device that was emitted by the first lumiphor, and (C) light exiting the lighting device that was emitted by the second lumiphor would, in the absence of any additional light, produce a mixture of light having a color point defined on a CIE 1976 u'-v' chromaticity diagram by a correlated color temperature value in a range of from 2,500K to 10,000K (or another desired range disclosed herein) and a Planckian offset Delta u'v' value in a range of no greater than negative 0.01 (or another desired range disclosed herein).

In another aspect, a lighting device comprises a first electrically activated solid state light emitter; a second electrically activated solid state light emitter; a lumiphor arranged to receive and be excited by at least a portion of emissions of at least one of the first and the second electrically activated solid state light emitter, and responsively emit lumiphor emissions; wherein a combination of (A) light exiting the lighting device that was emitted by the first electrically activated solid state light emitter, (B) light exiting the lighting device that was emitted by the second electrically activated solid state light emitter, and (C) light exiting the lighting device that was emitted by the lumiphor would, in the absence of any additional light, produce a mixture of light having a color point defined on a CIE 1976 u'-v' chromaticity diagram by a correlated color temperature in a range of from 2,500K to 10,000K (or another desired range disclosed herein) and by a Planckian offset Delta u'v' value of no greater than negative 0.01 (or another desired range disclosed herein); and wherein the mixture of light has a gamut area index (GAI) value of at least 50 and a color rendering index (CRI Ra) value of at least 50 (or other desired GAI and/or CRI Ra ranges disclosed herein). CRI Ra values at the lower end of such range may be suitable for outdoor illumination including roadways, parking areas, and the like. In In another aspect, a lighting device comprises at least one electrically activated solid state light emitter; at least one lumiphor arranged to receive and be excited by at least a portion of emissions of the at least one electrically activated solid state light emitter, and emit lumiphor emissions; and a notch filtering material arranged in a light path between (i) the at least one lumiphor and (ii) at least one light output surface of the lighting device, wherein the notch filtering material is arranged to receive at least a portion of the lumiphor emissions and filter the received lumiphor emissions to exhibit a spectral notch; wherein a combination of (A) light exiting the lighting device that was emitted by the at least one electrically activated solid state light emitter, and (B) light exiting the lighting device that was emitted by the at least one lumiphor would, in the absence of any additional light, produce a mixture of light having a color point defined on a CIE 1976 u'-v' chromaticity diagram by a correlated color temperature in a range of from 2,500K to 10,000K (or another desired range disclosed herein) and by a Planckian offset Delta u'v' value of no greater than negative 0.01 (or another desired range disclosed herein).

In another aspect, a lighting device comprises at least one electrically activated solid state light emitter; a lumiphor arranged to receive and be excited by at least a portion of emissions of at least one electrically activated solid state light emitter, and responsively emit lumiphor emissions; wherein a combination of (A) light exiting the lighting device that was emitted by the at least one electrically activated solid state light emitter and (B) light exiting the lighting device that was emitted by the lumiphor would, in the absence of any additional light, produce a mixture of light having a color point defined on a CIE 1976 u'-v' chromaticity diagram by a correlated color temperature in a range of from 2,500K to 10,000K (or another desired range disclosed herein) and by a Planckian offset Delta u'v' value of no greater than negative 0.01 (or another desired range disclosed herein); and wherein the mixture of light has a luminous efficacy of at least 60 lumens per watt (or another desired range disclosed herein).

In another aspect, the present disclosure relates to a method comprising illuminating an object, a space, or an environment, utilizing a solid state lighting device as described herein.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Other aspects, features and embodiments of the present disclosure will be more fully apparent from the ensuing disclosure and appended claims.

BRIEF DESCRIPTION OF THE DRAWINGS

FIG. 1 is a side cross-sectional view of a first conventional light emitting diode package.

FIG. 2 is an excerpt of a CIE 1931 chromaticity diagram showing the blackbody locus and including a line of minimum tint (or "white body line") extending between CCT values of from 2700K to 6500K.

FIG. 3A is a chart including CCT, CRI Ra, GAI, CIE 1931 (x,y) coordinates, luminous efficacy (lm/W), and scotopic/photopic (S/P) ratios for eighteen different light sources.

FIG. 3B is an excerpt of a CIE 1931 chromaticity diagram showing the blackbody locus, the line of minimum tint (or "white body line") extending between CCT values from 2700K to 6500K, and (x,y) coordinate plots for selected sources of the eighteen light sources listed in FIG. 3A.

FIG. 4 embodies a black and white CIE 1976 (u'v') chromaticity diagram as modified to include segments or regions with identification of respective colors.

FIG. 9 is an excerpt of a CIE 1976 chromaticity diagram illustrating the blackbody or Planckian locus (BBL) and another region embodying color points to be output by a lighting device as disclosed herein, with the region defined by a CCT value in a range of from 2,500K to 10,000K and by a Planckian offset Delta u'v' value in a range of from negative 0.01 to negative 0.02.

FIG. 10 is an excerpt of a CIE 1976 chromaticity diagram illustrating the blackbody or Planckian locus (BBL), one zone above the BBL including color points to be generated by one or more first emitters of a lighting device disclosed herein, and another zone below the BBL including color points to be generated by one or more second emitters of a lighting device disclosed herein, wherein the aggregate emitters of the lighting device may embody a color point within one of the regions illustrated in FIGS. 5-9 or otherwise described herein.

FIG. 11 is an excerpt of a CIE 1976 chromaticity diagram illustrating the blackbody or Planckian locus (BBL), one zone above the BBL including color points to be generated by one or more first emitters of a lighting device disclosed herein, and another zone below the BBL including color points to be generated by one or more second emitters of a lighting device disclosed herein, wherein the aggregate emitters of the lighting device may embody a color point within one of the regions illustrated in FIGS. 5-9 or otherwise described herein.

FIGS. 12A-12E in combination embody a table providing numerical results for modeling of 151 solid state lighting devices each including an orange or red LED (source 1a), a yellow or yellow/green phosphor (source 2a), and a blue LED (source 3a), including device number, CIE 1931 x,y coordinates of combined emissions, dominant LED wavelength (dm), correlated color temperature (cct), S/P ratio, CRI Ra, R9 color rendering, color quality scale (CQS), gamut area index (GAI), source identifiers, lumen percentage for each individual source, CIE 1931 x,y coordinates for each individual source, dominant wavelength (dm) for each individual source, and peak wavelength (pk) for each individual source.

FIG. 13A is a table including numerical results for modeling of a solid state lighting device including an orange (606 nm dominant wavelength) LED, a blue (450 nm dominant wavelength) LED, and a green phosphor (P1LuGaAg 4 with 551.8 nm dominant wavelength), yielding composite emissions with a CCT of 3511K, a CRI Ra value of 80, and a GAI value of 100.

FIG. 13B is an excerpt of a CIE 1931 chromaticity diagram showing the blackbody locus, a portion of the line of minimum tint (or white body line), and the following items for the LEDs and phosphor of FIG. 13A: tie lines, gamut area, and composite color point.

FIG. 14A is a table including numerical results for modeling of a solid state lighting device including an orange-red (617 nm dominant wavelength) LED, a blue (455 nm dominant wavelength) LED, and a yellow-green phosphor (NYAG 7 with 568.9 nm dominant wavelength), yielding composite emissions with a CCT of 2999K, a CRI Ra value of 91, and a GAI value of 83.

FIG. 14B is an excerpt of a CIE 1931 chromaticity diagram showing the blackbody locus, a portion of the line of minimum tint (or white body line), and the following items for the LEDs and phosphor of FIG. 14A: tie lines, gamut area, and composite color point.

FIG. 15A is a top perspective view of a solid state emitter package including four solid state emitter chips arranged over a substrate, covered with a hemispherical lens, and connected to electrical traces via wirebonds.

FIG. 15B is a bottom plan view of the solid state emitter package of FIG. 15A including four anodes and four cathodes arranged along opposing sides of a substrate, and including a thermally conductive contact pad arranged between the anodes and cathodes.

FIG. 16E is a schematic view of a fifth lighting device including a first pair of solid state emitters arranged in a first mounting region and another pair of solid state emitters arranged in a second mounting region, all arranged on a single submount or substrate.

FIG. 16F is a schematic view of a sixth lighting device including a first pair of solid state emitters arranged in a first mounting region and another pair of solid state emitters arranged in a second mounting region, all arranged on a single submount or substrate.

FIG. 16G illustrates a portion of a first control circuit arranged to control multiple strings of solid state emitters (e.g., LEDs).

FIG. 17A is a side cross-sectional schematic view of a portion of a solid state lighting device including an electrically activated solid state light emitter (e.g., LED) and at least one lumiphor dispersed in an encapsulant material disposed over the solid state light emitter.

FIG. 17B is a side cross-sectional schematic view of a portion of a solid state lighting device including an electrically activated solid state light emitter (e.g., LED) and at least one lumiphor arranged in one or more layers spatially separated from the solid state light emitter.

FIG. 17C is a side cross-sectional schematic view of a portion of a solid state lighting device including multiple electrically activated solid state light emitters (e.g., LEDs) and at least one lumiphor dispersed in an encapsulant material disposed over the multiple solid state light emitters.

FIG. 17D is a side cross-sectional schematic view of a portion of a solid state lighting device including multiple solid state light emitters (e.g., LEDs) and at least one lumiphor arranged in one or more layers spatially separated from the multiple solid state light emitters.

FIG. 17E is a side cross-sectional schematic view of a portion of a solid state lighting device including multiple solid state light emitters (e.g., LEDs), with at least one solid state light emitter having a lumiphor material individually applied or coated over at least one surface of the solid state light emitter.

FIG. 17F is a side cross-sectional schematic view of a portion of a solid state lighting device including multiple solid state light emitters (e.g., LEDs), with multiple solid state light emitters each having a lumiphor material individually applied or coated over at least one surface of the respective emitter.

FIG. 19 is a side cross-sectional view of at least a portion of a solid state lighting emitting device including multiple solid state emitter chips coated with multiple functional materials and arranged under a hemispherical optical element.

FIG. 20 is a perspective view of at least a portion of a solid state emitter package including multiple solid state emitter chips coated with one or more functional materials, with the chips coupled to electrical traces via wirebonds and arranged under a hemispherical optical element.

FIG. 23 is a side cross-sectional view of a third light bulb arranged to incorporate multiple solid state emitter chips as disclosed herein in a tower-type configuration.

FIG. 25 is a simplified plan view of a light emitting apparatus including multiple LED components and at least one control circuit.

FIG. 27 depicts spectral transmittance versus wavelength for an illustrative color pigment material.

DETAILED DESCRIPTION

Figure 5:
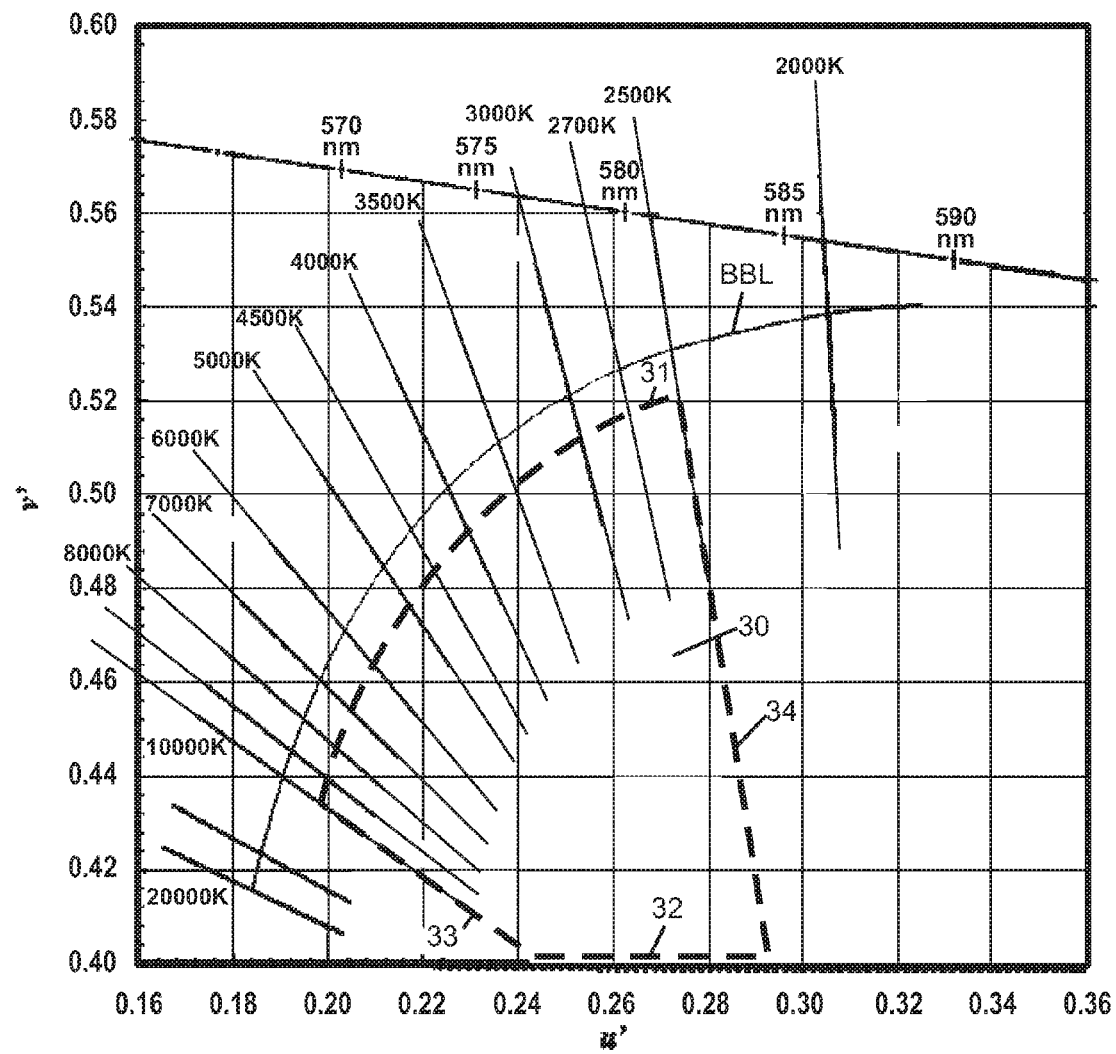
FIG. 5 is an excerpt of a CIE 1976 chromaticity diagram illustrating the blackbody or Planckian locus (BBL) and a region embodying color points to be output by a lighting device as disclosed herein, with the region defined by a CCT value in a range of from 2,500K to 10,000K and by a Planckian offset Delta u'v' value in a range of no greater than negative 0.01.

As noted previously, the art continues to seek solid state lighting devices providing desirable illumination characteristics. Subject matter disclosed herein departs from the general attempts of prior art lighting devices to emulate characteristics of natural light sources such as daylight and incandescent lamps, which generally provide color points along the blackbody locus (also known as the blackbody locus).

Various embodiments disclosed herein relate to solid state (e.g., LED) lighting devices including at least one electrically activated solid state light emitter and at least one lumiphor (or multiple electrically activated emitters optionally devoid of a lumiphor), with resulting emissions arranged to attain a color point in a desired CCT range (e.g., from 2,500K to 10,000K, from 2,500K to 4,000K, from 4,100K to 10,000K, from 2,700K to 5,000K, or other range) and that is non-coincident with a blackbody locus. The resulting color point preferably has a negative Planckian offset Delta u'v' value according to a CIE 1976 chromaticity diagram, such as a value in a range of no greater than negative 0.01, in a range of no greater than negative 0.015, in a range of no greater than negative 0.02, in a range of negative 0.01 to negative 0.03, in a range of negative 0.01 to negative 0.02, or another range disclosed herein. The foregoing regions are all below the blackbody or Planckian locus. As observed by at least some viewers in selected contexts, the resulting color points may be provide light of aesthetically pleasing character or improved performance relative to conventional light sources. In certain embodiments, the resulting color points may provide enhanced vividness and/or reduced discernable tint. The resulting color points may be non-coincident with both the BBL and the white body line in certain embodiments.

The term "Planckian offset Delta u'v' value" as used herein refers to a distance between a point of interest on a CIE 1976 chromaticity diagram and the nearest point (e.g., at the same correlated color temperature) on the Planckian locus (also called the blackbody locus or "BBL" herein). For purposes of this disclosure, a positive Planckian offset Delta u'v' value is above the Planckian locus, and a negative Planckian offset Delta u'v' value is below the Planckian locus.

In certain embodiments, multiple different electrically activated solid state light emitters may be used to attain a color point as specified herein. In certain embodiments, multiple different electrically activated solid state light emitters wherein one is arranged to stimulate lumiphor emissions (but in the absence of any lumiphor-converted blue electrically activated emitter) may be used to attain a color point as specified herein. In certain embodiments, multiple lumiphor-converted electrically activated solid state emitters may be used to attain a color point as specified herein.

Unless otherwise defined, terms used herein should be construed to have the same meaning as commonly understood by one of ordinary skill in the art to which the present disclosure belongs. It will be further understood that terms used herein should be interpreted as having a meaning that is consistent with their meaning in the context of this specification and the relevant art, and should not be interpreted in an idealized or overly formal sense unless expressly so defined herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Embodiments of the present disclosure are described herein with reference to cross-sectional, perspective, elevation, and/or plan view illustrations that are schematic illustrations of idealized embodiments of the present disclosure. Variations from the shapes of the illustrations as a result, for example, of manufacturing techniques and/or tolerances, are to be expected, such that embodiments of the present disclosure should not be construed as limited to particular shapes illustrated herein. The present disclosure may be embodied in different forms and should not be construed as limited to the specific embodiments set forth herein. In the drawings, the size and relative sizes of layers and regions may be exaggerated for clarity. In certain drawings, conventional features inherent to LED devices known in the art but not essential to the understanding of the present disclosure have been omitted to facilitate ease of explanation of the inventive subject matter.

Unless the absence of one or more elements is specifically recited, the terms "comprising," "including," and "having" as used herein should be interpreted as open-ended terms that do not preclude the presence of one or more elements.

It will be understood that when an element such as a layer, region, or substrate is referred to as being "on" another element, it can be directly on the other element or intervening elements may be present. Moreover, relative terms such as "on", "above", "upper", "top", "lower", or "bottom" may be used herein to describe a relationship between one structure or portion to another structure or portion as illustrated in the figures, but it should be understood that such relative terms are intended to encompass different orientations of the device in addition to the orientation depicted in the figures. For example, if the device in the figures is turned over, structure or portion described as "above" other structures or portions would now be oriented "below" the other structures or portions.

The terms "solid state light emitter" or "solid state emitter" (which may be qualified as being "electrically activated") may include a light emitting diode, laser diode, organic light emitting diode, and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive materials.

Solid state light emitting devices according to embodiments of the present disclosure may include, but are not limited to, III-V nitride based LED chips or laser chips fabricated on a silicon, silicon carbide, sapphire, or III-V nitride growth substrate, including (for example) devices manufactured and sold by Cree, Inc. of Durham, N.C. Such LEDs and/or lasers may optionally be configured to operate such that light emission occurs through the substrate in a so-called "flip chip" orientation. Such LED and/or laser chips may also be devoid of growth substrates (e.g., following growth substrate removal).

LED chips useable with lighting devices as disclosed herein may include horizontal devices (with both electrical contacts on a same side of the LED) and/or vertical devices (with electrical contacts on opposite sides of the LED). A horizontal device (with or without the growth substrate), for example, may be flip chip bonded (e.g., using solder) to a carrier substrate or printed circuit board (PCB), or wire bonded. A vertical device (without or without the growth substrate) may have a first terminal solder bonded to a carrier substrate, mounting pad, or printed circuit board (PCB), and have a second terminal wire bonded to the carrier substrate, electrical element, or PCB. Although certain embodiments shown in the figures may be appropriate for use with vertical LEDs, it is to be appreciated that the present disclosure is not so limited, such that any combination of one or more of the following LED configurations may be used in a single solid state light emitting device: horizontal LED chips, horizontal flip LED chips, vertical LED chips, vertical flip LED chips, and/or combinations thereof, with conventional or reverse polarity. Examples of vertical and horizontal LED chip structures are discussed by way of example in U.S. Publication No. 2008/0258130 to Bergmann et al. and in U.S. Pat. No. 7,791,061 to Edmond et al. which are hereby incorporated by reference herein.

Solid state light emitters may be used individually or in groups to emit one or more beams to stimulate emissions of one or more lumiphoric materials (e.g., phosphors, scintillators, lumiphoric inks, quantum dots, day glow tapes, etc.) to generate light at one or more peak wavelength, or of at least one desired perceived color (including combinations of colors that may be perceived as white). Lumiphoric materials may be provided in the form of particles, films, or sheets.

Inclusion of lumiphoric (also called 'luminescent') materials in lighting devices as described herein may be accomplished by any suitable means, including: direct coating on solid state emitters, dispersal in encapsulant materials arranged to cover solid state emitters; coating on lumiphor support elements (e.g., by powder coating, inkjet printing, or the like); incorporation into diffusers or lenses; and the like. Examples of lumiphoric materials are disclosed, for example, in U.S. Pat. No. 6,600,175, U.S. Patent Application Publication No. 2009/0184616, and U.S. Patent Application Publication No. 2012/0306355, and methods for coating light emitting elements with phosphors are disclosed in U.S. Patent Application Publication No. 2008/0179611, with the foregoing publications being incorporated by reference. Other materials, such as light scattering elements (e.g., particles) and/or index matching materials, may be associated with a lumiphoric material-containing element or surface. One or more lumiphoric materials useable in devices as described herein may be down-converting or up-converting, or can include a combination of both types.

In certain embodiments, at least one lumiphoric material may be spatially segregated ("remote") from and arranged to receive emissions from at least one electrically activated solid state emitter, with such spatial separation reducing thermal coupling between a solid state emitter and lumiphoric material. In certain embodiments, a spatially segregated lumiphor may be arranged to fully cover one or more electrically activated emitters of a lighting device. In certain embodiments, a spatially segregated lumiphor may be arranged to cover only a portion or subset of one or more emitters electrically activated emitters.

In certain embodiments, at least one lumiphoric material may be arranged with a substantially constant thickness and/or concentration relative to different electrically activated emitters. In certain embodiments, one or more lumiphoric materials may be arranged with presence, thickness, and/or concentration that vary relative to different emitters. Multiple lumiphors (e.g., lumiphors of different compositions) may be applied with different concentrations or thicknesses relative to different electrically activated emitters. In one embodiment, lumiphor presence, composition, thickness and/or concentration may vary relative to multiple electrically activated emitters. In certain embodiment, at least one lumiphoric material may be applied to a solid state emitter or a lumiphoric material support surface by patterning, such may be aided by one or more masks.

Various substrates may be used as mounting elements on which, in which, or over which multiple solid state light emitters (e.g., emitter chips) may be arranged or supported (e.g., mounted). Exemplary substrates include printed circuit boards (including but not limited to metal core printed circuit boards, flexible circuit boards, dielectric laminates, and the like) having electrical traces arranged on one or multiple surfaces thereof. A substrate, mounting plate, or other support element may include a printed circuit board (PCB), a metal core printed circuit board (MCPCB), a flexible printed circuit board, a dielectric laminate (e.g., FR-4 boards as known in the art) or any suitable substrate for mounting LED chips and/or LED packages. In certain embodiments, at least a portion of a substrate may include a dielectric material to provide desired electrical isolation between electrical traces or components of multiple LED sets. In certain embodiments, a substrate can comprise ceramic such as alumina, aluminum nitride, silicon carbide, or a polymeric material such as polyimide, polyester, etc. In certain embodiments, a substrate can comprise a flexible circuit board or a circuit board with plastically deformable portions to allow the substrate to take a non-planar (e.g., bent) or curved shape allowing for directional light emission with LED chips of one or more LED components also being arranged in a non-planar manner.

In certain embodiments, one or more LED components can include one or more "chip-on-board" (COB) LED chips and/or packaged LED chips that can be electrically coupled or connected in series or parallel with one another and mounted on a portion of a substrate. In certain embodiments, COB LED chips can be mounted directly on portions of substrate without the need for additional packaging.

Certain embodiments may involve use of solid state emitter packages. A solid state emitter package may include at least one solid state emitter chip (more preferably multiple solid state emitter chips) that is enclosed with packaging elements to provide environmental protection, mechanical protection, color selection, and/or light focusing utility, as well as electrical leads, contacts, and/or traces enabling electrical connection to an external circuit. One or more emitter chips may be arranged to stimulate one or more lumiphoric materials, which may be coated on, arranged over, or otherwise disposed in light receiving relationship to one or more solid state emitters. At least one lumiphoric material may be arranged to receive emissions of at least some emitters of a plurality of solid state light emitters and responsively emit lumiphor emissions. A lens and/or encapsulant material, optionally including lumiphoric material, may be disposed over solid state emitters, lumiphoric materials, and/or lumiphor-containing layers in a solid state emitter package.

In certain embodiments, a light emitting apparatus as disclosed herein (whether or not including one or more LED packages) may include at least one of the following items arranged to receive light from multiple LEDs: a single leadframe arranged to conduct electrical power to the plurality of electrically activated solid state light emitters; a single reflector arranged to reflect at least a portion of light emanating from the plurality of electrically activated solid state light emitters; a single submount or mounting element supporting the plurality of electrically activated solid state light emitters; a single lens arranged to transmit at least a portion of light emanating from the plurality of electrically activated solid state light emitters; and a single diffuser arranged to diffuse at least a portion of light emanating from the plurality of electrically activated solid state light emitters. In certain embodiments, a light emitting apparatus including multiple LEDs may include at least one of the following items arranged to receive light from multiple LEDs: multiple lenses; multiple optical elements; and multiple reflectors. Examples of optical elements include, but are not limited to elements arranged to affect light mixing, focusing, collimation, dispersion, and/or beam shaping.

In certain embodiments, a package including multiple solid state emitters may include multiple die attach pads, with a single die attach pad supporting each separately controllable solid state emitter or each separately controllable group of solid state emitters. A package including multiple solid state emitters may include a single lens (e.g., a molded lens) arranged to transmit at least a portion of light emanating from each solid state emitter. In certain embodiments, a molded lens may be arranged in direct contact with LED chips, die attach pads, other electrical elements, and/or exposed insulating material along a top surface of a substrate comprising insulating material. In certain embodiments, a lens may be textured or faceted to improve light extraction, and/or a lens may contain or have coated thereon various materials such as lumiphors and/or scattering particles.

In certain embodiments, a package may include a molded lens arranged to transmit light emitted by multiple LEDs. As known in the art, a mold including one or more cavities can be arranged over a substrate (or a panel of substrate material, from which multiple substrates may be singulated by sawing or other means) and LED chips arranged thereon, with the mold comprising a lens material and/or encapsulant in liquid form. In certain embodiments, a lens may be formed of liquid curable silicone, and LED chips may be embedded in liquid silicone, which is subsequently cured to form one or more lenses. Alternatively, a lens may be pre-molded and then affixed (e.g., with adhesives, thermal bonding, or any other suitable joining method) to a subassembly including a substrate to which or over which with multiple LED chips are mounted.

In certain embodiments, a solid state lighting device (e.g., package) may include a reflector cup defining a cavity, at least one solid state emitter arranged within the cavity, and encapsulant material arranged within the cavity. In certain embodiments, at least one solid state emitter may be arranged over a substrate and at least partially surrounded by a boundary wall (optionally embodying at least one dispensed dam material laterally spaced from the emitter(s), with an encapsulant material arranged over the emitter(s) and in contact with the at least one boundary wall).

Various devices disclosed herein may include multiple solid state emitters (e.g., LEDs) of the same or different dominant colors, or of the same or different peak wavelengths. In certain embodiments, a solid state light emitting device may include at least three colors such as red, green, and blue emitters, which may include solid state light emitters devoid of phosphors, or may include phosphors (e.g., in combination with UV and/or blue emitters) to generate one or more of the red, green, and blue colors. Other combinations of output colors may be provided. In certain embodiments, a solid state light emitting device may include at least two colors.

The expressions "lighting device," "light emitting device," and "light emitting apparatus" as used herein are not limited, except that such elements are capable of emitting light. That is, a lighting device or light emitting apparatus can be a device which illuminates an area or volume, e.g., a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., backlight poster, signage, LCD displays), light bulbs, bulb replacements (e.g., for replacing AC incandescent lights, low voltage lights, fluorescent lights, etc.), outdoor lighting, street lighting, security lighting, exterior residential lighting (wall mounts, post/column mounts), ceiling fixtures/wall sconces, under cabinet lighting, lamps (floor and/or table and/or desk), landscape lighting, track lighting, task lighting, specialty lighting, ceiling fan lighting, archival/art display lighting, high vibration/impact lighting-work lights, etc., mirrors/vanity lighting, or any other light emitting devices. In certain embodiments, lighting devices or light emitting apparatuses as disclosed herein may be self-ballasted. In certain embodiments, a light emitting apparatus may be embodied in a light fixture.

In preferred embodiments, a solid state lighting device is devoid of any incandescent light emitting element. In certain embodiments, a solid state lighting device lacks any "unconverted" blue-emitting solid state emitter not arranged to stimulate emissions of a lumiphoric material.

The inventive subject matter further relates in certain embodiments to an illuminated enclosure (the volume of which can be illuminated uniformly or non-uniformly), comprising an enclosed space and at least one lighting device or light emitting apparatus as disclosed herein, wherein at least one lighting device or light emitting apparatus illuminates at least a portion of the enclosure (uniformly or non-uniformly). The inventive subject matter further relates to an illuminated area, comprising at least one item, e.g., selected from among the group consisting of a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, a LCD display, a cave, a tunnel, a yard, a lamppost, etc., having mounted therein or thereon at least one lighting device or light emitting apparatus as described herein. Methods include illuminating an object, a space, or an environment, utilizing one or more lighting devices or light emitting apparatuses as disclosed herein. In certain embodiments, a lighting apparatus as disclosed herein includes multiple LED components arranged in an array (e.g., a two-dimensional array).

In certain embodiments, lighting devices as disclosed herein may utilize a notch filtering material arranged to at least partially inhibit transmission of selected wavelengths of light. Such a filtering material may be used to enhance GAI and/or CRI Ra. The term "notch filtering material" refers to a material that affects passage of light to cause light exiting the material to exhibit a spectral notch. A spectral notch is a portion of the color spectrum where the light is attenuated, thus forming a "notch" when light intensity is plotted against wavelength. Examples of notch filtering materials include rare earth and lanthanide materials, such as lanthanum, cerium, praseodymium, neodymium, promethium, samarium, europium, gadolinium, terbium, dysprosium, holmium, erbium, thulium, ytterbium, lutetium, scandium, and yttrium, as well as oxides thereof (e.g., neodymium oxide). Different rare earth compounds may exhibit notch filtering characteristics of different wavelength ranges. For example, neodymium (or oxide thereof) when used as a filtering material may produce a spectral notch in the yellow range, whereas erbium (or oxide thereof) when used as a filtering material may produce a spectral notch in the cyan range. Additional notch filtering materials include color pigments. As with the use of rare earth compounds, the use of color pigments can impart notch filtering properties in either transmissive or reflective applications. In many instances, color pigments may provide softer spectral notch (with more gradually sloping wavelength attenuation) characteristics relative to other notch filtering materials. One example of a color pigment includes an ultramarine pigment based on $CoAl_2O_4$, providing peak attenuation at a wavelength of about 580 nm. A cobalt blue pigment of similar composition could also be used. Other color pigments based on $CuSO_4$ or $NiCl_2$ can also be used. A variety of natural and synthetic pigments are available and could be used as notch filtering materials according to certain embodiments disclosed herein. Notch filters may also be fabricated by depositing one or more dielectric layers (e.g., to form dielectric stacks) on substrates, such as filters commercially available from Thorlabs, Inc. (Newton, N.J., US) having the following center wavelengths (CWL) and full width at half maximum (FWHM) characteristics: CWL=488 nm, FWHM=15 nm; CWL=514 nm, FWHM=17 nm; CWL=533 nm, FWHM=17 nm; CWL=561 nm, FWHM=18 nm; CWL=594 nm, FWHM=23 nm; 633 nm, FWHM=25 nm; and CWL=658 nm, FWHM=26 nm.

In certain embodiments utilizing one or more notch filtering materials, a spectral notch provided by at least one filtering material may have a full width in a range of less than or equal to 40 nm, or less than or equal to 35 nm, or less than or equal to 30 nm, or less than or equal to 25 nm, or less than or equal to 20 nm, in each case corresponding to a half maximum relative reduction in light transmission. In certain embodiments utilizing one or more notch filtering materials, at least one filtering material may be arranged to filter light within (or overlapping) the yellow-green range or yellow range, such as to provide peak attenuation in a range of from 550 nm to 590 nm, or from 570 nm to 590 nm.

In embodiments utilizing notch filtering materials, such materials may be provided as microparticles or nanoparticles of any desired size, size distribution, and geometric shape. In certain embodiments, multiple notch filtering materials may be mixed and incorporated in a carrier material or binder, or multiple notch filtering materials may otherwise be used in combination (e.g., in sequential layers, with or without a binding medium) to provide multiple spectral notches. In certain embodiments, notch filtering materials may be arranged in or on an at least partially light-transmissive optical element or enclosure, which may serve as a lens and/or diffuser. Examples of desirable materials for carriers, binding media, enclosures, and/or optical elements include (but are not limited to) silicone, resin, epoxy, thermoplastic polycondensate, polymeric materials, and glass. In certain embodiments, such materials may be molded and/or cured together with at least one notch filtering material. In certain embodiments, a lighting device may include one or more transmissive optical elements and/or reflective optical elements incorporating at least one notch filtering material. For example, a so-called "troffer" style ceiling fixture may include a reflector that serves as an optical element, and may additionally include optical elements such as glass plates or lenses.

In certain embodiments utilizing notch filtering materials, at least one filtering material (e.g., notch filtering material) may be arranged with a substantially constant thickness and/or concentration relative to different electrically activated emitters (e.g., solid state emitters such as LEDs). In certain embodiments, one or more filtering materials may be arranged on or over at least one solid state emitter (optionally with an intervening lumiphoric material) with presence, composition, thickness, and/or concentration that vary relative to different emitters. Multiple filtering materials (e.g., filtering materials of different compositions and arranged to provide spectral notches at different wavelengths) may be applied to one or more electrically activated emitters. In certain embodiments, at least one filtering material may be applied over one or more solid state light emitters, or over a support surface (e.g., lens, diffuser, reflector, etc.) utilizing a patterning technique, such may be aided by one or more masks. In certain embodiments, one or more notch filtering materials may be integrated with or arranged in contact with one or more portions of a solid state emitter package.

In certain embodiments utilizing notch filtering materials, one or more notch filtering materials may be mixed with one or more other functional materials (e.g., lumiphoric materials, scattering materials, and the like) and preferably incorporated into a binder or other carrier medium. In certain embodiments, at least one filtering material may be arranged in or on a carrier arranged on or over a plurality of solid state light emitters.

In certain embodiments utilizing notch filtering materials, notch filtering materials may be arranged in or on a reflector, which may be either specularly reflective or diffusively reflective. Any suitable reflective material in the art may be used, including (but not limited to) MCPET (foamed white polyethylene terephthalate), and surfaces metalized with one or more metals such as (but not limited to) silver (e.g., a silvered surface). MCPET manufactured by Otsuka Chemical Co. Ltd. (Osaka, Japan) is a diffuse white reflector that has a total reflectivity of 99% or more, a diffuse reflectivity of 96% or more, and a shape holding temperature of at least about 160° C. A preferred light-reflective material would be at least about 90% reflective, more preferably at least about 95% reflective, and still more preferably at least about 98-99% reflective of light of a desired wavelength range, such as one or more of visible light, ultraviolet light, and/or infrared light, or subsets thereof. In certain embodiments, at least one notch filtering material may be deposited on a surface of a reflector by spray coating, spin coating, sputtering, dipping, or rolling. Additionally deposition methods that may be used include electrostatic deposition and electrophoretic deposition. In certain embodiments, at least one notch filtering may be incorporated into a surface of a reflector via methods such as molding or sintering.

In certain embodiments utilizing notch filtering materials, one or more notch filtering materials may be coated or otherwise arranged on, over, or against at least one surface of one or more one solid state emitter chips. In certain embodiments, one or more notch filtering materials may be coated or otherwise arranged on, over, or against at least one surface of at least one lumiphoric material, wherein the at least one lumiphoric material may be arranged in direct contact with at least one surface of a solid state emitter chip, or may be arranged remotely from (i.e., spatially segregated from) at least one surface of a solid state emitter chip. In certain embodiments, one or more notch filtering materials may be conformally coated on the surface of at least one solid state emitter chip and/or lumiphoric material, wherein conformal coating in this regard refers to a coating that follows the shape and contour of at least one surface (or preferably multiple surfaces) of a chip with a substantially uniform thickness.

Parameters such as the type or composition of carrier or binding medium; the thickness, concentration, particle size, and particle size distribution of notch filtering material(s); and the presence, amount, and type of other trace substances accompanying one or notch filtering elements, may be adjusted to provide one or more spectral notches of desired width and/or depth.

Various lighting devices disclosed herein may be arranged to output aggregate (e.g., combined or mixed) emissions embodying a color point having negative Planckian offset Delta u'v' value according to a CIE 1976 chromaticity diagram, such as a value in a range of no greater than negative 0.01, in a range of no greater than negative 0.015, in a range of no greater than negative 0.02, in a range of from negative 0.01 to negative 0.05; in a range of from negative 0.01 to negative 0.04; in a range of from negative 0.01 to negative 0.03; in a range of from negative 0.01 to negative 0.02; in a range of from negative 0.01 to negative 0.015; in a range of from negative 0.015 to negative 0.05; in a range of from negative 0.015 to negative 0.04; in a range of from negative 0.015 to negative 0.03; in a range of from negative 0.015 to negative 0.02; in a range of from negative 0.02 to negative 0.05; in a range of from negative 0.02 to negative 0.04; or in a range of from negative 0.02 to negative 0.03. Any of the foregoing color points may be in one or more of the following CCT ranges: from 2,500K to 10,000K, from 2,500K to 4,000K, from 2,500K to 3,500K, from 2,500K to 3,000K, from 2,700K to 5,000K, from 2,700K to 4,100K, from 4,100K to 10,000K, from 4,100K to 8,000K, and from 4,100K to 6,500K. In certain embodiments, the resulting color point is non-coincident with the blackbody (or Planckian) locus but is coincident with the white body line. In certain embodiments, the resulting color point is non-coincident with both the blackbody (or Planckian) locus and the white body line.

In certain embodiments, the mixture of light generated by a lighting device has a luminous efficacy in at least one of the following lumens per watt ranges: at least 60, at least 80, at least 100, at least 120, or at least 140. In certain embodiments the mixture of light generated by a lighting device has a GAI value of at least 50 and a CRI Ra value of at least 50, with the foregoing ranges optionally being bounded by 70, 80, 90, or 100 at the upper end.

In certain embodiments, a mixture of light generated by a lighting device may be generated by at least one first electrically activated solid state emitter and at least one second electrically activated solid state emitter preferably having different dominant wavelengths. The at least one first emitter may be arranged to produce light having a color point defined on a CIE 1976 u'-v' chromaticity diagram by a correlated color temperature value in a range of from 2,500K to 10,000K (or any subrange thereof disclosed herein) and by a Planckian offset Delta u'v' value in a positive range of at least 0.007, in a range of at least 0.01, in a range of at least 0.015, in a range of at least 0.02, in a range of at least 0.03, in a range of from 0.007 to 0.05, in a range of from 0.007 to 0.03, in a range of from 0.007 to 0.02, in a range of from 0.007 to 0.015, in a range of from 0.01 to 0.05, in a range of from 0.01 to 0.03, in a range of from 0.01 to 0.02, in a range of from 0.02 to 0.05, or in a range of from 0.02 to 0.03. The at least one first emitter may be arranged to produce light having a color point defined on a CIE 1976 u'-v' chromaticity diagram by a correlated color temperature value in a range of from 2,500K to 10,000K (or any subrange thereof disclosed herein) and by a Planckian offset Delta u'v' value in a negative range of no greater than negative 0.012, in a range of no greater than negative 0.015, in a range of no greater than negative 0.02, in a range of no greater than negative 0.03, in a range of from negative 0.012 to 0.05, in a range of from negative 0.012 to 0.03, in a range of from negative 0.012 to 0.02, in a range of from negative 0.015 to 0.05, in a range of from negative 0.015 to 0.03, in a range of from negative 0.015 to 0.02, in a range of from negative 0.02 to 0.05, or in a range of from negative 0.02 to 0.03.

In certain embodiments, a lighting device disclosed herein may be devoid of any non-lumiphor-converted blue electrically activated emitter (e.g., a solid state light emitter arranged to generate emissions (i) having dominant wavelength in a range of from 430 nm to 480 nm and (ii) exiting the lighting device without passage through a layer or region comprising a lumiphoric material).

In certain embodiments, a lighting device may include at least one primary solid state light emitter arranged to emit primary solid state light emitter emissions comprising a dominant wavelength in a range of from 430 nm to 480 nm; a lumiphor arranged to receive and be excited by at least a portion of emissions of the at least one primary solid state light emitter, and emit lumiphor emissions comprising a dominant wavelength in a range of from about 535 nm to about 585 nm; and at least one supplemental solid state light emitter arranged to generate supplemental solid state light emitter emissions comprising a dominant wavelength in a range of from 590 nm to 630 nm. Such a device is preferably devoid of any non-lumiphor-converted blue electrically activated emitter (e.g., a solid state light emitter arranged to generate emissions (i) having dominant wavelength in a range of from 430 nm to 480 nm and (ii) exiting the lighting device without passage through a layer or region comprising a lumiphoric material). For such a device, a combination of (A) light exiting the lighting device that was emitted by the at least one primary solid state light emitter, (B) light exiting the lighting device that was emitted by the lumiphor, and (C) light exiting the lighting device that was emitted by the at least one supplemental solid state light emitter may, in the absence of any additional light, produce a mixture of light having a color point defined on a CIE 1976 u'-v' chromaticity diagram by a correlated color temperature value in a range of from 2,500K to 10,000K (or another desired range disclosed herein) and by a Planckian offset Delta u'v' value in a range of no greater than negative 0.01 (or another desired range disclosed herein). In certain embodiments, the lighting device may include a first power line, wherein each of the at least one primary solid state light emitter and the at least one supplemental solid state light emitter is electrically connected to the first power line. In certain embodiments, the correlated color temperature value is in a range of from 2,700K to 5,000K. In certain embodiments, the Planckian offset Delta u'v' value is in a range of no greater than negative 0.015. In certain embodiments, the Planckian offset Delta u'v' value is in a range of from negative 0.01 to negative 0.03, or in a range of from negative 0.01 to negative 0.02. In certain embodiments, the mixture of light has a gamut area index (GAI) value of at least 50 and a color rendering index (CRI Ra) value of at least 50. In certain embodiments, the mixture of light has a luminous efficacy of at least 60 lumens per watt. In certain embodiments, the lighting device may be embodied in a light bulb or light fixture, and/or may be used to illuminate an object, a space, or an environment as disclosed herein.

In certain embodiments, a lighting device may include at least one first electrically activated solid state light emitter having a first dominant wavelength, wherein the at least one first electrically activated solid state light emitter is arranged to produce light having a color point defined on a CIE 1976 u'-v' chromaticity diagram by a correlated color temperature value in a range of from 2,500K to 10,000K (or another desired range disclosed herein) and by a Planckian offset Delta u'v' value in a range of at least 0.007 (or another desired range disclosed herein); and at least one second electrically activated solid state light emitter having a second dominant wavelength, wherein the at least one second electrically activated solid state light emitter is arranged to produce light having a color point defined on a CIE 1976 u'-v' chromaticity diagram by a correlated color temperature value in a range of from 2,500K to 10,000K (or another desired range disclosed herein) and by a Planckian offset Delta u'v' value in a range of no greater than negative 0.012 (or another desired range disclosed herein). For such a device, a combination of (A) light exiting the lighting device that was emitted by the at least one first electrically activated solid state light emitter and (B) light exiting the lighting device that was emitted by the at least one second electrically activated solid state light emitter may, in the absence of any additional light, produce a mixture of light having a color point defined on a CIE 1976 u'-v' chromaticity diagram by a correlated color temperature in a range of from 2,500K to 10,000K and a Planckian offset Delta u'v' value of no greater than negative 0.01 (or another desired range disclosed herein). In certain embodiments, the lighting device may include a first power line, wherein each of the at least one first emitter and the at least one second emitter is electrically connected to the first power line. In certain embodiments, any of (i) the at least one first electrically activated solid state emitter and (ii) the at least one second electrically activated solid state emitter comprises at least one light emitting diode (LED) chip and a lumiphoric material arranged to receive at least a portion of emissions of the at least one LED chip and responsively emit lumiphor emissions. In certain embodiments, the lighting device is devoid of any non-lumiphor-converted blue electrically activated emitter (e.g., a solid state light emitter arranged to generate emissions (i) having dominant wavelength in a range of from 430 nm to 480 nm and (ii) exiting the lighting device without passage through a layer or region comprising a lumiphoric material). In certain embodiments, the lighting device is devoid of any electrically activated solid state light emitter having a dominant wavelength other than the first dominant wavelength and other than the second dominant wavelength. In certain embodiments, the first dominant wavelength differs from the second dominant wavelength by at least 50 nm. In certain embodiments, the color point of the mixture of light has a correlated color temperature in a range of from 2,700K to 5,000K. In certain embodiments, the color point of the mixture of light has a Planckian offset Delta u'v' value in a range of no greater than negative 0.015, or in a range of from negative 0.01 to negative 0.03, or in a range of from negative 0.01 to negative 0.02. In certain embodiments, the lighting device may include multiple clusters of solid state light emitters, wherein each cluster includes at least one first electrically activated solid state light emitter and at least one second electrically activated solid state light emitter. In certain embodiments, the lighting device may be embodied in a light bulb or light fixture, and/or may be used to illuminate an object, a space, or an environment as disclosed herein.

In certain embodiments, a lighting device may include at least one electrically activated solid state light emitter; a first lumiphor arranged to receive and be excited by at least a portion of emissions of the at least one electrically activated solid state light emitter, and responsively emit first lumiphor emissions; and a second lumiphor arranged to receive and be excited by at least a portion of emissions of the at least one electrically activated solid state light emitter, and responsively emit second lumiphor emissions. For such a device, a combination of (A) light exiting the lighting device that was emitted by the at least one electrically activated solid state light emitter, (B) light exiting the lighting device that was emitted by the first lumiphor, and (C) light exiting the lighting device that was emitted by the second lumiphor may, in the absence of any additional light, produce a mixture of light having a color point defined on a CIE 1976 u'-v' chromaticity diagram by a correlated color temperature value in a range of from 2,500K to 10,000K (or another desired range disclosed herein) and a Planckian offset Delta u'v' value in a range of no greater than negative 0.01 (or another desired range disclosed herein). In certain embodiments, the first lumiphor emissions have a first dominant wavelength, the second lumiphor emissions have a second dominant wavelength, and the first dominant wavelength differs from the second dominant wavelength by at least 30 nm. In certain embodiments, the first lumiphor may be mixed with the second lumiphor. In certain embodiments, each of the first lumiphor and the second lumiphor may be spatially segregated from the at least one electrically activated solid state light emitter. In certain embodiments, the first lumiphor may be arranged in a first carrier material or layer, and the second lumiphor may be arranged in a second carrier material or layer. In certain embodiments, the color point of the mixture of light has a correlated color temperature in a range of from 2,700K to 5,000K. In certain embodiments, the color point of the mixture of light has a Planckian offset Delta u'v' value in a range of no greater than negative 0.015, or in a range of from negative 0.01 to negative 0.03, or in a range of from negative 0.01 to negative 0.02. In certain embodiments, the mixture of light has a gamut area index (GAI) value of at least 50 and a color rendering index (CRI Ra) value of at least 50. In certain embodiments, the mixture of light has a luminous efficacy of at least 60 lumens per watt. In certain embodiments, the lighting device may be embodied in a light bulb or light fixture, and/or may be used to illuminate an object, a space, or an environment as disclosed herein.

In certain embodiments, a lighting device may include a first electrically activated solid state light emitter; a second electrically activated solid state light emitter; and a lumiphor arranged to receive and be excited by at least a portion of emissions of at least one of the first and the second electrically activated solid state light emitter, and responsively emit lumiphor emissions. For such a device, a combination of (A) light exiting the lighting device that was emitted by the first electrically activated solid state light emitter, (B) light exiting the lighting device that was emitted by the second electrically activated solid state light emitter, and (C) light exiting the lighting device that was emitted by the lumiphor may, in the absence of any additional light, produce a mixture of light having a color point defined on a CIE 1976 u'-v' chromaticity diagram by a correlated color temperature in a range of from 2,500K to 10,000K (or another desired range disclosed herein) and by a Planckian offset Delta u'v' value of no greater than negative 0.01 (or another desired range disclosed herein). Additionally for such a device, the mixture of light preferably has a gamut area index (GAI) value of at least 50 and a color rendering index (CRI Ra) value of at least 50 (or other desired GAI and/or CRI Ra ranges disclosed herein). In certain embodiments, the lighting device may include a first power line, wherein each of the first and second solid state light emitter is electrically connected to the first power line. In certain embodiments, the correlated color temperature value is in a range of from 2,700K to 5,000K. In certain embodiments, the Planckian offset Delta u'v' value is in a range of no greater than negative 0.015, in a range of from negative 0.01 to negative 0.03, or in a range of from negative 0.01 to negative 0.02. In certain embodiments, the mixture of light has a luminous efficacy of at least 60 lumens per watt. In certain embodiments, the lighting device is devoid of any non-lumiphor-converted blue electrically activated emitter (e.g., a solid state light emitter arranged to generate emissions (i) having dominant wavelength in a range of from 430 nm to 480 nm and (ii) exiting the lighting device without passage through a layer or region comprising a lumiphoric material). In certain embodiments, the lighting device may be embodied in a light bulb or light fixture, and/or may be used to illuminate an object, a space, or an environment as disclosed herein.

In certain embodiments, a lighting device may include at least one electrically activated solid state light emitter; at least one lumiphor arranged to receive and be excited by at least a portion of emissions of the at least one electrically activated solid state light emitter, and emit lumiphor emissions; and a notch filtering material arranged in a light path between (i) the at least one lumiphor and (ii) at least one light output surface of the lighting device, wherein the notch filtering material is arranged to receive at least a portion of the lumiphor emissions and filter the received lumiphor emissions to exhibit a spectral notch. For such a device, combination of (A) light exiting the lighting device that was emitted by the at least one electrically activated solid state light emitter, and (B) light exiting the lighting device that was emitted by the at least one lumiphor may, in the absence of any additional light, produce a mixture of light having a color point defined on a CIE 1976 u'-v' chromaticity diagram by a correlated color temperature in a range of from 2,500K to 10,000K (or another desired range disclosed herein) and by a Planckian offset Delta u'v' value of no greater than negative 0.01 (or another desired range disclosed herein). In certain embodiments, the correlated color temperature value is in a range of from 2,700K to 5,000K. In certain embodiments, the Planckian offset Delta u'v' value is in a range of no greater than negative 0.015, in a range of from negative 0.01 to negative 0.03, or in a range of from negative 0.01 to negative 0.02. In certain embodiments, the mixture of light preferably has a gamut area index (GAI) value of at least 50 and a color rendering index (CRI Ra) value of at least 50 (or other desired GAI and/or CRI Ra ranges disclosed herein). In certain embodiments, the mixture of light has a luminous efficacy of at least 60 lumens per watt. In certain embodiments, the lighting device may be embodied in a light bulb or light fixture, and/or may be used to illuminate an object, a space, or an environment as disclosed herein.

In certain embodiments, a lighting device may include at least one electrically activated solid state light emitter and a lumiphor arranged to receive and be excited by at least a portion of emissions of at least one electrically activated solid state light emitter, and responsively emit lumiphor emissions. For such a device, a combination of (A) light exiting the lighting device that was emitted by the at least one electrically activated solid state light emitter and (B) light exiting the lighting device that was emitted by the lumiphor may, in the absence of any additional light, produce a mixture of light having a color point defined on a CIE 1976 u'-v' chromaticity diagram by a correlated color temperature in a range of from 2,500K to 10,000K (or another desired range disclosed herein) and by a Planckian offset Delta u'v' value of no greater than negative 0.01 (or another desired range disclosed herein). Additionally, for such a device, the resulting mixture of light may have a luminous efficacy of at least 60 lumens per watt (or another desired range disclosed herein). In certain embodiments, the at least one electrically activated solid state light emitter may include at least one first electrically activated solid state light emitter arranged to generate emissions comprising a first dominant wavelength, the at least one electrically activated solid state light emitter may include at least one second electrically activated solid state light emitter arranged to generate emissions comprising a second dominant wavelength, and the second dominant wavelength differs from the first dominant wavelength by at least 50 nm. In certain embodiments, the lighting device is devoid of any non-lumiphor-converted blue electrically activated emitter (e.g., a solid state light emitter arranged to generate emissions (i) having dominant wavelength in a range of from 430 nm to 480 nm and (ii) exiting the lighting device without passage through a layer or region comprising a lumiphoric material). In certain embodiments, the correlated color temperature value is in a range of from 2,700K to 5,000K. In certain embodiments, the Planckian offset Delta u'v' value is in a range of no greater than negative 0.015, in a range of from negative 0.01 to negative 0.03, or in a range of from negative 0.01 to negative 0.02. In certain embodiments, the lighting device may be embodied in a light bulb or light fixture, and/or may be used to illuminate an object, a space, or an environment as disclosed herein Various features and embodiments of the present disclosure are described with reference to the accompanying figures.

FIG. 5 is an excerpt of a CIE 1976 chromaticity diagram illustrating the blackbody locus (BBL) and a first region 30 (represented in dashed lines) embodying color points to be output by a lighting device as disclosed herein. The region 30 is below the BBL. CCT lines for selected values are additionally shown (i.e., spanning Planckian offset Delta u'v' values of about ±0.05). The region 30 defined by a CCT value in a range of from 2,500K to 10,000K and by a Planckian offset Delta u'v' value in a range of no greater than negative 0.01. In particular, the region 30 is bounded from above by curve 31 (representing Planckian offset Delta u'v' values of negative 0.01), from the left by line 33 corresponding to a CCT value of 10,000K, and from the right by line 34 corresponding to a CCT value of 2,500K. An artificial boundary line 32 is shown along the bottom of FIG. 5, but it is to be recognized that in certain embodiments, the lower boundary of the region 30 may be defined by the intersection of lines 33, 34 in a region of the CIE 1976 diagram not shown in the excerpt of such diagram illustrated in FIG. 5. It is to be recognized that the various subregions of the first region 30 are contemplated within the scope of the present disclosure, according to various CCT and/or Planckian offset Delta u'v' value ranges specified herein.

Figure 6:
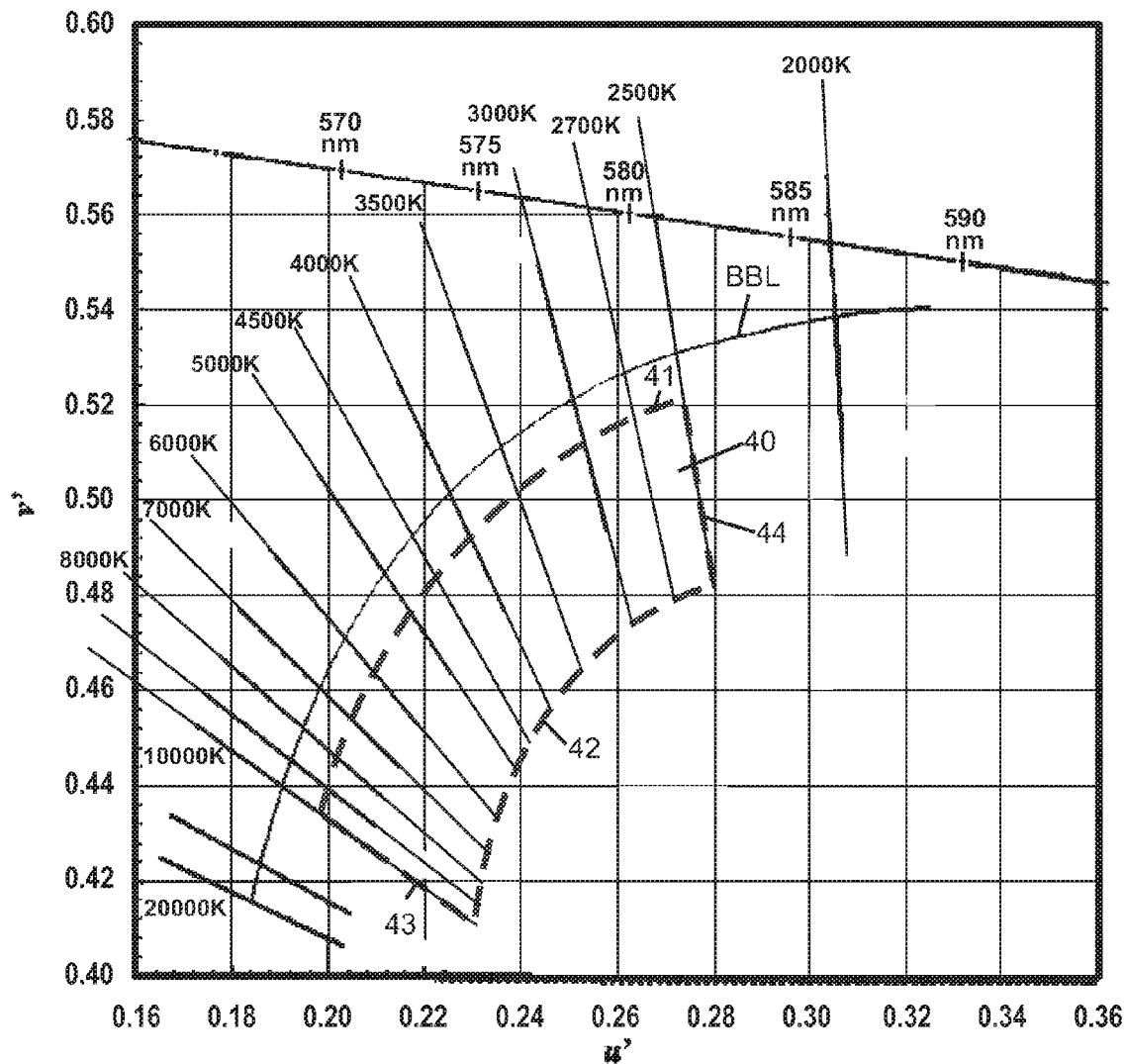
FIG. 6 is an excerpt of a CIE 1976 chromaticity diagram illustrating the blackbody or Planckian locus (BBL) and another region embodying color points to be output by a lighting device as disclosed herein, with the region defined by a CCT value in a range of from 2,500K to 10,000K and by a Planckian offset Delta u'v' value in a range of from negative 0.01 to negative 0.05.

FIG. 6 is an excerpt of a CIE 1976 chromaticity diagram illustrating the blackbody locus (BBL) and a second region 40 (represented in dashed lines) embodying color points to be output by a lighting device as disclosed herein. The region 40 is below the BBL. CCT lines for selected values are additionally shown (i.e., spanning Planckian offset Delta u'v' values of about ±0.05). The region 40 defined by a CCT value in a range of from 2,500K to 10,000K and by a Planckian offset Delta u'v' value in a range of from negative 0.01 to negative 0.05. In particular, the region 40 is bounded from above by curve 41 (representing Planckian offset Delta u'v' values of negative 0.01), from the left by line 43 corresponding to a CCT value of 10,000K, from the right by line 44 corresponding to a CCT value of 2,500K, and from below by curve 42 (representing Planckian offset Delta u'v' values of negative 0.05). It is to be recognized that the various subregions of the second region 40 are contemplated within the scope of the present disclosure, according to various CCT and/or Planckian offset Delta u'v' value ranges specified herein.

Figure 7:
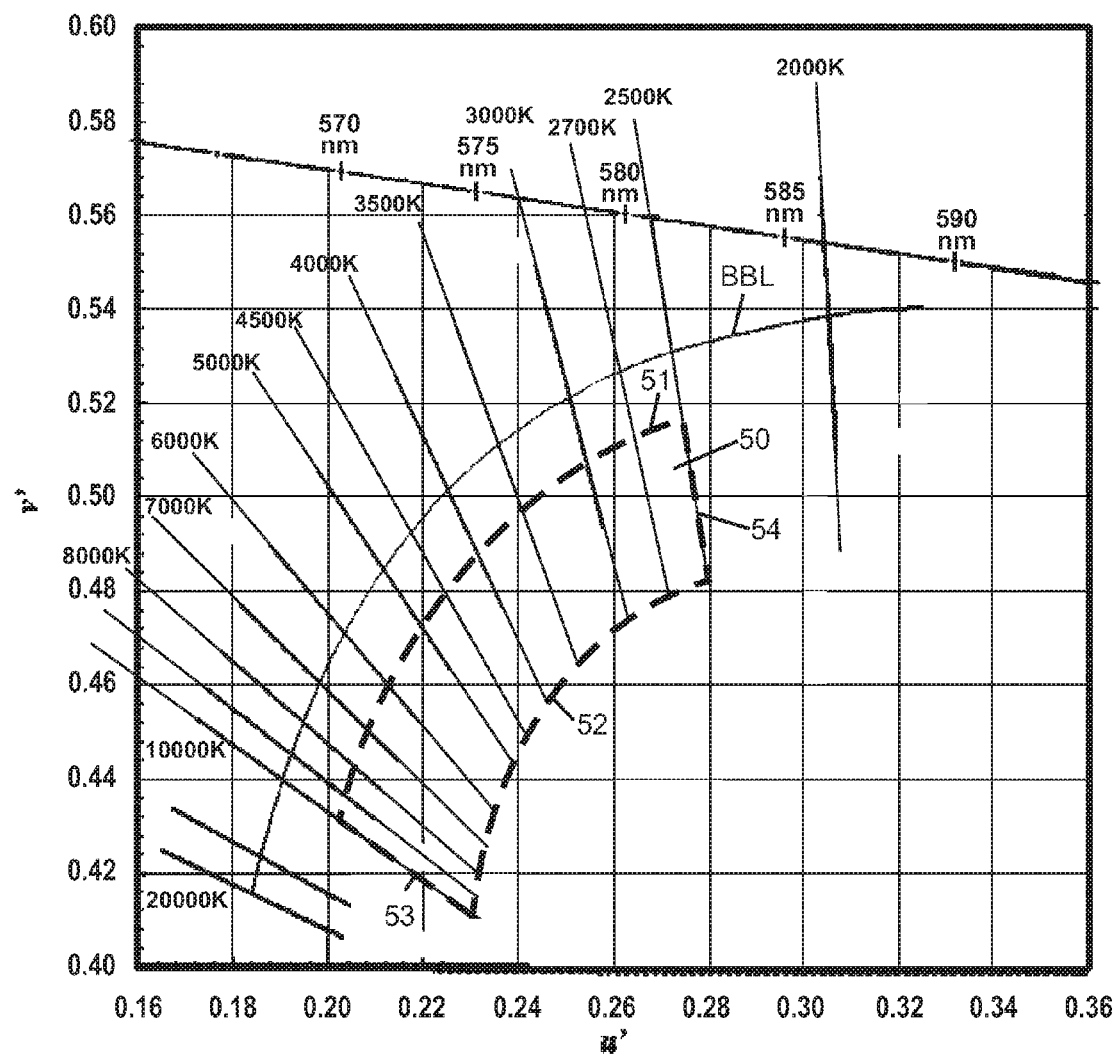
FIG. 7 is an excerpt of a CIE 1976 chromaticity diagram illustrating the blackbody or Planckian locus (BBL) and another region embodying color points to be output by a lighting device as disclosed herein, with the region defined by a CCT value in a range of from 2,500K to 10,000K and by a Planckian offset Delta u'v' value in a range of from negative 0.015 to negative 0.05.

FIG. 7 is an excerpt of a CIE 1976 chromaticity diagram illustrating the blackbody locus (BBL) and a third region 50 (represented in dashed lines) embodying color points to be output by a lighting device as disclosed herein. The region 50 is below the BBL. CCT lines for selected values are additionally shown (i.e., spanning Planckian offset Delta u'v' values of about ±0.05). The region 50 defined by a CCT value in a range of from 2,500K to 10,000K and by a Planckian offset Delta u'v' value in a range of from negative 0.015 to negative 0.05. In particular, the region 50 is bounded from above by curve 51 (representing Planckian offset Delta u'v' values of negative 0.015), from the left by line 53 corresponding to a CCT value of 10,000K, from the right by line 54 corresponding to a CCT value of 2,500K, and from below by curve 52 (representing Planckian offset Delta u'v' values of negative 0.05). It is to be recognized that the various subregions of the third region 50 are contemplated within the scope of the present disclosure, according to various CCT and/or Planckian offset Delta u'v' value ranges specified herein.

Figure 8:
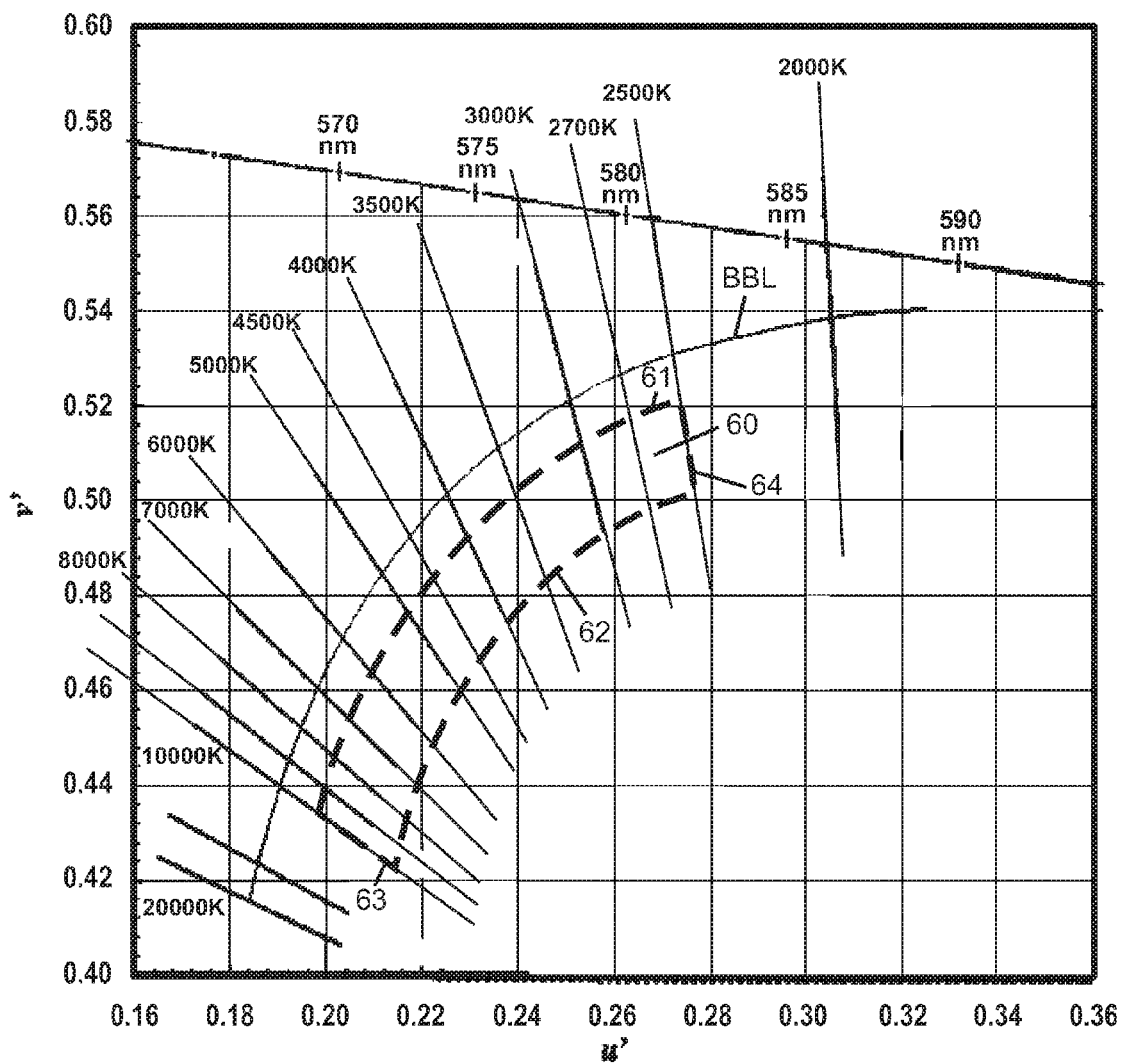
FIG. 8 is an excerpt of a CIE 1976 chromaticity diagram illustrating the blackbody or Planckian locus (BBL) and another region embodying color points to be output by a lighting device as disclosed herein, with the region defined by a CCT value in a range of from 2,500K to 10,000K and by a Planckian offset Delta u'v' value in a range of from negative 0.01 to negative 0.03.

FIG. 8 is an excerpt of a CIE 1976 chromaticity diagram illustrating the blackbody locus (BBL) and a fourth region 60 (represented in dashed lines) embodying color points to be output by a lighting device as disclosed herein. The region 60 is below the BBL. CCT lines for selected values are additionally shown (i.e., spanning Planckian offset Delta u'v' values of about ±0.05). The region 60 defined by a CCT value in a range of from 2,500K to 10,000K and by a Planckian offset Delta u'v' value in a range of from negative 0.01 to negative 0.03. In particular, the region 60 is bounded from above by curve 61 (representing Planckian offset Delta u'v' values of negative 0.01), from the left by line 63 corresponding to a CCT value of 10,000K, from the right by line 64 corresponding to a CCT value of 2,500K, and from below by curve 62 (representing Planckian offset Delta u'v' values of negative 0.03). It is to be recognized that the various subregions of the fourth region 60 are contemplated within the scope of the present disclosure, according to various CCT and/or Planckian offset Delta u'v' value ranges specified herein.

FIG. 9 is an excerpt of a CIE 1976 chromaticity diagram illustrating the blackbody locus (BBL) and a fifth region 70 (represented in dashed lines) embodying color points to be output by a lighting device as disclosed herein. The region 70 is below the BBL. CCT lines for selected values are additionally shown (i.e., spanning Planckian offset Delta u'v' values of about ±0.05). The region 70 defined by a CCT value in a range of from 2,500K to 10,000K and by a Planckian offset Delta u'v' value in a range of from negative 0.01 to negative 0.02. In particular, the region 70 is bounded from above by curve 71 (representing Planckian offset Delta u'v' values of negative 0.01), from the left by line 73 corresponding to a CCT value of 10,000K, from the right by line 74 corresponding to a CCT value of 2,500K, and from below by curve 72 (representing Planckian offset Delta u'v' values of negative 0.02). It is to be recognized that the various subregions of the fifth region 70 are contemplated within the scope of the present disclosure, according to various CCT and/or Planckian offset Delta u'v' value ranges specified herein.

FIG. 10 is an excerpt of a CIE 1976 chromaticity diagram illustrating the blackbody locus (BBL), one zone 90A (represented in dot-dash lines) above the BBL encompassing color points that may be generated by one or more first emitters of a lighting device as disclosed herein, and another zone 80A (represented in dashed lines) below the BBL including color points that may be generated by one or more second emitters of a lighting device as disclosed herein, wherein aggregate emitters of the lighting device (including emissions of the one or more first and one or more second emitters in combination) may embody a color point within one of the regions 30, 30, 50, 60, or 70 illustrated in FIGS. 5-9, or within regions or subregions otherwise described herein. The upper zone 90A may be bounded from below by curve 92A corresponding to a Planckian offset Delta u'v' value of (positive) 0.007, from the left by line 95A corresponding to a CCT value of 10,000K, from the right by line 94A corresponding to a CCT value of 2,500K, and from above by line 91A corresponding to the spectrum locus. An artificial boundary line 32 is shown at the left upper portion of FIG. 10, but it is to be recognized that in certain embodiments, the leftmost boundary of the zone 90A may extend into further portions of the CIE 1976 diagram not shown in the excerpt of FIG. 5, as bounded by an extension of line 95A. The lower zone 80A may be bounded from above by curve 81A corresponding to a Planckian offset Delta u'v' value of negative 0.012, from the left by line 83A corresponding to a CCT value of 10,000K, and from the right by line 84A corresponding to a CCT value of 2,500K. An artificial boundary line 82A is shown along the bottom of FIG. 10, but it is to be recognized that in certain embodiments, the lower boundary of the zone 80A may be defined by the intersection of lines 83A, 84A in a region of the CIE 1976 diagram not shown in the excerpt of such diagram illustrated in FIG. 10. In certain embodiments, one or more first solid state emitters (optionally arranged to stimulate emissions of one or more lumiphors) may be arranged to generate a first color point in the upper zone 90A, one or more second solid state emitters (optionally arranged to stimulate emissions of one or more lumiphors) may be arranged to generate a second color point in the lower zone 80A, and a combination of light resulting from a mixture of the foregoing emitters may embody a (combined) color point within one of the regions 30, 30, 50, 60, or 70 illustrated in FIGS. 5-9, or within regions or subregions otherwise described herein. It is to be recognized that the various sub-zones of the zones 80A, 90A are contemplated within the scope of the present disclosure, according to various CCT and/or Planckian offset Delta u'v' value ranges specified herein. In certain embodiments, relative outputs of the first and second emitters may be adjusted in order to adjust the (combined) color point.

FIG. 11 is an excerpt of a CIE 1976 chromaticity diagram illustrating the blackbody locus (BBL), one zone 90B (represented in dot-dash lines) above the BBL encompassing color points that may be generated by one or more first emitters of a lighting device as disclosed herein, and another zone 80B (represented in dashed lines) below the BBL including color points that may be generated by one or more second emitters of a lighting device as disclosed herein, wherein aggregate emitters of the lighting device (including emissions of the one or more first and one or more second emitters in combination) may embody a color point within one of the regions 30, 30, 50, 60, or 70 illustrated in FIGS. 5-9, or within regions or subregions otherwise described herein. The upper zone 90B may be bounded from below by curve 92A corresponding to a Planckian offset Delta u'v' value of (positive) 0.007, from above by curve 93B corresponding to a Planckian offset Delta u'v' value of (positive) 0.05, from the left by line 95B corresponding to a CCT value of 10,000K, from the right by line 94B corresponding to a CCT value of 2,500K. An artificial boundary line 96B is shown at the left portion of FIG. 11, but it is to be recognized that in certain embodiments, the leftmost boundary of the zone 90B may extend into further portions of the CIE 1976 diagram not shown in the excerpt of FIG. 5, to an intersection of line 95B and curve 93B. The lower zone 80B may be bounded from above by curve 81B corresponding to a Planckian offset Delta u'v' value of negative 0.012, from below by curve 82B corresponding to a Planckian offset Delta u'v' value of negative 0.05, from the left by line 83B corresponding to a CCT value of 10,000K, and from the right by line 84B corresponding to a CCT value of 2,500K. In certain embodiments, one or more first solid state emitters (optionally arranged to stimulate emissions of one or more lumiphors) may be arranged to generate a first color point in the upper zone 90A, one or more second solid state emitters (optionally arranged to stimulate emissions of one or more lumiphors) may be arranged to generate a second color point in the lower zone 80A, and a combination of light resulting from a mixture of the foregoing emitters may embody a (combined) color point within one of the regions 30, 30, 50, 60, or 70 illustrated in FIGS. 5-9, or within regions or subregions otherwise described herein. It is to be recognized that the various sub-zones of the zones 80B, 90B are contemplated within the scope of the present disclosure, according to various CCT and/or Planckian offset Delta u'v' value ranges specified herein. In certain embodiments, relative outputs of the first and second emitters may be adjusted in order to adjust the (combined) color point.

FIGS. 12A-12E in combination embody a table providing numerical results for modeling of 151 solid state lighting devices each including an orange or red LED (source 1a), a yellow or yellow/green phosphor (source 2a), and a blue LED (source 3a), including device number, CIE 1931 x,y coordinates of combined emissions, dominant LED wavelength (dm), correlated color temperature (cct), S/P ratio, CRI Ra, R9 color rendering, color quality scale (CQS), gamut area index (GAI), source identifiers, lumen percentage for each individual source, CIE 1931 x,y coordinates for each individual source, dominant wavelength (dm) for each individual source, and peak wavelength (pk) for each individual source. As shown in the last six columns of FIGS. 12A-12E, source 1a includes sources with dominant wavelengths in a range of from 613 nm to 623 nm and peak wavelengths in a range of from 620 nm to 632 nm; source 2a includes sources with dominant wavelengths in a range of from 558 nm to 569 nm and peak wavelengths in a range of from 532 nm to 541 nm; and source 3a includes sources with dominant wavelengths in a range of from 447 nm to 470 nm and peak wavelengths in a range of from 440 nm to 465 nm. The fourth through tenth columns of FIGS. 12A-12E show that for each device, aggregated emissions (embodying the combination of source 1a, 2a, and 3a) include a dominant wavelength in a range of from 583 nm to 605 nm, CCT in a range of from 3879K to 2125K, S/P ratio in a range of from 1.12 to 2.02, CRI Ra in a range of from 80 to 95, R9 (R9 color rendering value) in a range of from 16 to 98, color quality scale in a range of from 71 to 93, and GAI in a range of from 80 to 100.

In certain embodiments, solid state lighting devices may include (i) at least one lumiphoric material combined with at least one solid state emitter (e.g., two LEDs and a lumiphoric material), such as described in connection with FIG. 13A, or (ii) with multiple LEDs devoid of any lumiphoric material, such as described in connection with FIG. 14A. In certain embodiments, a solid state lighting device including multiple LEDs devoid of a lumiphor may include at least one LED comprising a dominant wavelength in a range of from 440 nm to 460 nm, at least one LED comprising a dominant wavelength in a range of from 535 nm to 560 nm, and at least one LED comprising a dominant wavelength in a range of from 590 nm to 620 nm.

FIG. 13A is a table including numerical results for modeling of a solid state lighting device including an orange (606 nm dominant wavelength) LED, a blue (450 nm dominant wavelength) LED, and a green phosphor (P1LuGaAg 4), yielding composite emissions with a CCT of 3511K, a CRI Ra value of 80, and a GAI value of 100. For the individual LEDs and the phosphor, FIG. 13A provides CIE 1931 x and y coordinates, CIE 1976 u' and v' coordinates, dominant wavelength, and relative intensity (arbitrary units). For the combined emissions, FIG. 13A further provides CIE 1931 x and y coordinates, CCT, CRI Ra, R9 color rendering, GAI, color quality scale (CQS), S/P ratio, luminous efficacy, du'v' (BBL/DLL), and duv values. FIG. 13B is an excerpt of a CIE 1931 chromaticity diagram showing the blackbody locus, a portion of the line of minimum tint (or white body line), and the following items for the LEDs and phosphor of FIG. 13A: tie lines, gamut area, and composite color point. As demonstrated in FIG. 13A, a combination of high CRI (CRI Ra≥80) and high GAI (80≤GAI≤100) may be obtained with a lighting device utilizing two LEDs in combination with one lumiphoric material. The resulting color point (as shown by the X symbol in FIG. 13B) is below the blackbody locus and proximate to the white body line.

FIG. 14A is a table including numerical results for modeling of a solid state lighting device including an orange/red (617 nm dominant wavelength) LED, a blue (455 nm dominant wavelength) LED, and a yellow phosphor (NYAG 7), yielding composite emissions with 521 pupil lumens, a CCT of 2999K, a CRI Ra value of 91, and a GAI value of 83%. For the individual LEDs and the phosphor, FIG. 14A provides CIE 1931 x and y coordinates, CIE 1976 u' and v' coordinates, dominant wavelength, and relative intensity (arbitrary units). For the combined emissions, FIG. 14A further provides CIE 1931 x and y coordinates, CCT, CRI Ra, R9 color rendering, GAI, color quality scale (CQS), S/P ratio, luminous efficacy, du'v' (BBL/DLL), and duv values. FIG. 14B is a CIE 1931 chromaticity diagram showing the blackbody locus, a portion of the line of minimum tint (or white body line), and the following items for the LEDs and phosphor of FIG. 14A: tie lines, gamut area, and composite color point (output). As demonstrated in FIG. 14A, a combination of high CRI Ra (CRI Ra≥80 and high GAI (80≤GAI≤100) and device output of greater than 500 (pupil) lumens may be obtained with a lighting device utilizing two LEDs in combination with one lumiphoric material. The resulting color point (as shown by the X symbol in FIG. 14B) is below the blackbody locus and proximate to the white body line.

Although FIGS. 13B and 14B depict attainment of color points proximate to the WBL, it is to be appreciated that color points attainable by devices according to the present disclosure are not limited to points that coincide with the WBL.

FIG. 15A illustrates a solid state emitter package 100 including multiple solid state light emitters as described herein. The emitter package 100 includes multiple (e.g., four) LED chips 150A-150D that may be separately controlled (e.g., via backside anodes 121A-121D and cathodes 122A-122D) and that are supported by an insulating substrate 110. The substrate 110, which may preferably comprise a ceramic material, includes an upper surface 111, a lower surface 112, and side walls 113-116 extending between the upper surface 111 and the lower surface 112. Electrical traces 140 are arranged over the substrate 110, including multiple die attach pads 141A-141D and additional electrical elements 142A-142D arranged proximate to the die attach pads 141A-141D. Where the die attach pads 141A-141D are electrically conductive, the LED chips 150A-150D may be arranged with bottom side contacts thereof in electrical communication with the die attach pads 141A-141D, and with top side contacts thereof in electrical communication with the electrical elements 142A-142D by way of wirebonds 152. The die attach pads 141A-141D and electrical elements 142A-142D may comprise one or more metals patterned on (or in) the top surface 111 of the substrate 110. Gaps 145 may be provided between adjacent die attach pads 141A-141D and/or electrical elements 142A-142D to prevent undesired conductive electrical communication. In certain embodiments, die attach pads need not be electrically conductive, such as in cases where anode and cathode connections to a solid state emitter chip are both made with wirebonds. An insulating soldermask 147 is patterned over peripheral portions of the electrical traces 140, and a molded lens 160 (e.g., including a raised or hemispherical portion 161 and a base portion 162) is arranged over the top surface 111 of the substrate 110 and is arranged to transmit at least a portion of light generated by the emitter chips 150A-150D.

LED chips 150A-150D of any suitable peak wavelength (e.g., color) may be used, and one, some, or all of the chips 150A-150D may be arranged to stimulate emissions of one or more lumiphors (e.g., phosphors). Although some or all of the LED chips 150A-150D may be separately controlled, in certain embodiments groups of two or more LED chips 150A-150D or groups of LED chips may be controlled together in a groupwise fashion. As noted previously, the package 100 may embody one or more LED components, with each LED component comprising at least one LED chip 150A-150D (optionally multiple LED chips), with one or more LED chips 150A-150D optionally arranged to stimulate emissions of one or more lumiphoric materials. In certain embodiments, the solid state emitter package 100 may include two LED components, with each LED component including two LED chips 150A-150D. In certain embodiments, the solid state emitter package 100 may include one, two, three, or four LED components. Although four LED chips 150A-150D are illustrated in FIG. 15A, it is to be appreciated that a LED package may include any desirable number of LED chips, including groups of chips arranged in series, in parallel, or in series-parallel configurations.

FIG. 15B is a bottom plan view of each of the emitter package 100 of FIG. 15A. A bottom surface 112 of the substrate includes four anodes 121A-121D and four cathodes 122A-122D patterned thereon (e.g., as electrical traces), with one paired anode/cathode per quadrant. The separate anodes 121A-121D and cathodes 122A-122D enable separate control of the multiple solid state emitters (e.g., LED chips) 150A-150B if desired. The various anodes 121A-121D and cathodes 122A-122D are separated by gaps that may be filled with solder mask material sections 127-1, 127-2. A thermal element (e.g., thermal spreading element) 126 may be arranged along the bottom surface 112 between the solder mask material sections 127-1, 127-2 and generally underlapping the LEDs 150A-150D. The thickness of the thermal element 126 may be the same as or different from (e.g., thicker than) the anodes 121A-121D and cathodes 122A-122D. As shown, the package 100 is devoid of any anode or cathode arranged on, or extending laterally beyond, any side wall 113-116 thereof.

Figure 16A:
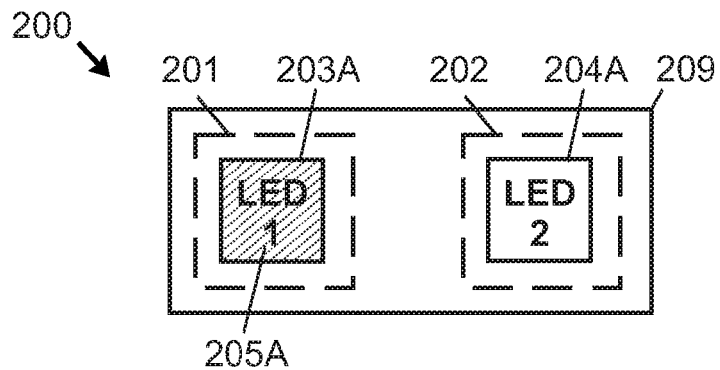
FIG. 16A is a schematic view of a first lighting device including first and second solid state emitters (e.g., including LEDs) arranged on a single submount or substrate.

FIG. 16A illustrates a lighting emitting device 200 including first and second emitter components 201, 202 supported in or on a substrate or other body structure 209. The first and second emitter components 201, 202 each include at least one LED chip 203A-203B, wherein any one or more of the LED chips 203A-203B may be optionally arranged to stimulate emissions of one or more lumiphoric materials (e.g., such as lumiphor 205A arranged to be stimulated by LED chip 203A). Although FIG. 16A illustrates one LED chip 203A-203B as being associated with each emitter component 201, 202, it is to be appreciated that any suitable number (e.g., two, three, four, five, six or more, etc.) of LED chips may be associated with one or more emitter components in certain embodiments.

Figure 16B:
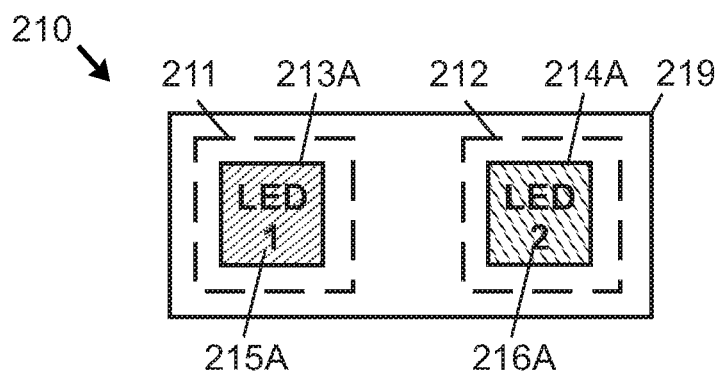
FIG. 16B is a schematic view of a second lighting device including first and second solid state emitters arranged on a single submount or substrate.

FIG. 16B illustrates a lighting emitting device 210 including first and second emitter components 211, 212 supported in or on a substrate or other body structure 219. The first and second emitter components 211, 212 each include at least one LED chip 213A-213B, wherein any one or more of the LED chips 213A-213B may be optionally arranged to stimulate emissions of one or more lumiphoric materials (e.g., such as a first lumiphor 215A arranged to be stimulated by a first LED chip 213A and a second lumiphor 216A arranged to be stimulated by a second LED chip 214A).

Figure 16C:
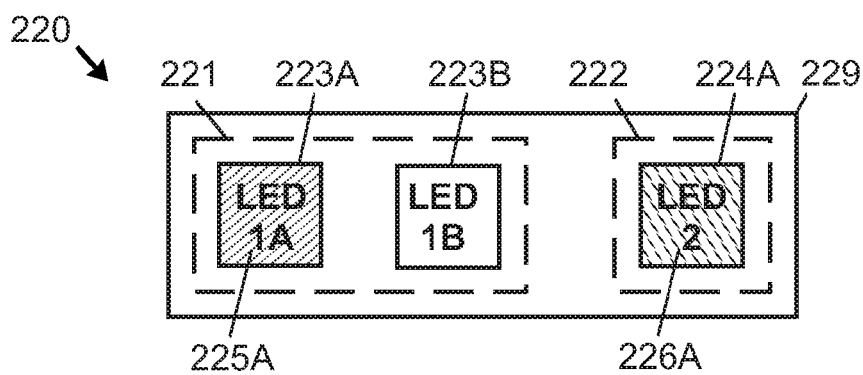
FIG. 16C is a schematic view of a third lighting device including a pair of solid state emitters arranged in a first mounting region and another solid state emitter arranged in a second mounting region, all arranged on a single submount or substrate.

FIG. 16C illustrates a lighting emitting device 220 including first and second emitter components 221, 222 supported in or on a substrate (or other body structure) 229. The first emitter component 221 includes LED chips 223A, 223B with a first LED chip 223A arranged to stimulate emissions of a first lumiphor 225A, and the second emitter component 222 includes a LED chip 224A arranged to stimulate emissions of a second lumiphor 226A. In certain embodiments, any suitable number of LED chips and lumiphors may be provided in each emitter component, and additional emitter components (not shown) may be supported by the substrate 229.

Figure 16D:
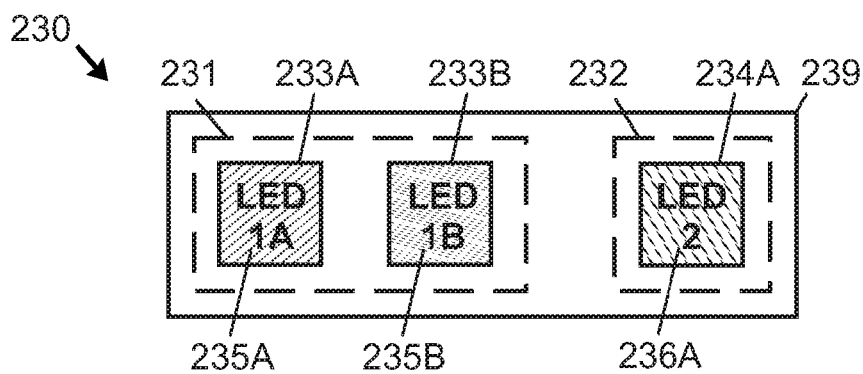
FIG. 16D is a schematic view of a fourth lighting device including a pair of solid state emitters arranged in a first mounting region and another solid state emitter arranged in a second mounting region, all arranged on a single submount or substrate.

FIG. 16D illustrates a lighting emitting device 230 including first and second emitter components 231, 232 supported in or on a substrate or other body structure 239. The first emitter component 231 includes a first LED chip 233A arranged to stimulate emissions of a first lumiphor 235A and a second LED chip 233B arranged to stimulate emissions of a second lumiphor 235B, and the second emitter component 232 includes a LED chip 234A arranged to stimulate emissions of another lumiphor 236A. In certain embodiments, any suitable number of LED chips and lumiphors may be provided in each emitter component, and additional emitter components (not shown) may be supported by the substrate 239.

FIG. 16E illustrates a lighting emitting device 240 including first and second emitter components 241, 242 supported in or on a substrate or other body structure 249. The first emitter component 241 includes a first LED chip 243A arranged to stimulate emissions of a first lumiphor 245A and a second LED chip 243B arranged to stimulate emissions of a second lumiphor 245B. The second emitter component 242 includes a first LED chip 244A arranged to stimulate emissions of a first lumiphor 246A and a second LED chip 244B arranged to stimulate emissions of a second lumiphor 246B. One or more lumiphoric materials of the lumiphors 245A, 245B, 246A, 246B may be the same or different in the respective emitter components 241, 242. In certain embodiments, any suitable number of LED chips and lumiphors may be provided in each emitter component, and additional emitter components (not shown) may be supported by the substrate 249.

FIG. 16F illustrates a lighting emitting device 250 including first and second emitter components 251, 252 supported in or on a substrate or other body structure 259. The first emitter component 251 includes a first LED chip 253A arranged to stimulate emissions of a first lumiphor 255A in addition to a second LED chip 253B, and the second emitter component 252 includes a first LED chip 254A arranged to stimulate emissions of a first lumiphor 256A in addition to a second LED chip 254B. In certain embodiments, any suitable number of LED chips and lumiphors may be provided in each emitter component, and additional emitter components (not shown) may be supported by the substrate 259.

With general reference to FIGS. 16A-16F, the first and second emitter components in each instance may embody any suitable LED chips, lumiphors, features, and/or capabilities as described herein, and are preferably separately controllable (but may be controlled together). Additional emitter components (not shown) including one or more LED chips may be further provided in or on the substrate in each instance. In embodiments including one or more emitter components with multiple LEDs, each LED within a single LED component may be individually controlled, or groups of two or more LEDs within a single component may be controlled together.

With continued reference to FIGS. 16A-16F, in certain embodiments each first emitter component may be arranged to produce emissions (or a mixture of emissions) having a first color point, each second emitter component may be arranged to produce emissions (or a mixture of emissions) have a second color point, and a mixture of light generated by the respective first and second emitter component for each device may be arranged to yield an aggregate color point. In certain embodiments, adjustment of current or current pulse width to the first emitter component (and/or individual emitters thereof) relative to the second emitter component may be used to adjust the aggregate color point.

FIG. 16G illustrates a portion of a first control circuit arranged to control multiple strings 281, 282, 283 of solid state emitters (e.g., LEDs) 293a, 293b, 294a, 294b, 295a, 295b all being electrically connected to a common power line 280. Connected to the first string 281 are a first current regulating element 285 and a first group of LEDs 293A, 293B, which may be arranged to output the same of different dominant wavelengths, and may optionally be arranged to stimulate emissions of one or more lumiphoric materials. Connected to the second string 282 are a second current regulating element 286 and a second group of LEDs 294A, 294B, which may be arranged to output the same of different dominant wavelengths, and may optionally be arranged to stimulate emissions of one or more lumiphoric materials. Connected to the third string 283 are a third current regulating element 287 and a third group of LEDs 295A, 295B, which may be arranged to output the same of different dominant wavelengths, and may optionally be arranged to stimulate emissions of one or more lumiphoric materials. The current regulating elements 285-287 may be used to regulate currents through the respective strings 281-283 to any desired value. Such current regulating elements 285-287 may be adjustable in certain embodiments. In certain embodiments, the number of LEDs in each string 281-283 may be the same or different.

FIGS. 17A-17G illustrate exemplary portions of solid state lighting devices incorporating electrically activated solid state light emitters and lumiphoric materials, which may be used alone or in groups according to certain embodiments described herein. It is to be appreciated that various structures employed within complete lighting devices (e.g., package leads, leadframes, contacts, wirebonds, bond structures, heat transfer elements, light extracting optics, diffusers, additional reflecting surfaces, power supplies, and the like) have been omitted for clarity of illustration, but one skilled in the art would appreciate that known structures could be incorporated in operative lighting devices including the illustrative portions provided in the figures.

FIG. 17A is a side cross-sectional schematic view of a portion of a solid state lighting device 300 including at least one electrically activated solid state light emitter (e.g., LED) 304, a reflector cup 302 or other support structure on or over which the LED 304 is mounted, and (optionally) at least one lumiphor (e.g., phosphor) 307 dispersed in an encapsulant material disposed over the LED 304 and within the reflector cup 302. Although FIG. 17A illustrates the at least one lumiphor 307 as being dispersed in an encapsulant material, in various embodiments one or more lumiphors (e.g., phosphors) may be disposed in any suitable conformation to receive emissions from a solid state (e.g., LED) emitter and responsively re-emit light. In certain embodiments, at least one lumiphor may be coated directly on or over a solid state emitter. In certain embodiments, one or more lumiphors may be arranged in separate layers that may be spatially separated from each solid state emitter and/or one another. In certain embodiments, the device 300 including a lumiphor may be utilized in conjunction with a comparable device including a LED but lacking a lumiphor.

FIG. 17B is a side cross-sectional schematic view of a portion of a solid state lighting device 310 including at least one electrically activated solid state emitter (e.g., LED) 314, a reflector cup 312 or other support structure on or over which the solid state emitter 314 is mounted, and multiple lumiphors (e.g., phosphors) 318, 319 arranged in layers that are spatially segregated from the solid state emitter 314. An encapsulant 316 may be disposed between the solid state emitter 314 and the lumiphors 318, 319; alternatively, at least one void may be arranged between the solid state emitter 314 and the lumiphors 318, 319 to reduce conductive thermal coupling therebetween. In certain embodiments, the device 310 including at least one lumiphor may be utilized in conjunction with a comparable device including a LED but lacking a lumiphor.

FIG. 17C is a side cross-sectional schematic view of a portion of a solid state lighting device 320 including first and second solid state emitters (e.g., LEDs) 324, 325, a reflector cup 322 or other support structure on or over which the solid state emitters 324, 325 are mounted, and at least one lumiphor (e.g., phosphor) 327 dispersed in an encapsulant material disposed over the solid state emitters 324, 325 and within the reflector cup 322. In certain embodiments, multiple lumiphors 327 may be provided. In one embodiment, one or more lumiphors may be arranged to interact with only a single solid state emitter 324, 325. At least one lumiphor may be disposed in an amount (e.g., thickness, width, etc.) or concentration that varies with respect to position within a solid state lighting device, such embodied in variations of presence, amount or concentration with respect to one or more solid state emitters. For example, at least one lumiphor may be coated over or arranged over one solid state emitter, and not arranged over (or arranged in a different thickness or concentration over) another solid state emitter. In certain embodiments, the excitation (or stimulation) wavelength range of the lumiphor 327 may correspond with output wavelength range (e.g., at least overlapping with a full width half maximum output) of one LED 324, but not correspond with output wavelength range of another LED 325.

In certain embodiments, a solid state lighting device may include multiple electrically activated solid state emitters (e.g., LEDs) and one or more lumiphors (e.g., phosphors) arranged in one or more layers spatially separated from the solid state emitters. FIG. 17D is a side cross-sectional schematic view of a portion of a solid state lighting device 330 including first and second solid state emitters (e.g., LEDs) 334, 335, a reflector cup 332 or similar support structure on or over which the solid state emitters 334, 335 are mounted, and one or more lumiphors (e.g., phosphors) 338, 339 arranged in layers that are spatially segregated from the solid state emitters 334, 335. An encapsulant 336 or other material may be disposed between the solid state emitters 334, 335 and the lumiphors 338, 339; alternatively, the solid state emitters 334, 335 and lumiphors 338, 339 may be separated by a gap. In one embodiment, the lumiphors 338, 339 may be arranged in alternating layers including at least two non-adjacent layers including lumiphors of substantially same material composition. One advantage of confining different lumiphors to different layers is to avoid undue absorption of emission spectrum of one lumiphor that may overlap with excitation spectrum of another lumiphor (e.g., excitation spectrum of a red phosphor may overlap with emission spectrum of a yellow phosphor) which would result in loss of efficiency). In certain embodiments, presence of a lumiphoric material may be non-uniform (e.g., patterned) within an individual lumiphor layer. In certain embodiments, a lumiphoric material layer may have a thickness that is non-uniform with respect to position.

FIG. 17E is a side cross-sectional schematic view of a portion of a solid state lighting device 340 including first and second electrically activated solid state emitters (e.g., LEDs) 344, 345, a reflector cup 342 or other support structure on or over which the LEDs 344, 345 are mounted, and at least one lumiphor 348 arranged to interact only (or primarily only) with a single LED 344. In certain embodiments, the at least one lumiphor 348 may be coated or deposited on or over a first solid state emitter 344 but omitted from the second solid state emitter 345. In certain embodiments, the at least one lumiphor 348 may include a mixture of multiple lumiphors, and/or multiple layers of lumiphors having different material compositions. In certain embodiments, a first LED 344 may comprise a dominant wavelength in a range of 430 nm to 480 nm (or a subrange of from 440 nm to 460 nm), a second LED 345 may comprise a dominant wavelength in a range of from 590 nm to 650 nm (or a subrange of from 600 nm to 630 nm), and the lumiphoric material may comprise a dominant wavelength in a range of from 535 nm to 585 nm.

FIG. 17F is a side cross-sectional schematic view of a portion of a solid state lighting device 350 including first and second electrically activated solid state emitters (LEDs) 355, 355, a reflector cup 352 or other support structure on or over which the LEDs 354, 355 are mounted, a first lumiphor 358 arranged to interact only (or primarily only) with a first LED 354, and a second lumiphor 359 arranged to interact only (or primarily only) with a second LED 355. In certain embodiments, the lumiphors 358, 359 may be separately coated or deposited over the respective first and second LEDs 354, 355.

FIGS. 18A-18F illustrate exemplary portions of solid state lighting devices in different configurations incorporating electrically activated solid state light emitters arranged over package mounts (or other substrates), with solid state light emitters overlaid with lumiphoric materials and notch filtering materials and optionally overlaid with lenses, wherein such devices may be used alone or in groups according to certain embodiments described herein.

Figure 18A:
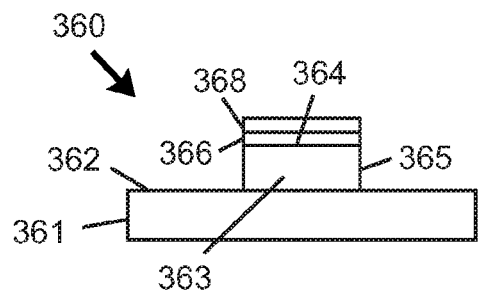
FIG. 18A is a side cross-sectional schematic view of at least a portion of a solid state light emitting device including a solid state emitter chip arranged over a package mount, with a top surface of the emitter chip being covered with a wavelength conversion material and a filtering (e.g., notch filtering) material.

FIG. 18A illustrates a solid state light emitting device 360 including a solid state emitter (e.g., LED) chip 363 (which may include LED epitaxial layers and a support) arranged over a top surface 362 of a package mount (or other substrate) 361, with a top surface 364 of the emitter chip 363 being covered with a lumiphoric material 366 (e.g., in a first layer) and a filtering material 368 (e.g., in a second layer), which may embody a notch filtering material. The package mount 361 may include metalized regions and/or vias (not shown) for conduction of electrical signals to the emitter chip 363. Side surfaces 365 of the emitter chip 363 may be exposed or otherwise coated with one or more of lumiphoric material and notch filtering material. In certain embodiments, the LED chip 363 may be coated with a lumiphoric material 366 and a notch filtering material 368, and thereafter the pre-coated LED chip 363 may be mounted to the package mount 361 followed by establishment of suitable electrically conductive connection(s) to the LED chip 363. Coating may be performed according to any suitable process, such as spray coating.

Figure 18B:
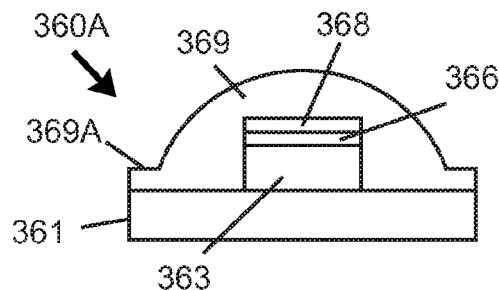
FIG. 18B is a side cross-sectional schematic view of at least a portion of a solid state light emitting device including the device of FIG. 18A with addition of a curved (e.g., hemispherical) lens.

FIG. 18B illustrates a solid state light emitting device 360A including the device 360 of FIG. 18A following addition of a lens 369 having a curved (e.g., substantially hemispherical) shape. Such lens 369 may be formed by any suitable method, including but not limited to molding using silicone material. In certain embodiments, the lens 369 may have a width or lateral extent that is substantially equal to a width or lateral extent of the package mount 361, and a peripheral portion 369A of the lens 369 may have a substantially uniform thickness.

Figure 18C:
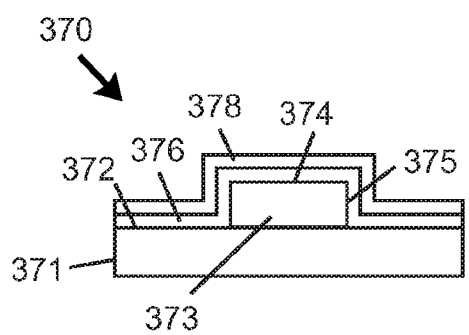
FIG. 18C is a side cross-sectional schematic view of at least a portion of a solid state light emitting device including a solid state emitter chip arranged over a package mount, with top and side surfaces of the emitter chip and an upper surface of the package mount being covered with a wavelength conversion material and a filtering material.

FIG. 18C illustrates a solid state light emitting device 370 including a solid state emitter (e.g., LED) chip 373 (which may include LED epitaxial layers and a support) arranged over an upper surface 372 of a package mount (or other substrate) 371, with a top surface 374 and side surfaces 375 of the emitter chip 373, as well as an upper surface 372 of the package mount 371, being covered with a wavelength conversion (lumiphoric) material 376 (e.g., in a first layer) and a filtering material 378 (e.g., in a second layer) which may embody a notch filtering material. In certain embodiments, the LED chip 373 may be mounted to the package mount 371, and thereafter the LED chip 373 and upper surface 372 of the package mount 371 may be coated with a lumiphoric material 376 and a notch filtering material 378. Coating may be performed according to any suitable process, such as spray coating. Such materials 376, 378 may be arranged in conformal layers that follow the shape and outline of multiple surfaces of the emitter chip 373. Electrical connections to the LED chip 373 may be made either before or after coating steps.

Figure 18D:
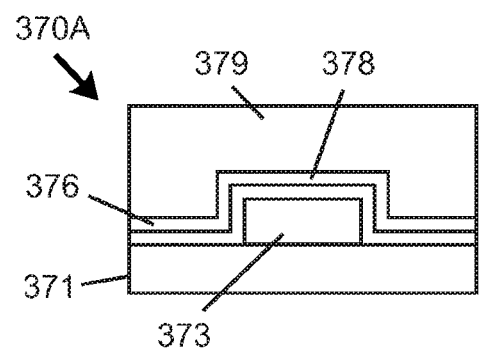
FIG. 18D is a side cross-sectional schematic view of at least a portion of a solid state light emitting device including the device of FIG. 18C with addition of a lens having a substantially rectangular cross-sectional shape.

FIG. 18D illustrates a solid state light emitting device 370A including the device 370 of FIG. 18A following addition of a lens 379 having a substantially rectangular cross-sectional curved (e.g., substantially hemispherical) shape. Such lens 379 may be formed by any suitable method, including but not limited to molding using silicone material. In certain embodiments, the lens 379 may have a width or lateral extent that is substantially equal to a width or lateral extent of the package mount 371.

Figure 18E:
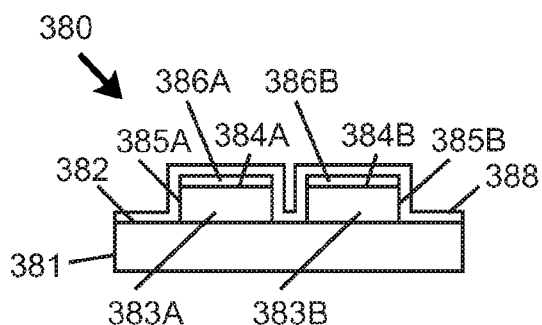
FIG. 18E is a side cross-sectional schematic view of at least a portion of a solid state light emitting device including a solid state emitter chip arranged over a package mount, with a top surface of the emitter chip being covered with a wavelength conversion material and a filtering material, and with side surfaces of the emitter chip and an upper surface of the package mount being covered with a filtering material.

FIG. 18E illustrates a solid state light emitting device 380 including first and second solid state emitter chips 383A, 383B arranged over a package mount 381, with top surfaces 384A, 384B of the emitter chips 383A, 383B being covered with a wavelength conversion materials 386A, 386B and a filtering (e.g., notch filtering) material 388, and with side surfaces 385A, 385B of the emitter chips 383A, 383B and an upper surface 382 of the package mount 381 being covered with a filtering material 388. In certain embodiments, the LED chips 383A, 383B may be pre-coated with the wavelength conversion materials 386A, 386B, then mounted to the package mount 381, and thereafter the pre-coated LED chips 383A, 383B and upper surface 382 of the package mount 381 may be coated with a notch filtering material 388. Coating may be performed according to any suitable process disclosed herein, such as spray coating. The notch filtering material 388 may be arranged in a conformal layer that follows the shape and outline of multiple surfaces of the emitter chips 383A, 383B. Electrical connections to the LED chips 383A, 383b may be made either before or after a notch filtering material coating step.

Figure 18F:
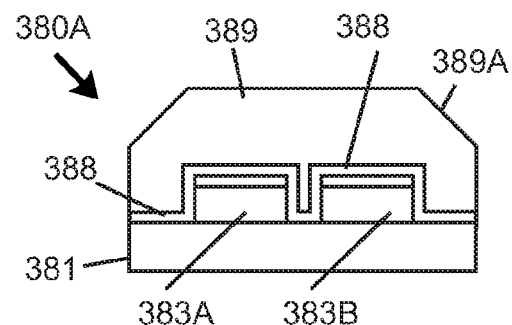
FIG. 18F is a side cross-sectional schematic view of at least a portion of a solid state light emitting device including the device of FIG. 18E with addition of a lens having a beveled upper edge with a non-rectangular (polygonal) cross-sectional shape.

FIG. 18F illustrates a solid state light emitting device 380A including the device 380 of FIG. 18E with addition of a lens 389 having a beveled upper edge 389A with a non-rectangular (polygonal) cross-sectional shape. Such lens 389 may be formed by any suitable method, including but not limited to molding using silicone material. In certain embodiments, the lens 389 may have a width or lateral extent that is substantially equal to a width or lateral extent of the package mount 381.

It is to be appreciated that lenses according to the shapes shown in any of FIGS. 18B, 18D, and 18F may be applied to any of the devices 360, 370, and 380 according to FIGS. 18A, 18C, and 18E.

FIG. 19 is a side cross-sectional view of at least a portion of a solid state light emitting device 390 including multiple solid state emitter (e.g., LED) chips 395 arranged over a submount 391 in flip-chip configuration, with both anode and cathode connections on the bottom of the chips 395. The emitter chips 395 may (optionally) include angled or beveled upper edges with a non-rectangular (e.g., polygonal) cross-section, with such shape serving to enhance light extraction. One or more emitter chips 395 may optionally be coated with one or more functional materials (e.g., lumiphoric material, notch filtering material, etc.) in conformal layers 396, 397 and arranged under a hemispherical optical element (e.g., lens) 390, with the conformal layers 396, 397 following the shape and contour of multiple surfaces of the emitter chips 395 (preferably with substantially constant thickness). Such coating may be performed using any coating technique disclosed herein or otherwise known in the art. As shown in FIG. 19, each conformal layer 396, 397 may extend over, between and laterally beyond the chips 395 (such as over a reflective material disposed between or adjacent to the emitter chips 395). The optical element 399 may be separated from the emitter chips 395 via a gap or an intervening material 398, which may include encapsulant or a fluid medium such as liquid or gel (e.g., mineral oil, perfluorinated polyether (PFPE) liquid, or other fluorinated or halogenated liquid or gel). Such material 398 may also include an index matching medium characterized by a refractive index that provides for reduced or minimal reflection or internal refraction of light emissions. In certain embodiments, elements 398, 399 may embody a single element, such as molded silicone. In certain embodiments, a thickness of each conformal layer may be less than half the spacing between adjacent emitter chips 395. In certain embodiments, spacing between emitter chips 395 may be on the order of 10 to 75 micrometers, although larger spacing (up to 150 or even 500 micrometers) may also be used. In certain embodiments, the optical element 399 may include one or more functional materials, such as lumiphoric material, notch filtering material, and/or scattering material, which may be doped, coated, or otherwise provided in or on the optical element 399. With continued reference to FIG. 19, the submount 391 (e.g., alumina, aluminum nitride, high temperature polymers, etc.) is covered with a pattern of metal (e.g., traces) 393 that may be used to interconnect the emitter chips 395 and provide connection to a power supply. The metal pattern 393 includes connection pads 392 with insulating material 394 therebetween. In operation of the device 390, upon passage of light through one or more notch filtering materials (e.g., associated with layers 396, 397 and/or the optical element 399), the light will exhibit a spectral notch, and the notch filtering may be tailored to increase GAI and/or enhance CRI Ra.

FIG. 20 illustrates a solid state emitter package 400 including multiple solid state emitter (e.g., LED) chips 405 coupled to electrical traces or metal patterns 402 via wirebonds 416 and arranged under a hemispherical optical element (e.g., lens) 410. In certain embodiments, one or more chips may be coated with one or more functional materials (e.g., lumiphoric material and notch filtering material). As shown, twelve emitter chips 405 are provided in contact with the metal traces 402 arranged over submount 401, and cathodes of the LED chips are connected by wirebonds 416 to traces 402. In certain embodiments, the optical element 410 may include one or more functional materials, such as lumiphoric material, notch filtering material, and/or scattering material, which may be doped, coated, or otherwise provided in or on the optical element 410. The emitter chips 405 may be selected from various light color bins to provide a combined light output with appropriate color characteristics for a desired application. The unfiltered efficiency of such package 400 with a warm white color may be on the order of 100 lm/W, prior to any filtering from the optical element; however, if the package 400 is binned for a cool white color, then an efficiency on the order of about 150 lm/W can be achieved (i.e., prior to any filtering).

Figure 21:
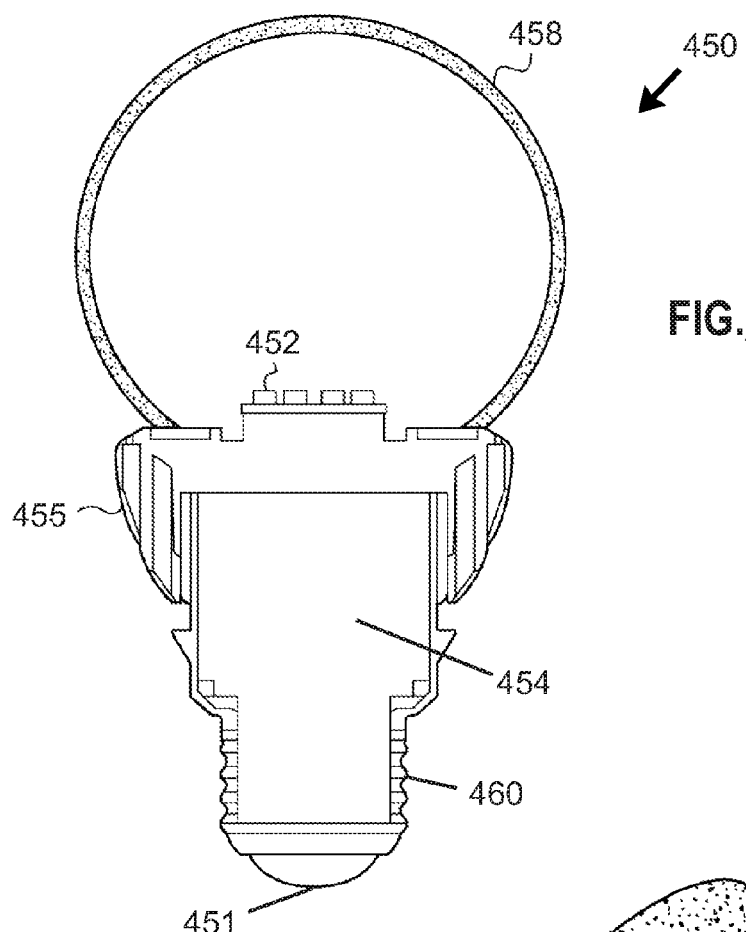
FIG. 21 is a side cross-sectional view of a first light bulb arranged to incorporate multiple solid state emitter chips as disclosed herein.

FIG. 21 illustrates a first light bulb 450 arranged to incorporate multiple solid state emitters as disclosed herein. The light bulb 450 may optionally be arranged to output notch filtered light. The solid state light bulb 450 includes a conventional power supply 454, and includes a heatsink 455 including fins to promote cooling of the emitter chips 452 and power supply 454. A lateral contact 460 and foot contact 451 may be compatible with an Edison-style screw-type light socket for conducting power to the light bulb 450. An optical element 458 (which may be embodied in a light-transmissive globe) is provided to protect the emitter chips 452 and provide light shaping and/or diffusion utility for light emissions of the bulb 450. The optical element 458 may optionally contain an intervening material (as described in connection with element 398 in FIG. 19). One or more lumiphoric materials may be associated with the emitter chips 452 and/or the optical element 458 to provide wavelength conversion utility. Additionally, one or more optional filtering materials (e.g., notch filtering materials) may be associated with the emitter chips and/or the optical element 458 to filter light emissions in order to exhibit at least one spectral notch as described herein.

Figure 22:
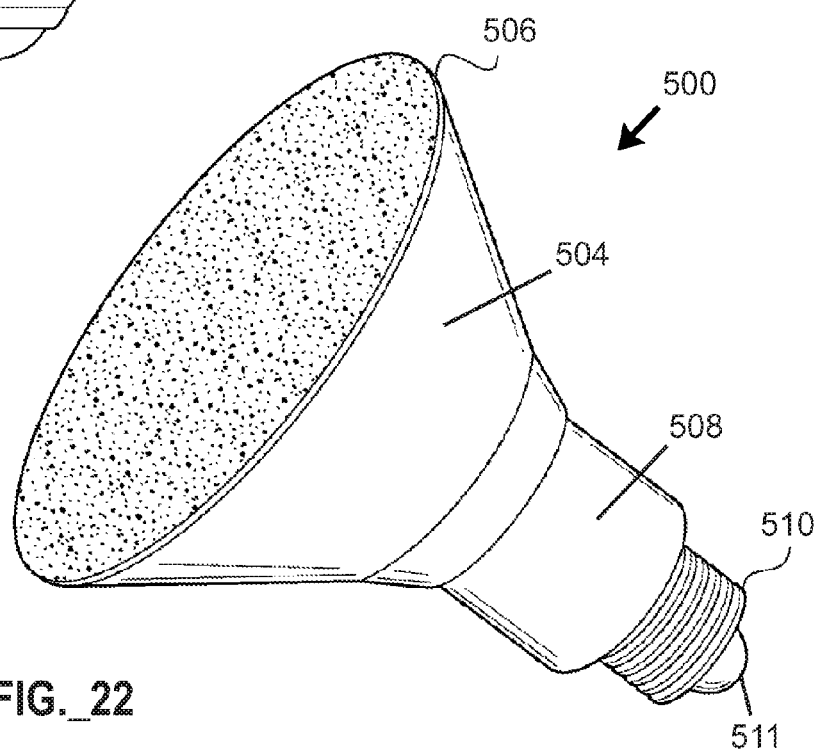
FIG. 22 is a side cross-sectional view of a second, reflector-type light bulb arranged to incorporate at least one emitter chip as disclosed herein.

FIG. 22 illustrates a second, reflector-type (i.e. PAR-style) light bulb 500 arranged to incorporate one or more solid state emitters as disclosed herein. The light bulb 500 may optionally be arranged to output notch filtered light. The light bulb 500 includes a reflector 504 and an optical element (e.g., lens) 506 covering a front or light emitting portion of the bulb 500, with the reflector 504 and lens 506 together forming a light-transmissive optical enclosure. An opposing end of the bulb includes contacts 510, 511 (e.g., an Edison-style threaded lateral contact 510 and a foot contact 511) for receiving power from a socket or other receptacle. The bulb 500 includes LED devices or dies (not visible) as previously discussed, and such components optionally may include one or more notch filtering material layers and/or one or more lumiphoric materials. Optionally, one or more filtering materials (e.g., notch filtering materials) may be associated with the optical element 506 to filter light emissions in order to exhibit at least one spectral notch as described herein. The optical element 506 may further include light scattering and/or lumiphoric materials in certain embodiments.

FIG. 23 illustrates a third light bulb arranged to incorporate multiple solid state emitters (e.g., LEDs) 627 as disclosed herein disposed in an array 628 in a tower-type configuration, such as disclosed in U.S. Patent Application Publication No. 2013/0271991 (incorporated by reference herein). The bulb 600 may embody an A-series bulb with an Edison base 602 including a lateral contact 603 and a foot contact 604. The base 602 may include a base printed circuit board 680 and electronics 610 within a housing 605, suitable for powering the bulb 600 and including a power supply and/or driver.

The bulb 600 includes multiple LEDs 627 (of which one or more may include lumiphoric material and/or a notch filtering material as disclosed herein) mounted on an upwardly-extending substantially tubular or tube-like submount (e.g., printed circuit board) 629 bounding an internal cavity 674. The LED chips 627 are operable to emit light when energized. The cavity 674 is capped by a heat conducting portion 652 that and engaging member 668 that fits with an engagement portion 666 associated with locking member 672 extending upward from an electrical interconnect 650 internal to the cavity 674. A globe-like enclosure (which may embody an optical element) 612 surrounds an interior volume containing a LED assembly 630 including the multiple emitter chips 627. A heatsink 654 is arranged between the enclosure 612 and the base 602, with a lock member 609 arranged to receive and retain deformable fingers 601 during assembly of the bulb 600. A bottom edge of the enclosure 612 abuts a top surface 654A of the heatsink 654. Internal conductors 664B are arranged to conduct electrical signals between the base PCB 680 and components of the LED assembly 630.

In certain embodiments, at least one notch filtering material may optionally be associated with one or more emitter chips 627 and/or additionally associated with the enclosure (or optical element) 612, such as to exhibit at least one spectral notch upon following passage of light emission through such filtering material. The enclosure 612 may embody an optical element and may further include light scattering and/or lumiphoric materials in certain embodiments.

Figure 24A:
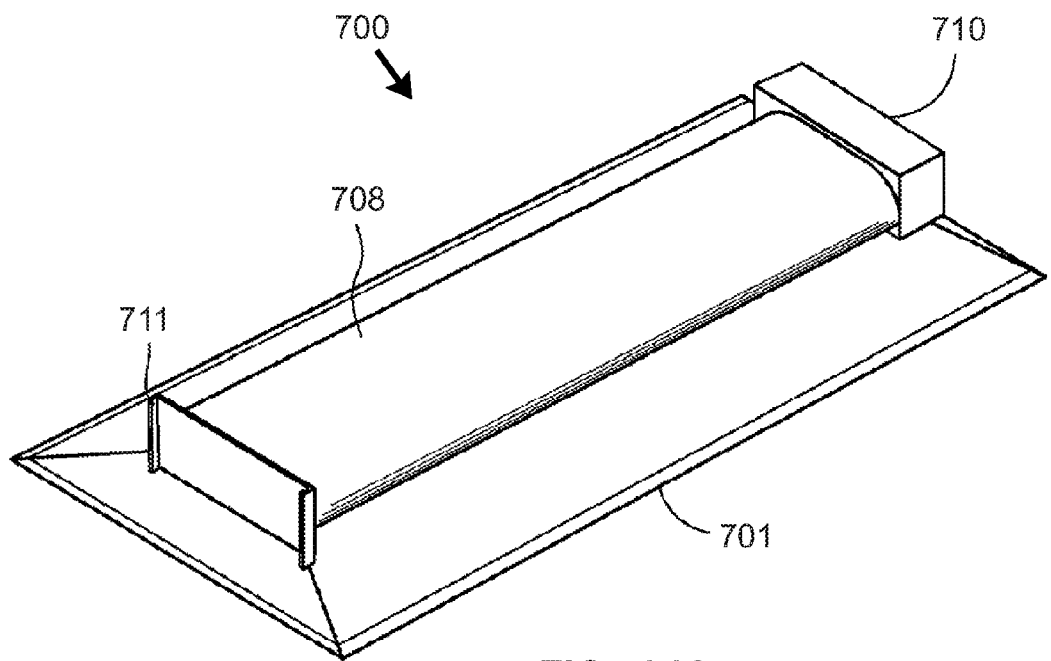
FIG. 24A is an upper perspective view of a troffer-type light fixture arranged to incorporate multiple solid state emitter chips as disclosed herein.
Figure 24B:
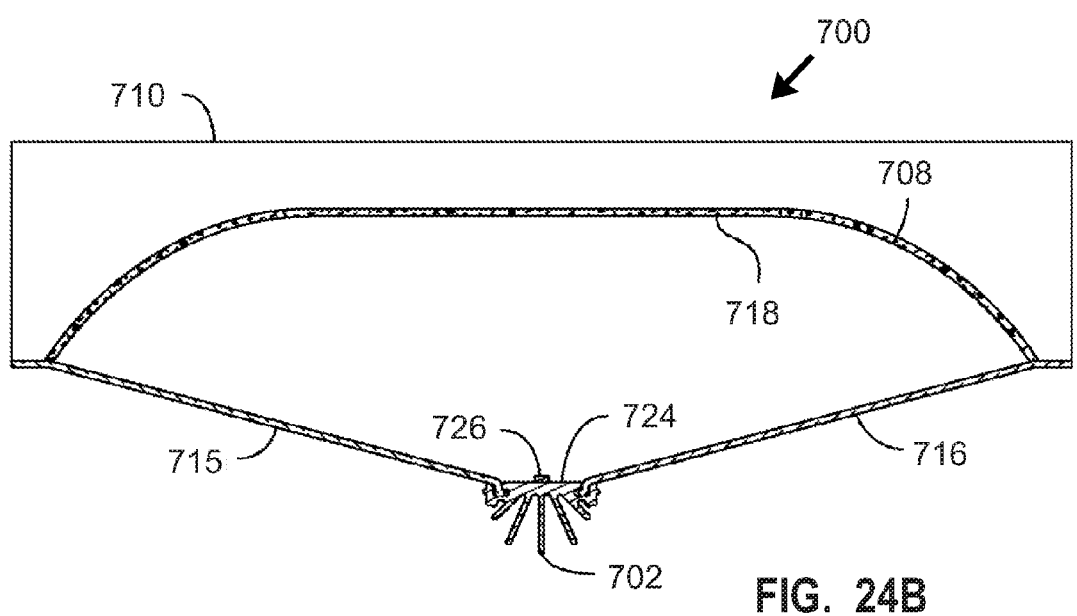
FIG. 24B is a side cross-sectional view of a portion of the light fixture of FIG. 24A.

FIGS. 24A-24B illustrate a troffer-type (in-ceiling linear) light fixture 700 arranged to incorporate multiple solid state emitters (e.g., LEDs) 726 as disclosed herein. In certain embodiments, one or more lumiphoric materials may be associated with one or more LEDs 726. Optionally, the fixture 700 may include one or more notch filtering materials, such as may be associated with emitters 726, may be applied to or included in a linear reflector (e.g., e.g., by doping, impregnation, coating, etc.), or may be applied to or integrated with one or more light transmissive lens plates 715, 716 to cause the light emitted from the light fixture to exhibit a spectral notch. Light fixture 700 includes pan 701, heatsink 702, reflector 708, and end caps 710, 711. End cap 710 is larger than end cap 711 and is shaped to act as a circuit box to house electronics used to drive and control the light source (e.g., rectifiers, regulators, timing circuitry, etc.). Although a reflector may take various shapes, in the illustrated embodiment, the reflector 708 includes a flat region opposite the heatsink 702. In alternative embodiments, the reflector 708 could be parabolic in shape, or include two or more parabolic regions. Light fixture 700 also includes a diffuser lens assembly including lens plates 715, 716, disposed adjacent to sides of the heatsink 702. Reflector 708 can be made of many different materials, including metal, polymeric material, microcellular polyethyleneterephthalate (MCPET), or other suitable materials. If notch filtering material is provided, then emissions of the LEDs 726 may interact with one or more notch filtering materials (e.g., associated with the LEDs 726, associated with the reflector 708, and/or associated with the lens plates 715, 716) such that the light will exhibit a spectral notch.

FIG. 25 illustrates a lighting apparatus (e.g., light fixture) 810 according to at least one embodiment. The apparatus 800 includes a substrate or mounting plate 875 to which multiple solid state emitter (e.g., LED) lamps 870-1 to 870-6 (optionally embodied in multi-chip lamps such as multi-chip LED packages) are attached, wherein each lamp 870-1 to 870-6 may include multiple LEDs as described herein. Each lamp 870-1 to 870-6 may optionally include a cluster of solid state emitters, including at least one lumiphor converted solid state emitter and at least one supplemental solid state emitter as disclosed herein. The mounting plate 875 may include a circular shape or any suitable shape or configuration (including non-planar and curvilinear configurations). Different solid state emitter lamps or clusters may be configured to emit the same or different colors (e.g., wavelengths) of light. With specific reference to a first solid state lamp 870-1, each solid state lamp 870-1 to 870-6 may include multiple solid state emitters (e.g., LEDs) 874A-874C preferably arranged on a single submount 861. Although FIG. 25 illustrates four solid state emitter chips as being associated with each multi-chip solid state lamp 870-1 to 870-6, it is to be appreciated that any suitable number of solid state emitter chips may be associated with each multi-chip solid state lamp 870-1 to 870-6, and the number of solid state emitter chips associated with different (e.g., multi-chip) solid state lamps may be different. Each solid state lamp in a single fixture 810 may be substantially identical to one another, or solid state lamps with different output characteristics may be intentionally provided in a single fixture 810.

The solid state lamps 870-1 to 870-6 may be grouped on the mounting plate 875 in clusters or other arrangements so that the light fixture 810 outputs a desired pattern of light. In certain embodiments, at least one state emitter lamp associated with a single fixture 810 includes a lumiphor-converted light emitting component. One or more lamps 870-1 to 870-6 may optionally include at least one notch filtering material. With continued reference to FIG. 25, the light fixture 810 may include one or more control circuit components 880 arranged to operate the lamps 870-1 to 870-6 by independently applying currents and/or adjusting duty cycle of respective LED components or groups thereof. In certain embodiments, individual solid state chip 864A-864D in various lamps 870-1 to 870-6 may be configured to be individually addressed by the control circuit components 880. In certain embodiments, the lighting fixture 810 may be self-ballasted. In certain embodiments, a control circuit 880 may include a current supply circuit configured to independently apply an on-state drive current to each individual solid state chip responsive to a control signal, and may include one or more control elements configured to selectively provide control signals to the current supply circuit. The control circuit 880 may be configured to control the current driven through the solid state emitter chips 864A-864D associated with the lamps 870-1 to 870-6 using one or more control schemes known in the art. The control circuit 880 may be attached to an opposite or back surface of the mounting plate 875, or may be provided in an enclosure or other structure (not shown) that is segregated from the apparatus 800. One or more heat dissipating structures (not shown) may be further associated with the fixture 810.

The foregoing lighting devices disclosed herein may include multiple solid state light emitters arranged to produce a mixture of light having a color point within one of the regions illustrated in FIGS. 5-9 (or regions otherwise described herein).

Figure 26:
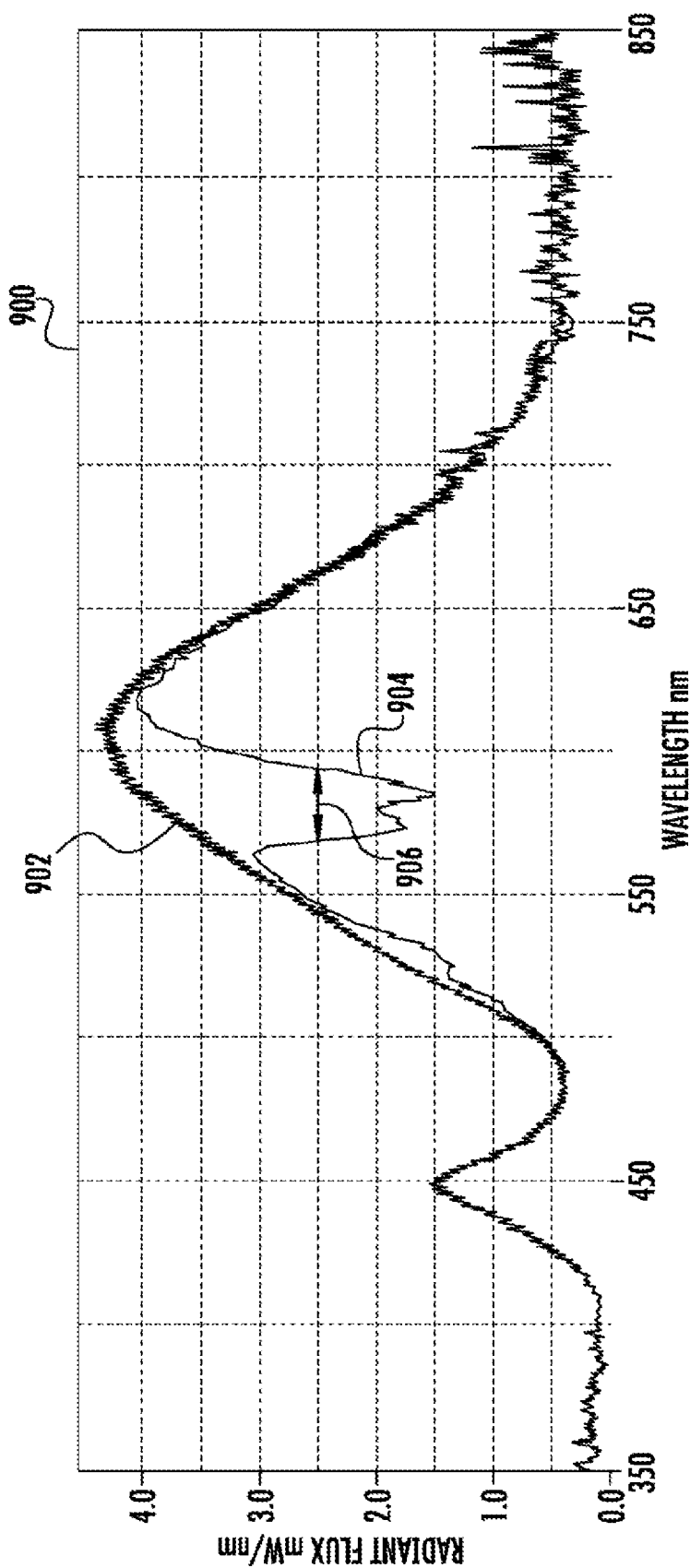
FIG. 26 is a plot of radiant flux versus wavelength for a spectral output of a solid state light emitting device with superimposed notch filtered spectral output.

FIG. 26 is a graph 900 plotting radiant flux versus wavelength for a spectral output of a solid state light emitting device with superimposed notch filtered spectral output, as relating to certain embodiments that may include one or more notch filtering materials. Curve 902 is a plot of measurements taken of the light output of an LED lamp constructed including a multi-chip LED component in a mineral-oil filled, plain glass enclosure. Curve 904 is a plot of measurements taken of the light output of an LED lamp that is the same in most respects, except that the enclosure for the lamp measured for curve 904 is neodymium oxide doped glass. A notch is clearly visible between 550 nm and 650 nm wherein radiant flux is reduced due to filtering by the neodymium oxide notch filtering material. Measurement 906 represents the width of the notch corresponding to the comparative reduction in light intensity at half the maximum reduction caused by the notch, otherwise known from the field of signal processing as the full width at half the maximum (FWHM). Relative to the peak radiant flux of approximately 4.3 mW/nm, the notch filtered region includes a radiant flux trough of between 1.5-2 mW/nm. The difference between the two curves 902, 904 represents attenuation or reduction of light intensity. The notch shown in FIG. 26 is characteristic of neodymium oxide filtering material by including a relatively sharply sloping ('hard') shape profile and is more of a true "notch," as opposed to a filtered shape with a more gently sloping or "soft" notch that may be more characteristic of filtering materials such as color pigments.

FIG. 27 provides a line chart 1100 illustrating spectral transmittance versus wavelength for an illustrative color pigment material arranged to provide a spectral notch 1102 centered at about 580 nm. Transmittance of the color pigment material is nearly 100% at or below wavelengths of about 430 nm, and at or above wavelengths of about 730 nm. Between 430 nm and 730 nm, transmittance is reduced (to a minimum of about 50% at a wavelength of about 580 nm). As shown in FIG. 27, a color pigment may provide a softer spectral notch (with more gradually sloping wavelength attenuation) characteristics relative to other notch filtering materials such as rare earth metals and their oxides (e.g., as shown in FIG. 26).

Embodiments as disclosed herein may provide one or more of the following beneficial technical effects: enhanced aesthetics of emissions of lighting devices; enhancing perceived quality of emissions of lighting devices; enhancing vividness of colors represented by lighting devices; and reduction of discernable tint of emissions of lighting devices.

Those skilled in the art will recognize improvements and modifications to the preferred embodiments of the present disclosure. All such improvements and modifications are considered within the scope of the concepts disclosed herein and the claims that follow. Any of the various features and elements as disclosed herein are contemplated to be combined with one or more other disclosed features and elements unless indicated to the contrary herein.

What is claimed is:

1. A lighting device comprising:
   at least one primary solid state light emitter configured to emit primary solid state light emitter emissions comprising a dominant wavelength in a range of from 430 nm to 480 nm;
   a lumiphor configured to receive and be excited by at least a portion of emissions of the at least one primary solid state light emitter, and emit lumiphor emissions comprising a dominant wavelength in a range of from about 535 nm to about 585 nm;
   at least one supplemental solid state light emitter configured to generate supplemental solid state light emitter emissions comprising a dominant wavelength in a range of from 590 nm to 630 nm; and
   wherein a combination of (A) light exiting the lighting device that was emitted by the at least one primary solid state light emitter, (B) light exiting the lighting device that was emitted by the lumiphor, and (C) light exiting the lighting device that was emitted by the at least one supplemental solid state light emitter would, in the absence of any additional light, produce a mixture of light having a color point defined on a CIE 1976 u'-v' chromaticity diagram by a correlated color temperature value in a range of from 2,500K to 10,000K and by a Planckian offset Delta u'v' value in a range of no greater than negative 0.01; and
   wherein the lighting device is devoid of any electrically activated solid state light emitter configured to generate emissions (i) having dominant wavelength in a range of from 430 nm to 480 nm and (ii) exiting the lighting device without passage through a layer or region comprising a lumiphoric material.

2. The lighting device of claim 1, further comprising a first power line, wherein each of the at least one primary solid state light emitter and the at least one supplemental solid state light emitter is electrically connected to the first power line.

3. The lighting device of claim 1, wherein the correlated color temperature value is in a range of from 2,700K to 5,000K.

4. The lighting device of claim 1, wherein the Planckian offset Delta u'v' value is in a range of no greater than negative 0.015.

5. The lighting device of claim 1, wherein the Planckian offset Delta u'v' value is in a range of from negative 0.01 to negative 0.03.

6. The lighting device of claim 1, wherein the mixture of light has a gamut area index (GAI) value of at least 50 and a color rendering index (CRI Ra) value of at least 50.

7. The lighting device of claim 1, wherein the mixture of light has a luminous efficacy of at least 60 lumens per watt.

8. A lighting device comprising:
   at least one electrically activated solid state light emitter;
   a first lumiphor configured to receive and be excited by at least a portion of emissions of the at least one electrically activated solid state light emitter, and responsively emit first lumiphor emissions;
   a second lumiphor configured to receive and be excited by at least a portion of emissions of the at least one electrically activated solid state light emitter, and responsively emit second lumiphor emissions;
   wherein a combination of (A) light exiting the lighting device that was emitted by the at least one electrically activated solid state light emitter, (B) light exiting the lighting device that was emitted by the first lumiphor, and (C) light exiting the lighting device that was emitted by the second lumiphor would, in the absence of any additional light, produce a mixture of light having a color point defined on a CIE 1976 u'-v' chromaticity diagram by a correlated color temperature value in a range of from 2,500K to 10,000K and a Planckian offset Delta u'v' value in a range of no greater than negative 0.01.

9. The lighting device of claim 8, wherein the first lumiphor emissions have a first dominant wavelength, the second lumiphor emissions have a second dominant wavelength, and the first dominant wavelength differs from the second dominant wavelength by at least 30 nm.

10. The lighting device of claim 8, wherein the first lumiphor is mixed with the second lumiphor.

11. The lighting device of claim 8, wherein each of the first lumiphor and the second lumiphor is spatially segregated from the at least one electrically activated solid state light emitter.

12. The lighting device of claim 8, wherein the first lumiphor is arranged in a first carrier material or layer, and the second lumiphor is arranged in a second carrier material or layer.

13. The lighting device of claim 8, wherein the correlated color temperature value is in a range of from 2,700K to 5,000K.

14. The lighting device of claim 8, wherein the Planckian offset Delta u'v' value is in a range of no greater than negative 0.015.

15. The lighting device of claim 8, wherein the Planckian offset Delta u'v' value is in a range of from negative 0.01 to negative 0.03.

16. The lighting device of claim 8, wherein the mixture of light has a gamut area index (GAI) value of at least 50 and a color rendering index (CRI Ra) value of at least 50.

17. The lighting device of claim 8, wherein the mixture of light has a luminous efficacy of at least 60 lumens per watt.

18. A lighting device comprising:
   at least one first electrically activated solid state light emitter having a first dominant wavelength, wherein the at least one first electrically activated solid state light emitter is configured to produce light having a color point defined on a CIE 1976 u'-v' chromaticity diagram by a correlated color temperature value in a range of from 2,500K to 10,000K and by a Planckian offset Delta u'v' value in a range of at least 0.007;
   at least one second electrically activated solid state light emitter having a second dominant wavelength, wherein the at least one second electrically activated solid state light emitter is configured to produce light having a color point defined on a CIE 1976 u'-v' chromaticity diagram by a correlated color temperature value in a range of from 2,500K to 10,000K and by a Planckian offset Delta u'v' value in a range of no greater than negative 0.012; and
   wherein a combination of (A) light exiting the lighting device that was emitted by the at least one first electrically activated solid state light emitter and (B) light exiting the lighting device that was emitted by the at least one second electrically activated solid state light emitter would, in the absence of any additional light, produce a mixture of light having a color point defined on a CIE 1976 u'-v' chromaticity diagram by a correlated color temperature in a range of from 2,500K to 10,000K and a Planckian offset Delta u'v' value of no greater than negative 0.01.

19. The lighting device of claim 18, comprising at least one of the following features (I) to (III):
(I) any of (i) the at least one first electrically activated solid state emitter and (ii) the at least one second electrically activated solid state emitter comprises at least one light emitting diode (LED) chip and a lumiphoric material configured to receive at least a portion of emissions of the at least one LED chip and responsively emit lumiphor emissions;
(II) the lighting device is devoid of any electrically activated solid state light emitter configured to generate emissions (i) having dominant wavelength in a range of from 430 nm to 480 nm and (ii) exiting the lighting device without passage through a layer or region comprising a lumiphoric material; and
(III) the lighting device is devoid of any electrically activated solid state light emitter having a dominant wavelength other than the first dominant wavelength and other than the second dominant wavelength.

20. The lighting device of claim 18, comprising at least one of the following features (I) to (V):
(I) the color point of the mixture of light has a correlated color temperature in a range of from 2,700K to 5,000K;
(II) the mixture of light has a gamut area index (GAI) value of at least 50 and a color rendering index (CRI Ra) value of at least 50;
(III) the mixture of light has a luminous efficacy of at least 60 lumens per watt;
(IV) the first dominant wavelength differs from the second dominant wavelength by at least 50 nm; and
(V) the lighting device comprises a plurality of clusters of solid state light emitters, wherein each cluster of the plurality of clusters includes at least one first electrically activated solid state light emitter and at least one second electrically activated solid state light emitter.

21. The lighting device of claim 18, comprising one of the following features:
the color point of the mixture of light has a Planckian offset Delta u'v' value in a range of no greater than negative 0.015;
the color point of the mixture of light has a Planckian offset Delta u'v' value in a range of from negative 0.01 to negative 0.03; or
the color point of the mixture of light has a Planckian offset Delta u'v' value in a range of from negative 0.01 to negative 0.02.

22. A lighting device comprising:
a first electrically activated solid state light emitter;
a second electrically activated solid state light emitter;
a lumiphor configured to receive and be excited by at least a portion of emissions of at least one of the first and the second electrically activated solid state light emitter, and responsively emit lumiphor emissions;
wherein a combination of (A) light exiting the lighting device that was emitted by the first electrically activated solid state light emitter, (B) light exiting the lighting device that was emitted by the second electrically activated solid state light emitter, and (C) light exiting the lighting device that was emitted by the lumiphor would, in the absence of any additional light, produce a mixture of light having a color point defined on a CIE 1976 u'-v' chromaticity diagram by a correlated color temperature in a range of from 2,500K to 10,000K and by a Planckian offset Delta u'v' value of no greater than negative 0.01; and
wherein the mixture of light has a gamut area index (GAI) value of at least 50 and a color rendering index (CRI Ra) value of at least 50.

23. The lighting device of claim 22, comprising at least one of the following features (I) to (IV):
(I) the lighting device comprises a first power line, wherein each of the first and the second electrically activated solid state light emitter is electrically connected to the first power line;
(II) the correlated color temperature value is in a range of from 2,700K to 5,000K;
(III) the mixture of light has a luminous efficacy of at least 60 lumens per watt; and
(IV) the lighting device is devoid of any electrically activated solid state light emitter configured to generate emissions (i) having dominant wavelength in a range of from 430 nm to 480 nm and (ii) exiting the lighting device without passage through a layer or region comprising a lumiphoric material.

24. The lighting device of claim 22, comprising one of the following features:
the Planckian offset Delta u'v' value is in a range of no greater than negative 0.015;
the Planckian offset Delta u'v' value is in a range of from negative 0.01 to negative 0.03; or
the Planckian offset Delta u'v' value is in a range of from negative 0.01 to negative 0.02.

25. A lighting device comprising:
at least one electrically activated solid state light emitter;
at least one lumiphor configured to receive and be excited by at least a portion of emissions of the at least one electrically activated solid state light emitter, and emit lumiphor emissions; and
a notch filtering material arranged in a light path between (i) the at least one lumiphor and (ii) at least one light output surface of the lighting device, wherein the notch filtering material is configured to receive at least a portion of the lumiphor emissions and filter the received lumiphor emissions to exhibit a spectral notch;
wherein a combination of (A) light exiting the lighting device that was emitted by the at least one electrically activated solid state light emitter, and (B) light exiting the lighting device that was emitted by the at least one lumiphor would, in the absence of any additional light, produce a mixture of light having a color point defined on a CIE 1976 u'-v' chromaticity diagram by a correlated color temperature in a range of from 2,500K to 10,000K and by a Planckian offset Delta u'v' value of no greater than negative 0.01.

26. The lighting device of claim 25, comprising at least one of the following features (I) and (II):
(I) the correlated color temperature value is in a range of from 2,700K to 5,000K; and
(II) the mixture of light has a gamut area index (GAI) value of at least 50 and a color rendering index (CRI Ra) value of at least 50.

27. The lighting device of claim 25, comprising one of the following features:
the Planckian offset Delta u'v' value is in a range of no greater than negative 0.015;
the Planckian offset Delta u'v' value is in a range of from negative 0.01 to negative 0.03; or
the Planckian offset Delta u'v' value is in a range of from negative 0.01 to negative 0.02.

28. A lighting device comprising:
at least one electrically activated solid state light emitter;
a lumiphor configured to receive and be excited by at least a portion of emissions of at least one electrically activated solid state light emitter, and responsively emit lumiphor emissions;
wherein a combination of (A) light exiting the lighting device that was emitted by the at least one electrically activated solid state light emitter and (B) light exiting the lighting device that was emitted by the lumiphor would, in the absence of any additional light, produce a mixture of light having a color point defined on a CIE 1976 u'-v' chromaticity diagram by a correlated color temperature in a range of from 2,500K to 10,000K and by a Planckian offset Delta u'v' value of no greater than negative 0.01; and
wherein the mixture of light has a luminous efficacy of at least 60 lumens per watt.

29. The lighting device of claim 28, comprising at least one of the following features (I) to (III):
(I) the at least one electrically activated solid state light emitter comprises at least one first electrically activated solid state light emitter configured to generate emissions comprising a first dominant wavelength; the at least one electrically activated solid state light emitter comprises at least one second electrically activated solid state light emitter configured to generate emissions comprising a second dominant wavelength; and the second dominant wavelength differs from the first dominant wavelength by at least 50 nm;
(II) the lighting device is devoid of any electrically activated solid state light emitter configured to generate emissions (i) having dominant wavelength in a range of from 430 nm to 480 nm and (ii) exiting the lighting device without passage through a layer or region comprising a lumiphoric material; and
(III) the correlated color temperature value is in a range of from 2,700K to 5,000K.

30. The lighting device of claim 28, comprising one of the following features:
the Planckian offset Delta u'v' value is in a range of no greater than negative 0.015;
the Planckian offset Delta u'v' value is in a range of from negative 0.01 to negative 0.03; or
the Planckian offset Delta u'v' value is in a range of from negative 0.01 to negative 0.02.

* * * * *